(12) United States Patent
Nagasawa et al.

(10) Patent No.: US 6,724,679 B2
(45) Date of Patent: Apr. 20, 2004

(54) SEMICONDUCTOR MEMORY DEVICE ALLOWING HIGH DENSITY STRUCTURE OR HIGH PERFORMANCE

(75) Inventors: Tsutomu Nagasawa, Hyogo (JP); Hideki Yonetani, Hyogo (JP); Kozo Ishida, Hyogo (JP); Shinichi Jinbo, Hyogo (JP); Makoto Suwa, Hyogo (JP); Tadaaki Yamauchi, Hyogo (JP); Junko Matsumoto, Hyogo (JP); Zengcheng Tian, Hyogo (JP); Takeo Okamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/126,622

(22) Filed: Apr. 22, 2002

(65) Prior Publication Data

US 2003/0081490 A1 May 1, 2003

(30) Foreign Application Priority Data

Oct. 26, 2001 (JP) ........................ 2001-329188

(51) Int. Cl.[7] ................................ G11C 8/00
(52) U.S. Cl. ................ 365/230.03; 365/230.06; 365/189.11
(58) Field of Search ............... 365/230.03, 230.06, 365/189.11

(56) References Cited

U.S. PATENT DOCUMENTS 5,742,554 A * 4/1998 Fujioka ............... 365/230.03
5,875,137 A 2/1999 Suzuki

FOREIGN PATENT DOCUMENTS

| JP | 63-104300 | 5/1988 |
|---|---|---|
| JP | 2-77150 | 3/1990 |
| JP | 5-325547 | 12/1993 |
| JP | 7-14994 | 1/1995 |
| JP | 7-130184 | 5/1995 |
| JP | 8-87883 | 4/1996 |
| JP | 9-63272 | 3/1997 |
| JP | 9-204798 | 8/1997 |
| JP | 11-68058 | 3/1999 |
| JP | 11-87630 | 3/1999 |
| JP | 11-135753 | 5/1999 |
| JP | 2000-285673 | 10/2000 |
| JP | 2000-294651 | 10/2000 |
| JP | 2001-68646 | 3/2001 |

* cited by examiner

*Primary Examiner*—Huan Hoang
(74) *Attorney, Agent, or Firm*—McDermott, Will & Emery

(57) ABSTRACT

A semiconductor memory device includes banks, predecoders, a latch circuit, a counter, a fuse and buffers. The bank includes a plurality of memory cells arranged in rows and columns, and others. The predecoders are disposed in a central portion of the semiconductor memory device. The predecoder produces a predecode signal for selecting each of the banks based on a bank address received from the buffer, and outputs the predecode signal to the banks. The predecoder produces the predecode signal for selecting each of the banks based on the bank address, and outputs the predecode signal to the banks. Consequently, interconnections in the central portion can be reduced in number.

5 Claims, 44 Drawing Sheets

F I G. 6
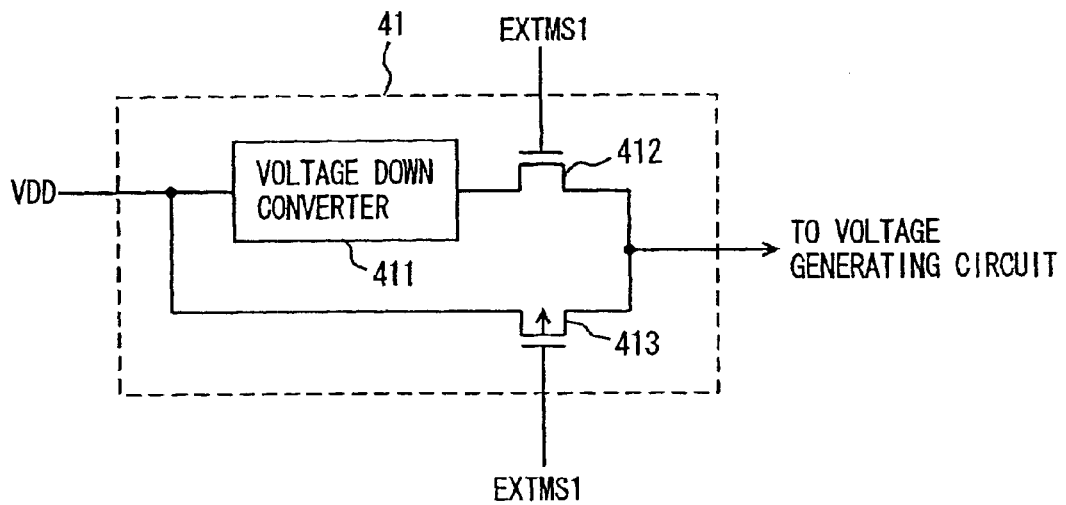
F I G. 10
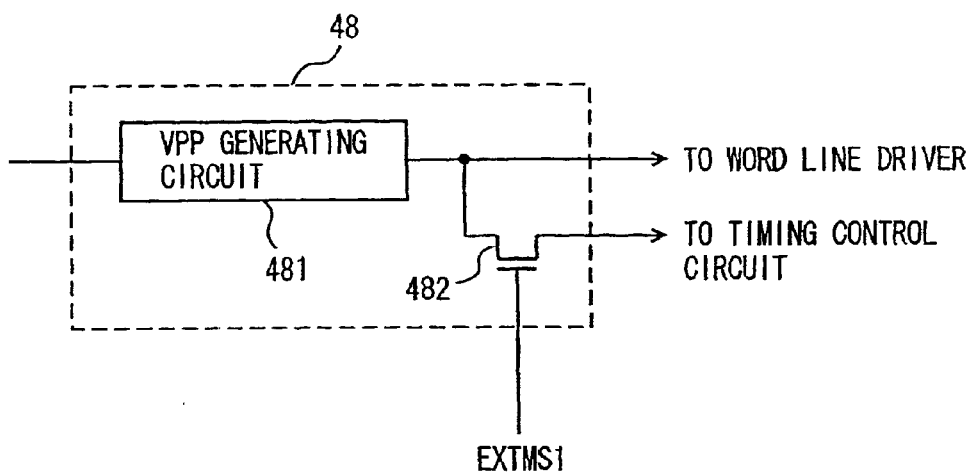

F I G. 3 2
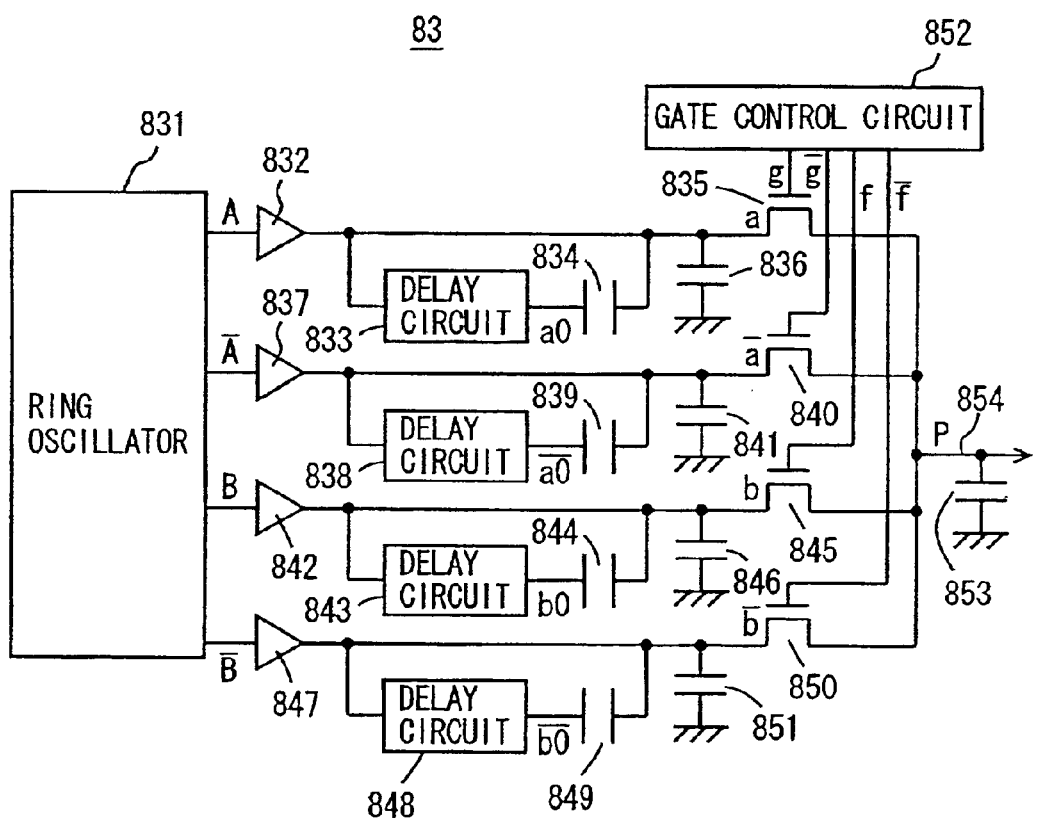

F I G. 4 6 PRIOR ART

SEMICONDUCTOR MEMORY DEVICE ALLOWING HIGH DENSITY STRUCTURE OR HIGH PERFORMANCE

BACKGROUND OF THE INVENTION

1. Field of the Invention

The invention relates to a semiconductor memory device, and particularly to semiconductor memory devices, in which interconnections between a plurality of banks are reduced in number, timing of input/output of data to and from a plurality of banks is adjusted, a burn-in test using a plurality of power supply voltages at different levels can be performed, and/or an internal voltage activating word lines can be stably supplied.

2. Description of the Background Art

Referring to FIG. 45, a conventional semiconductor memory device 1000 such as a DRAM (Dynamic Random Access Memory) includes banks 1010–1013 and predecoders 1014–1017.

Each of banks 1010–1013 includes a plurality of memory cells disposed in rows and columns, a plurality of bit line pairs, a plurality of word lines, a column decoder, a row decoder and a sense amplifier.

Predecoders 1014–1017 are disposed corresponding to banks 1010–1013, respectively. Predecoders 1014 and 1016 are disposed between banks 1010 and 1012, and predecoders 1015 and 1017 are disposed between banks 1011 and 1013. Predecoders 1014–1017 produce predecode signals for selecting banks 1010–1013 based on the address input through address terminals, respectively, and output the predecode signals thus produced to banks 1010–1013, respectively. Further, predecoders 1014–1017 receive addresses AYA<3:0>, AYB<3:0>, AYC<3:0> and AYD<3:0>, and output received addresses AYA<3:0>, AYB<3:0>, AYC<3:0> and AYD<3:0> to corresponding banks 1010–1013, respectively.

Banks 1010–1013 are selected by the predecode signals applied from predecoders 1014–1017. In the selected bank (one of banks 1010–1013), data is input/output to or from the memory cells designated by the addresses received from corresponding one of predecoders 1014–1017.

As described above, the conventional semiconductor memory device is provided with the plurality of predecoders corresponding to the plurality of banks, respectively. The plurality of predecoders are concentratedly arranged in one position.

Referring to FIG. 46, a conventional semiconductor memory device 1100 such as an SDRAM (Synchronous DRAM), in which data is input/output to and from the memory cells in synchronization with a clock, includes banks 1010–1013, a driver 1018 and a repeater 1019. Banks 1010–1013 are the same as those already described.

Driver 1018 receives a clock CLK from an external terminal, and produces a clock CLKQ used for output of data from received clock CLK. Driver 1018 outputs clock CLKQ thus produced to repeater 1019.

Repeater 1019 is disposed in a central portion of semiconductor memory device 1100. Repeater 1019 supplies clock CLKQ received from driver 1018 to banks 1010–1013. In this case, repeater 1019 supplies clock CLKQ to banks 1010–1013 through paths of the substantially same length. Thereby, each of banks 1010–1013 can output the data substantially in accordance with the same timing as the other banks.

Banks 1010–1013 output the data, which is read from the memory cells, to the input/output terminals (not shown) in synchronization with clock CLKQ received from repeater 1019.

In the conventional semiconductor memory device, as described above, the timing of data output from the plurality of banks is adjusted or controlled by supplying a clock produced by a driver to the respective banks via the one repeater.

For inputting or outputting data to or from each of the plurality of memory cells disposed in rows and columns, the word line disposed in the row direction must be activated, and an internally boosted voltage prepared by boosting the power supply voltage is used for this activation of the word line. A pump capacitor is used for boosting the power supply voltage to the internally boosted voltage.

FIG. 47 is a plan showing a pump capacitor, and shows, on an enlarged scale, a region A of the pump capacitor. Aluminum interconnections 1022–1027 are disposed at a first layer under aluminum interconnections 1020 and 1021 at a second layer. Bit lines BL (not shown) are disposed under aluminum interconnections 1022–1027 at the first layer, and transfer gates TG (not shown) are disposed under bit lines BL. Further, a field diffusion layer FL (not shown) is disposed under transfer gates TG. Insulating layers are interposed between aluminum interconnections 1020 and 1021 and aluminum interconnections 1022–1027, between aluminum interconnections 1022–1027 and bit lines BL, between bit lines BL and transfer gates TG, and between transfer gates TG and field diffusion layer FL.

Bit lines BL are connected through contact holes to transfer gates TG and field diffusion layer FL, and aluminum interconnections 1022–1028 at the first layer are connected to bit lines BL through contact holes 1029, 1030, 1033, 1034, 1035, 1038, 1039, 1042 and 1043. Aluminum interconnection 1020 at the second layer is connected to aluminum interconnection 1026 at the first layer through contact holes 1036. Aluminum interconnection 1021 at the second layer is connected through contact holes 1031, 1032, 1040 and 1041 to aluminum interconnections 1024, 1025, 1027 and 1028 at the first layer.

Accordingly, aluminum interconnection 1020 at the second layer is connected to transfer gate TG, which forms one of two electrodes forming the pump capacitor, and aluminum interconnection 1021 at the second layer is connected to field diffusion layer FL forming the other electrode of the pump capacitor. Thereby, the internally boosted voltage boosted by the pump capacitor is supplied via aluminum interconnections 1020 and 1021 at the second layer to the word line drivers (not shown), and the word line driver supplies the internally boosted voltage to the word line, which is designated by a row address applied from the row decoder, so that the word line designated by the row address is activated.

FIG. 48 is a plan showing one of the plurality of pump capacitors. A bit line 1051 is disposed on a transfer gate 1045 with an insulating layer (not shown) therebetween, and bit line 1051 is connected to transfer gate 1045 via eighteen contact holes 1046. Twelve contact holes 1047 are provided for connecting bit line 1051 to the aluminum interconnection (not shown), which is located at the first layer, and is formed on bit line 1051 with the insulating layer (not shown) therebetween.

Field diffusion layer 1044 is formed over transfer gate 1045, and bit lines 1049, 1050, 1054 and 1055 are arranged over a portion of the field diffusion layer not overlapping with transfer gate 1045. Each of bit lines 1049 and 1050 is connected to field diffusion layer 1044 through fourteen contact holes 1053, and each of bit lines 1054 and 1055 is connected to field diffusion layer 1044 via fourteen contact holes 1057. Twenty contact holes 1052 are provided for connecting bit lines 1049 and 1050 to aluminum interconnections (not shown), which are located at the first layer, and are formed on bit lines 1049 and 1050 with the insulating layer (not shown) therebetween. Twenty contact holes 1056 are provided for connecting bit lines 1054 and 1055 to aluminum interconnections (not shown), which are located at the first layer, and are formed on bit lines 1054 and 1055 with the insulating layer (not shown) therebetween.

Referring to FIG. 49, conventional semiconductor memory devices 1000 and 1100 include internal voltage generating circuits 1060–1065, terminals 1066–1077, switches 1078–1083, a control circuit 1084 and a switching circuit 1085.

Internal voltage generating circuits 1060–1062 lower the power supply voltage to generate internal voltages VREFS, VREFP and VREFD, respectively. Internal voltage generating circuit 1063 lowers the power supply voltage to generate internal voltage VBL for precharging the bit line pair. Internal voltage generating circuit 1064 lowers the power supply voltage to generate an internal voltage VCP, which is a cell plate voltage. Internal voltage generating circuit 1065 boosts power supply voltage to generate internal voltage VPP for activating the word line.

In a normal operation, switch 1078 is connected to terminal 1066 in accordance with a switching signal applied from a switching circuit 1085, and supplies internal voltage VREFS, which is generated by internal voltage generating circuit 1060, to the internal circuit. In a burn-in test, switch 1078 is connected to terminal 1067 in accordance with the switching signal applied from switching circuit 1085, and supplies an external voltage, which is received from the terminal for receiving a data mask signal DQM0, to the internal circuit.

In the normal operation, switch 1079 is connected to terminal 1068 in accordance with the switching signal applied from switching circuit 1085, and supplies internal voltage VREFP, which is generated by internal voltage generating circuit 1061, to the internal circuit. In the burn-in test, switch 1079 is connected to terminal 1069 in accordance with the switching signal applied from switching circuit 1085, and supplies the external voltage, which is received from the terminal for receiving data mask signal DQM0, to the internal circuit.

In the normal operation, switch 1080 is connected to terminal 1070 in accordance with the switching signal applied from switching circuit 1085, and supplies internal voltage VREFD, which is generated by internal voltage generating circuit 1062, to the internal circuit. In the burn-in test, switch 1080 is connected to terminal 1071 in accordance with the switching signal applied from switching circuit 1085, and supplies the external voltage, which is received from the terminal for receiving data mask signal DQM0, to the internal circuit.

In the normal operation, switch 1081 is connected to terminal 1072 in accordance with the switching signal applied from switching circuit 1085, and supplies internal voltage VBL, which is generated by internal voltage generating circuit 1063, to the internal circuit. In the burn-in test, switch 1081 is connected to terminal 1073 in accordance with the switching signal applied from switching circuit 1085, and supplies the external voltage, which is received from the terminal for receiving data mask signal DQM0, to the internal circuit.

In the normal operation, switch 1082 is connected to terminal 1074 in accordance with the switching signal applied from switching circuit 1085, and supplies internal voltage VCP, which is generated by internal voltage generating circuit 1064, to the internal circuit. In the burn-in test, switch 1082 is connected to terminal 1075 in accordance with the switching signal applied from switching circuit 1085, and supplies the external voltage, which is received from the terminal for receiving data mask signal DQM0, to the internal circuit.

In the normal operation, switch 1083 is connected to terminal 1076 in accordance with the switching signal applied from switching circuit 1085, and supplies internal voltage VPP, which is generated by internal voltage generating circuit 1065, to the internal circuit. In the burn-in test, switch 1083 is connected to terminal 1077 in accordance with the switching signal applied from switching circuit 1085, and supplies the external voltage, which is received from the terminal for receiving data mask signal DQM0, to the internal circuit.

Referring to FIG. 50, control circuit 1084 includes mode signal generating circuits 1086–1089 and an AND gate 1090. When an externally applied address designates a VREF force mode, mode signal generating circuit 1086 generates a test mode signal for shifting to the VREF force mode, and outputs the generated test mode signal to AND gate 1090 and the internal circuit.

When the externally applied address designates a VPP force mode, mode signal generating circuit 1087 generates a test mode signal for shifting to the VPP force mode, and outputs the generated test mode signal to AND gate 1090 and the internal circuit.

When the externally applied address designates a multi-bit test mode, mode signal generating circuit 1088 generates a test mode signal for shifting to the multi-bit test mode, and outputs the generated test mode signal to AND gate 1090 and the internal circuit.

When the externally applied address designates an all-bank test mode, mode signal generating circuit 1089 generates a test mode signal for shifting to the all-bank test mode, and outputs the generated test mode signal to AND gate 1090 and the internal circuit.

AND gate 1090 receives the test mode signals from mode signal generating circuits 1086–1089, and outputs the burn-in test mode signal at H-level (logical high level) to switching circuit 1085 when all the received test mode signals are at H-level. Thus, control circuit 1084 generates the burn-in test mode signal after the operation shifted to the VREF force mode, VPP force mode, multi-bit test mode and all-bank test mode.

The VREF force mode, VPP force mode, multi-bit test mode and all-bank test mode are employed as various test modes, in which the semiconductor memory device can operate. In the VREF force mode, the test is performed by changing a reference voltage applied to internal circuits of the semiconductor memory device such as a memory cell array, a column decoder, a row decoder and a sense amplifier. In the VPP force mode, the test is performed by changing a voltage used for activating the word line. In the multi-bit test mode, the test is simultaneously made on input/output of data of the plurality of bits. In the all-bank test mode, the test is simultaneously made on all the banks. In the burn-in test mode, the test is performed with a voltage and a temperature higher than those in the normal operation.

Referring to FIG. 49 again, when switching circuit 1085 receives the burn-in test mode signal at H-level from control circuit 1084, switching circuit 1085 outputs switching signals to switches 1078–1083 for connecting switches 1078–1083 to terminals 1067, 1069, 1071, 1073, 1075 and 1077, respectively. When switching circuit 1085 receives the burn-in test mode signal at L-level (logical low level) from control circuit 1084, switching circuit 1085 outputs switching signals to switches 1078–1083 for connecting switches 1078–1083 to terminals 1066, 1068, 1070, 1072, 1074 and 1076, respectively.

Accordingly, the conventional semiconductor memory device enters the burn-in test mode after operating in the VREF force mode, VPP force mode, multi-bit test mode and all-bank test mode, and is supplied with an external voltage from one terminal, which is provided for receiving data mask signal DQM0, to conduct the burn-in test.

Referring to FIG. 51, each of conventional semiconductor memory devices 1000 and 1100 includes a pump circuit 1200. Pump circuit 1200 boosts the power supply voltage to generate internally boosted voltage VPP for activating the word lines. Pump circuit 1200 includes a ring oscillator 1201, buffers 1202 and 1207, delay circuits 1203 and 1208, pump capacitors 1204 and 1209, N-channel MOS transistors 1205 and 1210, a power supply interconnection 1212 and a gate control circuit 1214.

Ring oscillator 1201 outputs pulse signals A and /A, which have phases shifted by 180 degrees from each other, to buffers 1202 and 1207, respectively. Pulse signals A and /A have voltage levels, which vary periodically between a ground voltage GND and a power supply voltage VDD. Buffer 1202 latches and outputs pulse signal A to delay circuit 1203 and one of electrodes of pump capacitor 1204. Delay circuit 1203 delays the pulse signal received from buffer 1202 by a predetermined amount, and outputs the same to the other electrode of pump capacitor 1204. Based on the pulse signal applied from buffer 1202 and the pulse signal applied from delay circuit 1203, pump capacitor 1204 boosts power supply voltage VDD to internally boosted voltage VPP, and outputs the same to a source terminal of N-channel MOS transistor 1205. N-channel MOS transistor 1205 receives on its gate terminal a signal g from gate control circuit 1214, and supplies internally boosted voltage VPP, which is boosted by pump capacitor 1204, to power supply interconnection 1212 when signal g is at H-level.

Buffer 1207, delay circuit 1208, pump capacitor 1209 and N-channel MOS transistor 1210 perform the same operations as buffer 1202, delay circuit 1203, pump capacitor 1204 and N-channel MOS transistor 1205. N-channel MOS transistor 1210 receives on its gate terminal a signal /g from gate control circuit 1214.

Gate control circuit 1214 produces signals g and /g, which determine the timing of supply of internally boosted voltage VPP to power supply interconnection 1212, based on a control signal applied from a control circuit (not shown), and supplies signals g and /g to the gate terminals of N-channel MOS transistors 1205 and 1210, respectively. Capacitors 1206, 1211 and 1213 are parasitic capacitors.

Referring to FIG. 52, description will now be given on an operation of pump circuit 1200. Ring oscillator 1201 generates pulse signals A and /A having phases shifted by 180 degrees from each other, and outputs signals A and /A to buffers 1202 and 1207, respectively. Buffer 1202 latches and outputs pulse signal A, and delay circuit 1203 delays the pulse signal applied from buffer 1202 by a predetermined amount, and outputs the delayed signal as a signal a0 to the other electrode of pump capacitor 1204. Thereby, signal a is boosted to a maximum level of VPP (>VDD) by a bootstrap effect of delay circuit 1203 and pump capacitor 1204. When N-channel MOS transistor 1205 receives signal g from gate control circuit 1214, N-channel MOS transistor 1205 is turned on to supply internally boosted voltage VPP to power supply interconnection 1212 only while signal g is at H-level.

Buffer 1207, delay circuit 1208 and pump capacitor 1209 perform the same operations as buffer 1202, delay circuit 1203 and pump capacitor 1204, respectively, and more specifically, operate to boost power supply voltage VDD of pulse signal /A to internally boosted voltage VPP, and supply signal /a to a source terminal of N-channel MOS transistor 1210. When N-channel MOS transistor 1210 receives signal /g from gate control circuit 1214, N-channel MOS transistor 1210 is turned on to supply internally boosted voltage VPP to power supply interconnection 1212 only while signal /g is at H-level. As a result, power supply interconnection 1212 is supplied with the internally boosted voltage formed of a waveform of a signal p.

According to a recent technology, semiconductor memory devices using a power supply voltage of 2.5 V are coexistent with semiconductor memory devices using a power supply voltage of 3.3 V. Also, semiconductor memory devices employing word structures of 8 bits, 16 bits and 32 bits are coexistent. Accordingly, various semiconductor memory devices employing different power supply voltages and/or different word structures have been produced in accordance with user's requests.

In the conventional semiconductor memory devices, however, a plurality of predecoders are provided for a plurality of banks, and further are concentratedly disposed in a central portion of the semiconductor memory device. Also, the conventional semiconductor memory device is provided at its central portion with a repeater for supplying a clock received from a driver to each of the plurality of banks. These structures disadvantageously increase the number of interconnections arranged in the central portion of the semiconductor memory device.

In the prior art, the semiconductor memory devices using the power supply voltage of 2.5 V are produced independently of the semiconductor memory devices using the power supply voltage of 3.3 V. Therefore, such a semiconductor memory device has not been present that can be adapted to the plurality of power supply voltages without changing the type.

Further, if a pump capacitor for boosting the power supply voltage is formed of a plurality of layers stacked together, contact holes for connecting these layers must be formed in many portions for reducing a contact resistance. Further, contact portions of two layers, which are in contact with each other, must be wide or large for ensuring a sufficient capacity of supplying electric charges. Due to these two reasons, it is necessary to increase a width of the aluminum interconnection, which supplies the boosted voltage supplied from the pump capacitor to the internal circuit. This results in a problem that an empty region not occupied by the aluminum interconnections is too small to arrange other interconnections therein.

When the burn-in test is conducted in the conventional semiconductor memory device, a single voltage is externally supplied instead of a plurality of internal voltages at different voltage levels. Therefore, a defective semiconductor memory device is liable to be determined as a non-defective semiconductor memory device and vice versa so that correct determination is impossible.

Further, the conventional semiconductor memory device can enter the burn-in test mode only after passing through the VREF force mode, VPP force mode, multi-bit test mode and all-bank test mode. Therefore, a disadvantage occurs in such a case that various types employing different specifications are present although these types are prepared in accordance with type development by effecting minor changes on a single core type or in accordance with a master slice development or the like, and therefore are similar to each other. The above disadvantage is that defective modes, which are equal in number to the types, cannot be detected under common burn-in test conditions.

Furthermore, in the conventional semiconductor memory device, the pump capacitor for producing the internally boosted voltage to be used for activating the word line can be used in the semiconductor memory device formed of a single-word structure without causing a problem in capacity. For using the pump capacitor in the semiconductor memory device adaptable to multiple word structures, however, the pump capacitor designed in accordance with only one word structure among the plurality of word structures has the capacity, which may become excessively large or small when switched to another word structure.

SUMMARY OF THE INVENTION

Accordingly, an object of the invention is to provide a semiconductor memory device, which can reduce interconnections arranged in a central portion.

Another object of the invention is to provide a semiconductor memory device, which allows adaptation of a single type to a plurality of power supply voltages.

Still another object of the invention is to provide a semiconductor memory device, which allows adaptation of a single type to a plurality of word structures.

Yet another object of the invention is to provide a semiconductor memory device, in which many interconnections can be arranged in a region including a pump capacitor producing an internally boosted voltage.

Further another object of the invention is to provide a semiconductor memory device, in which a burn-in test can be conducted with a plurality of voltages at different voltage levels.

A further object of the invention is to provide a semiconductor memory device, in which a burn-in test can be performed under a plurality of conditions.

A further object of the invention is to provide a semiconductor memory device, in which a capacity of a pump capacitor can be switched in accordance with a word structure.

According to one aspect of the present invention, a semiconductor memory device includes banks of n (n is a natural number) in number each including a plurality of memory cells; and predecoders of m (m is a natural number satisfying (m<n)) in number for producing a select signal for selecting each of the n banks, each of the m predecoders outputting the select signal to the banks of k (k is a natural number satisfying (n=k×m)) in number among the n banks.

The semiconductor memory device according to the invention employs the predecoders smaller in number than the banks. According to the invention, therefore, interconnections for the banks can be reduced in numbers.

According to another aspect of the present invention, a semiconductor memory device for operating in synchronization with a clock by being driven by a first power supply voltage having a first voltage level or a second power supply voltage having a second voltage level lower than the first voltage level, includes a memory cell array including a plurality of memory cells for inputting and outputting data; a peripheral circuit for inputting and outputting the data to and from the memory cells in synchronization with the clock; an internal voltage generating circuit for generating an internal voltage based on the first or second power supply voltage, and supplying the generated internal voltage to the memory cell array and the peripheral circuit; and a voltage producing circuit for producing the first and second power supply voltages based on an external power supply voltage, selecting the produced first or second power supply voltage based on a voltage switch signal, and supplying the selected first or second power supply voltage to the internal voltage generating circuit.

According to the semiconductor memory device of the invention, even when the voltage level of the power supply voltage is switched, the internal voltage is generated based on the supplied power supply voltage for inputting or outputting the data to or from the memory cell. According to the invention, therefore, a single kind of semiconductor memory device can be adapted to the two power supply voltages at different voltage levels.

According to still another aspect of the present invention, a semiconductor memory device for inputting and outputting data to and from a memory cell by selecting one word structure from a plurality of word structures, includes a memory cell array including a plurality of memory cells, a peripheral circuit for inputting and outputting the data to and from the memory cell, and a control circuit for producing and outputting to the peripheral circuit a word structure select signal for selecting the one word structure from the plurality of word structures. The peripheral circuit selects the one word structure in accordance with the word structure select signal, and performs the input/output of data to and from the memory cell in accordance with the selected word structure.

According to the semiconductor memory device of the invention, the data is input and output to and from the memory cell in accordance with the one word structure selected from the plurality of word structures. According to the invention, therefore, it is possible to produce the semiconductor memory device, which allows adaptation of a single type to a plurality of word structures.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a circuit diagram of a power supply voltage switch circuit shown in FIG. 5;

FIG. 10 is a circuit diagram of a voltage generating circuit shown in FIG. 9;

FIG. 32 is a circuit diagram showing a voltage generating circuit shown in FIG. 31;

DESCRIPTION OF THE PREFERRED EMBODIMENTS

Embodiments of the invention will now be described with reference to the drawings. In the figures, the same or corresponding portions bear the same reference numbers, and description therefore is not be repeated.

First Embodiment

Figure 1:
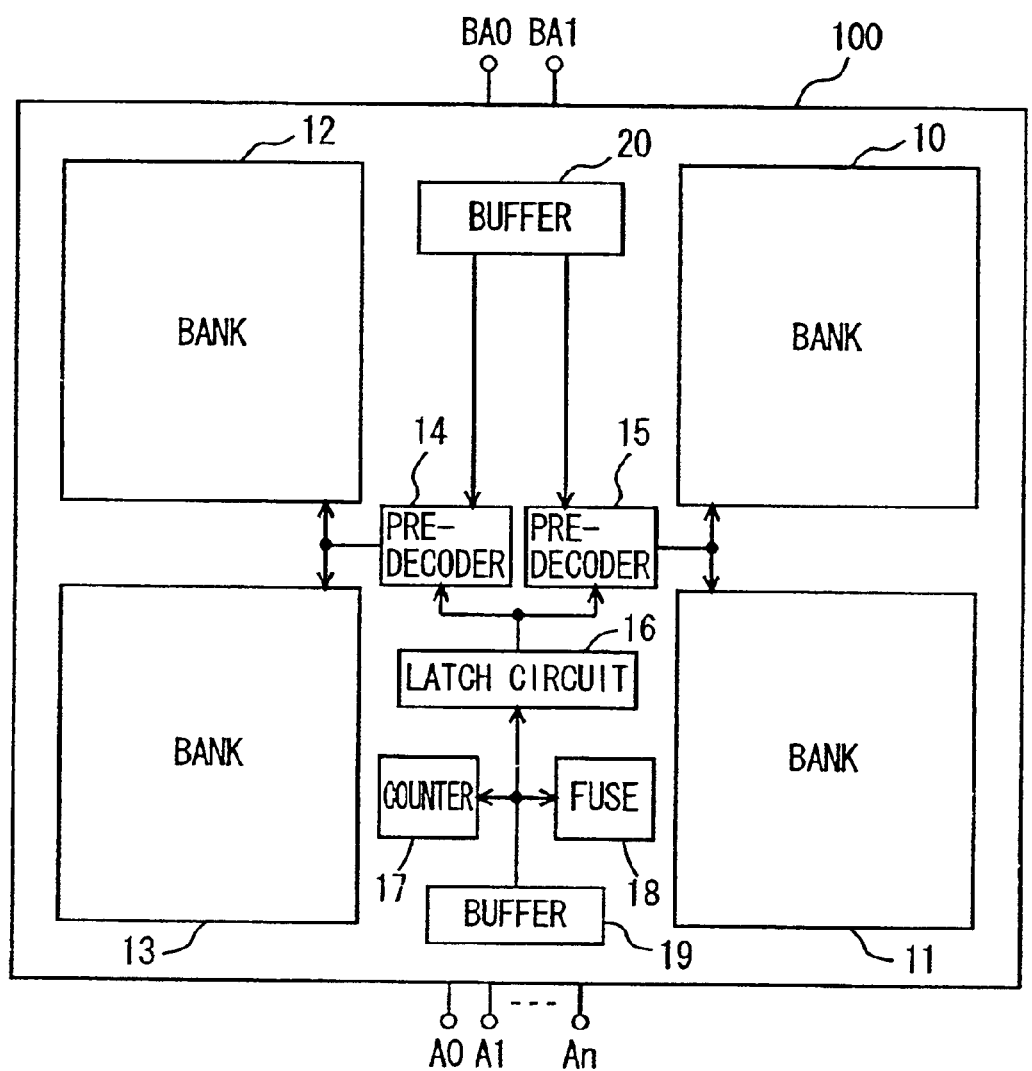
FIG. 1 is a schematic block diagram of a semiconductor memory device of a first embodiment of the invention.

Referring to FIG. 1, a semiconductor memory device 100 according to a first embodiment of the invention includes banks 10–13, predecoders 14 and 15, a latch circuit 16, a counter 17, a fuse 18 and buffers 19 and 20.

Each of banks 10–13 includes a plurality of memory cells arranged in rows and columns, a plurality of bit line pairs, a plurality of word lines, a column decoder, a row decoder and a sense amplifier.

Predecoders 14 and 15 are disposed in a central portion of semiconductor memory device 100. Predecoder 14 produces predecode signals for selecting each of banks 12 and 13 based on bank address BA0, BA1 applied from buffer 20, and outputs the predecode signals thus produced to banks 12 and 13. Predecoder 15 produces predecode signals for selecting each of banks 10 and 11 based on bank address BA0, BA1 applied from buffer 20, and outputs the predecode signals thus produced to banks 10 and 11.

Predecoders 14 and 15 receives an address A0–An (n is a natural number) from latch circuit 16, and apply the same to banks 12 and 13 as well as banks 10 and 11.

Predecoders 14 and 15 handle bank address BA0, BA1 as data (BA0, BA1) of 2 bits, and produce the predecode signals for selecting one of banks 10–13 in accordance with a combination of values of bank address BA0, BA1. In the case of (BA1, BA0)=(1, 0), predecoder 14 produces the predecode signal at H-level for selecting bank 12 and the predecode signal at L-level for deselecting bank 13, and outputs the predecode signal at H-level and the predecode signal at L-level to banks 12 and 13, respectively. In the case of (BA1, BA0)=(1, 1), predecoder 14 produces the predecode signal at H-level for selecting bank 13 and the predecode signal at L-level for deselecting bank 12, and outputs the predecode signal at H-level and the predecode signal at L-level to banks 13 and 12, respectively.

In the case of (BA1, BA0)=(0, 0), predecoder 15 produces the predecode signal at H-level for selecting bank 10 and the predecode signal at L-level for deselecting bank 11, and outputs the predecode signal at H-level and the predecode signal at L-level to banks 10 and 11, respectively. In the case of (BA1, BA0)=(0, 1), predecoder 15 produces the predecode signal at H-level for selecting bank 11 and the predecode signal at L-level for deselecting bank 10, and outputs the predecode signal at H-level and the predecode signal at L-level to banks 11 and 10, respectively.

As described above, when bank address BA1, which is the higher bit, is "1", predecoder 14 produces the predecode signal for selecting bank 12 or 13 as well as the predecode signal for deselecting bank 13 or 12, and outputs these predecode signals to banks 12 and 13. Accordingly, when bank address BA1, i.e., the higher bit is "1", predecoder 14 becomes active. When bank address BA1, i.e., the higher bit is "0", predecoder 15 produces the predecode signal for selecting bank 10 or 11 as well as the predecode signal for deselecting bank 11 or 10, and outputs these predecode signals to banks 10 and 11. Accordingly, when bank address BA1, i.e., the higher bit is "0", predecoder 15 becomes active.

Latch circuit 16 latches the externally applied address, the output of counter 17 and the output of fuse 18, and outputs them to predecoders 14 and 15. Counter 17 counts a burst length based on address A0–An applied from buffer 19. More specifically, counter 17 counts the minimum address among the plurality of addresses corresponding to the plurality of memory cells, which are simultaneously used for input/output of data, and outputs the counted addresses to latch circuit 16. Fuse 18 stores an address of a defective memory cell and an address of a spare memory cell to be used instead of the defective memory cell among the addresses of the memory cells included in banks 10–13. When the address A0–An input from buffer 19 matches with the address of the defective memory cell, the address of the spare memory cell to be used instead of the defective memory cell is output to latch circuit 16.

Buffer 19 receives and latches address A0–An from the address terminals for outputting latched address A0–An to latch circuit 16, counter 17 and fuse 18. Buffer 20 receives and latches bank address BA0, BA1 applied from the address terminals for outputting latched bank address BA0, BA1 to predecoders 14 and 15.

Latch circuit 16, counter 17 and fuse 18 are gathered at the vicinity of predecoders 14 and 15. As described above, circuits such as predecoders 14 and 15 for selecting and deselecting each of banks 10–13, counter 17 for counting the burst length, and fuse 18 for storing the address of spare memory cell to be used in place of defective memory cell are arranged in the central portion of semiconductor memory device 100, and more generally, the circuits for processing the signals and data common to banks 10–13 are arranged in the central portion of semiconductor memory device 100. Thereby, it is possible to reduce the number of interconnections between banks 10 and 11 as well as the number of interconnections between banks 12 and 13. As a result, an area occupied by each of banks 10–13 can be increased.

Description will now be given on an operation of semiconductor memory device 100. When bank address BA0, BA1 satisfying ((BA1, BA0)=(0, 0)) is input to buffer 20 from the address terminals, buffer 20 latches bank address (BA1, BA0)=(0, 0), and outputs the same to predecoders 14 and 15.

Predecoder 14 becomes inactive and predecoder 15 becomes active because the higher bit of bank address (BA1, BA0)=(0, 0) input from buffer 20 is "0". Based on the fact that the lower bit of bank address (BA1, BA0)=(0, 0) is "0", predecoder 15 produces the predecode signal at H-level for selecting bank 10 as well as predecode signal at L-level for deselecting bank 11, and outputs these predecode signals at H- and L-levels to banks 10 and 11, respectively. Thereby, only bank 10 is selected.

When buffer 19 receives address A0–An from the address terminals after the above operation, buffer 19 latches and outputs address A0–An to latch circuit 16, counter 17 and fuse 18. As already described, counter 17 counts the burst length, and outputs the same to latch circuit 16, as already described. Fuse 18 outputs to latch circuit 16 the address of the spare memory cell to be used for the defective memory cell when input address A0–An designates the address of the defective memory cell. Latch circuit 16 latches addresses A0–An, the burst length and the address of the spare memory cell, and outputs them to predecoders 14 and 15. Since predecoder 14 is inactive, it 14 does not output received address A0–An, the burst length and the address of the spare memory cell to banks 12 and 13.

Predecoder 15 outputs address A0–An, the burst length and the address of the spare memory cell applied from latch circuit 16 to selected bank 10. In bank 10, the row decoder, column decoder and sense amplifier operate to input and output the data to and from the plurality of memory cells based on address A0–An, the burst length and the address of the spare memory cell applied thereto.

Even when bank address BA0, BA1 other than (BA1, BA0)=(0, 0) is input, one of banks 11–13 is selected by the operations described above, and input/output of data to and from the memory cells is performed in selected bank 11, 12 or 13.

In this first embodiment, the predecoders arranged in the central portion of semiconductor memory device 100 are two in number. This is for the following reason. For reducing the number of interconnections in the central portion of semiconductor memory device 100, it is preferable to arrange only one predecoder. However, in a structure employing only one predecoder, a plurality of interconnections extend from the one predecoder to four banks 10–13 so that the distance between the predecoder and each of banks 10–13 becomes longer than that in the structure employing two predecoders. As a result, signals applied from the predecoder to banks 10–13 are delayed, and fast operations are impossible as a whole. Accordingly, the two predecoders are employed for reducing the number of interconnections in the central portion of the semiconductor memory device while ensuring fast operations.

Naturally, the predecoders may be more than two in number if the banks change in number. Thus, the number of predecoders is determined in accordance with the number of banks so that the interconnections in the central portion of the semiconductor memory device can be reduced in number, and the fast operation can be achieved.

According to the first embodiment, the semiconductor memory device includes the two predecoders for selecting and deselecting two banks among the four banks. Therefore, the predecoders can be smaller in number than those in the conventional semiconductor memory device, and the interconnections in the central portion of the semiconductor memory device can be reduced.

Since the circuits for processing the signals and data common to the plurality of banks are arranged in the central portion of the semiconductor memory device, the interconnections between the banks can be reduced in number. Consequently, it is possible to increase an area occupied by each bank.

Second Embodiment

Figure 2:
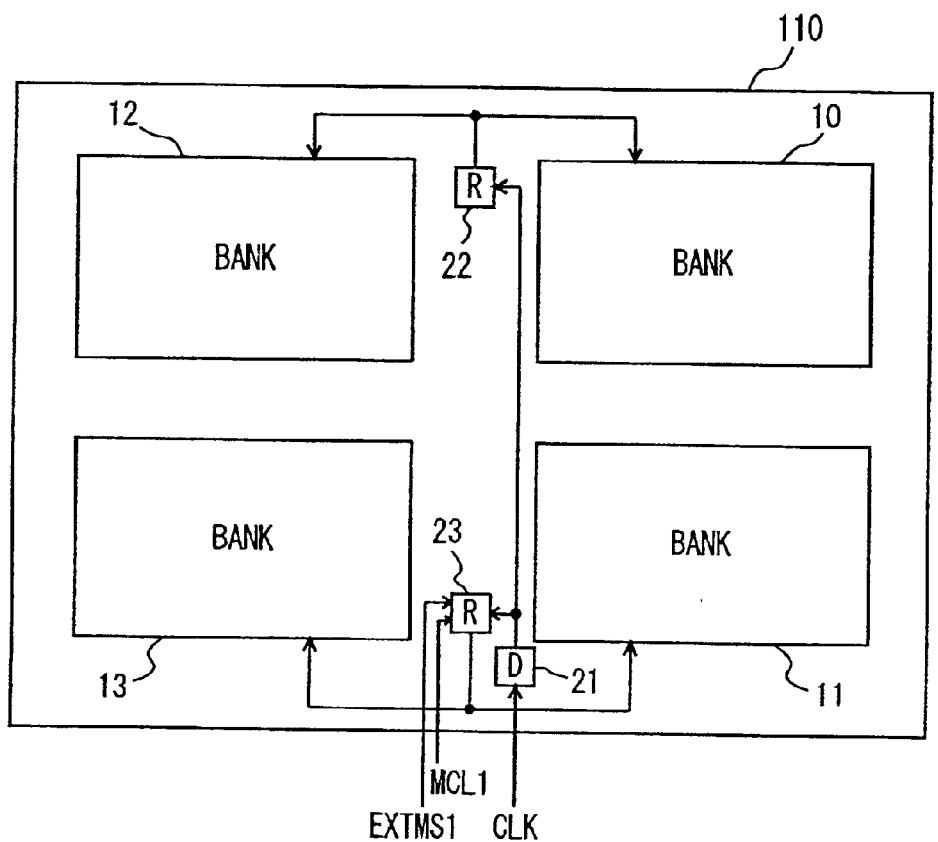
FIG. 2 is a schematic block diagram of a semiconductor memory device of a second embodiment.

Referring to FIG. 2, a semiconductor memory device 110 of a second embodiment includes banks 10–13, a driver 21, and repeaters 22 and 23. Banks 10–13 are the same as those in the first embodiment already described.

Driver 21 produces an output clock CLKQ (i.e., clock for output) for determining timing, according to which data read from the memory cell is output to an input/output terminal (not shown) based on externally supplied clock CLK, and outputs clock CLKQ thus produced to repeaters 22 and 23.

Repeater 22 outputs clock CLKQ received from driver 21 to banks 10 and 12. Repeater 23 receives signals EXTMS1 and MCL1, and delays clock CLKQ received from driver 21 in the following manner. Delayed clock CLKQ is output from driver 21 to banks 11 and 13. In this case, repeater 23 delays clock CLKQ by a delay amount equal to that of delay caused in clock CLKQ between driver 21 and repeater 22.

Repeaters 22 and 23 are located such that a distance from repeater 22 to banks 10 and 12 is equal to a distance from repeater 23 to banks 11 and 13, and each are located near the banks receiving clock CLKQ therefrom.

Banks 10–13 receiving clock CLKQ from repeaters 22 and 23 output the data read from the memory cells to the input/output terminal (not shown) in synchronization with clock CLKQ.

Figure 3:
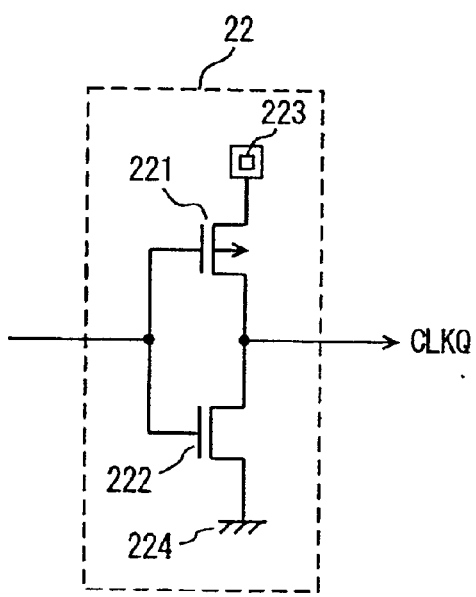
FIG. 3 is a circuit diagram of a repeater shown in FIG. 2.

Referring to FIG. 3, repeater 22 includes a P-channel MOS transistor 221 and an N-channel MOS transistor 222. P-channel MOS transistor 221 and N-channel MOS transistor 222 are connected in series between a power supply node 223 and a ground node 224. Power supply node 223 is supplied with a power supply voltage VDD. When repeater 22 receives clock CLKQ at L-level, it outputs clock CLKQ at H-level formed of power supply voltage VDD. When repeater 22 receives clock CLKQ at H-level, it outputs clock CLKQ at L-level formed of ground voltage GND. Accordingly, repeater 22 can output clock CLKQ selectively formed of ground voltage GND and power supply voltage VDD to banks 10 and 12 even when an amplitude of clock CLKQ output from driver 21 attenuates.

Figure 4:
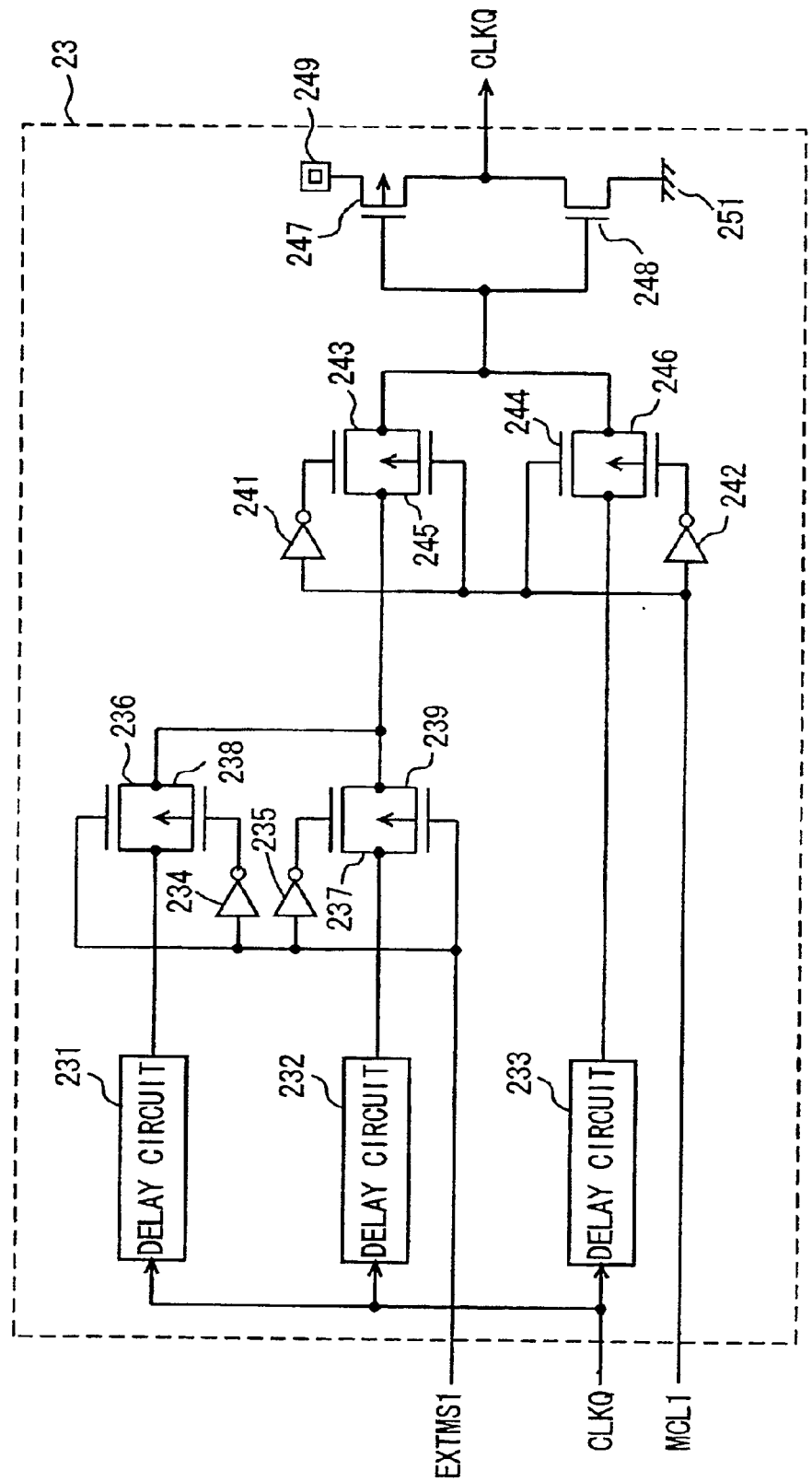
FIG. 4 is a circuit diagram showing another repeater shown in FIG. 2.

Referring to FIG. 4, repeater 23 includes delay circuits 231–233, inverters 234, 235, 241 and 242, N-channel MOS transistors 236, 237, 243, 244 and 248, and P-channel MOS transistors 238, 239 and 245–247.

When semiconductor memory device 110 is driven by a power supply voltage of 2.5 V, delay circuit 231 delays clock CLKQ received from driver 21 by a delay amount T1 so that clock CLKQ may be output in accordance with the same timing as repeater 22. When semiconductor memory device 110 is driven by a power supply voltage of 3.3 V, delay circuit 232 delays clock CLKQ received from driver 21 by a delay amount T2 so that clock CLKQ may be output in accordance with the same timing as repeater 22. Delay circuit 233 delays clock CLKQ received from driver 21 by a delay amount T3 when determining a delay amount from lowering of a column address strobe signal /CAS to L-level to outputting of the read data.

Inverter 234 inverts an externally applied signal EXTMS1, and outputs the inverted signal to a gate terminal of P-channel MOS transistor 238. Inverter 235 inverts signal EXTMS1, and outputs the same to a gate terminal of N-channel MOS transistor 237.

N- and P-channel MOS transistors 236 and 238 form a transfer gate. N-channel MOS transistor 236 receives signal EXTMS1 on its gate terminal. P-channel MOS transistor 238 receives the output signal of inverter 234 on its gate terminal. Therefore, N- and P-channel MOS transistors 236 and 238 are turned on to output clock CLKQ received from delay circuit 231 to source terminals of N- and P-channel MOS transistors 243 and 245 when repeater 23 receives signal EXTMS1 at H-level. When repeater 23 receives signal EXTMS1 at L-level, N- and P-channel MOS transistors 236 and 238 are turned off, and does not output clock CLKQ applied from delay circuit 231 to the source terminals of N- and P-channel MOS transistors 243 and 245.

N- and P-channel MOS transistors 237 and 239 form a transfer gate. N-channel MOS transistor 237 receives on its gate terminal an output signal of inverter 235. P-channel MOS transistor 239 receives signal EXTMS1 on its gate terminal. Therefore, N- and P-channel MOS transistors 237 and 239 are turned on to output clock CLKQ received from delay circuit 232 to the source terminals of N- and P-channel MOS transistors 243 and 245 when repeater 23 receives signal EXTMS1 at L-level. When repeater 23 receives signal EXTMS1 at H-level, N- and P-channel MOS transistors 237 and 239 are turned off, and do not output clock CLKQ received from delay circuit 232 to the source terminals of N- and P-channel MOS transistors 243 and 245.

As described above, the transfer gate formed of N- and P-channel MOS transistors 236 and 238 is opened complementarily to the transfer gate formed of N- and P-channel MOS transistors 237 and 239 in accordance with the logical level of signal EXTMS1. When semiconductor memory device 110 is driven by the power supply voltage of 2.5 V, signal EXTMS1 at H-level is input to repeater 23. When semiconductor memory device 110 is driven by the power supply voltage of 3.3 V, signal EXTMS1 at L-level is input to repeater 23. Accordingly, when semiconductor memory device 110 is driven by the power supply voltage of 2.5 V, clock CLKQ delayed by delay circuit 231 is output to the source terminals of N- and P-channel MOS transistors 243 and 245. When semiconductor memory device 110 is driven by the power supply voltage of 3.3 V, clock CLKQ delayed by delay circuit 232 is output to the source terminals of N- and P-channel MOS transistors 243 and 245.

Inverter 241 inverts signal MCL1, and outputs the same to the gate terminal of N-channel MOS transistor 243. N- and P-channel MOS transistors 243 and 245 form a transfer gate. N-channel MOS transistor 243 receives the output signal of inverter 241 on its gate terminal. P-channel MOS transistor 245 receives signal MCL1 on its gate terminal. Therefore, N- and P-channel MOS transistors 243 and 245 are turned on to output clock CLKQ received from delay circuit 231 or 232 to the gate terminals of P- and N-channel MOS transistors 247 and 248 when repeater 23 receives signal MCL1 at L-level. When repeater 23 receives signal MCL1 at H-level, N- and P-channel MOS transistors 243 and 245 are turned off, and do not output clock CLKQ received from delay circuit 231 or 232 to the gate terminals of P- and N-channel MOS transistors 247 and 248.

Inverter 242 inverts signal MCL1, and outputs the same to the gate terminal of P-channel MOS transistor 246. N- and P-channel MOS transistors 244 and 246 for a transfer gate. N-channel MOS transistor 244 receives signal MCL1 on its gate terminal. P-channel MOS transistor 246 receives the output signal of inverter 242 on its gate terminal. Therefore, N- and P-channel MOS transistors 244 and 246 are turned on to output clock CLKQ received from delay circuit 233 to the gate terminals of P- and N-channel MOS transistors 247 and

248 when repeater 23 receives signal MCL1 at H-level. When repeater 23 receives signal MCL1 at L-level, N- and P-channel MOS transistors 244 and 246 are turned off, and do not output clock CLKQ received from delay circuit 233 to the gate terminals of P- and N-channel MOS transistors 247 and 248.

Signal MCL1 is held at H-level when it defines a delay time from an operation of instructing reading of data from the memory cell to an actual output of read data (i.e., when it defines a CAS latency). Otherwise, signal MCL1 is held at L-level. Therefore, when repeater 23 receives signal MCL1 at L-level, N- and P-channel MOS transistors 244 and 246 are turned off, and N- and P-channel MOS transistors 243 and 245 are turned on. Clock CLKQ applied from delay circuit 231 or 232 is output to the gate terminals of P- and N-channel MOS transistors 247 and 248. When repeater 23 receives signal MCL1 at H-level, N- and P-channel MOS transistors 243 and 245 are turned off, and N- and P-channel MOS transistors 244 and 246 are turned on. Clock CLKQ applied from delay circuit 233 is output to the gate terminals of P- and N-channel MOS transistors 247 and 248.

P-channel MOS transistors 247 and 248 are connected in series between a power supply node 249 and a ground node 251. Power supply node 249 is supplied with power supply voltage VDD, and ground node 251 is supplied with ground voltage GND. An inverter formed of P- and N-channel MOS transistors 247 and 248 outputs clock CLKQ at H-level formed of power supply voltage VDD when it receives clock CLKQ at L-level. When the inverter formed of P- and N-channel MOS transistors 247 and 248 receives clock CLKQ at H-level, it outputs clock CLKQ at L-level formed of ground voltage GND.

When semiconductor memory device 110 is driven by the power supply voltage of 2.5 V and the CAS latency is not defined, signal EXTMS1 at H-level and signal MCL1 at L-level are input to repeater 23. Thereby, N-channel MOS transistors 237 and 244 as well as P-channel MOS transistors 239 and 246 are turned off, and N-channel MOS transistors 236 and 243 as well as P-channel MOS transistors 238 and 245 are turned on. P- and N-channel MOS transistors 247 and 248 output clock CLKQ formed of power supply voltage VDD and ground voltage GND based on clock CLKQ delayed by delay circuit 231.

When semiconductor memory device 110 is driven by the power supply voltage of 2.5 V and the CAS latency is defined, signal EXTMS1 at H-level and signal MCL1 at H-level are input to repeater 23. Thereby, N-channel MOS transistor 237 and 243 as well as P-channel MOS transistors 239 and 245 are turned off, and N-channel MOS transistors 236 and 244 as well as P-channel MOS transistors 238 and 246 are turned on. P- and N-channel MOS transistors 247 and 248 output clock CLKQ formed of power supply voltage VDD and ground voltage GND based on clock CLKQ delayed by delay circuit 233.

When semiconductor memory device 110 is driven by the power supply voltage of 3.3 V and the CAS latency is not defined, repeater 23 receives signal EXTMS1 at L-level and signal MCL1 at L-level. Thereby, N-channel MOS transistors 236 and 244 as well as P-channel MOS transistors 238 and 246 are turned off, and N-channel MOS transistors 237 and 243 as well as P-channel MOS transistors 239 and 245 are turned on. P- and N-channel MOS transistors 247 and 248 output clock CLKQ formed of power supply voltage VDD and ground voltage GND based on clock CLKQ delayed by delay circuit 232.

When semiconductor memory device 110 is driven by the power supply voltage of 3.3 V and the CAS latency is defined, signal EXTMS1 at L-level and signal MCL1 at H-level are input to repeater 23. Thereby, N-channel MOS transistors 236 and 243 as well as P-channel MOS transistors 238 and 245 are turned off, and N-channel MOS transistors 237 and 244 as well as P-channel MOS transistors 239 and 246 are turned on. P- and N-channel MOS transistors 247 and 248 output clock CLKQ formed of power supply voltage VDD and ground voltage GND based on clock CLKQ delayed by delay circuit 233.

Delay amounts T1–T3 of clock CLKQ in delay circuits 231–233 exhibit such relationships that delay amount T2 is 1.57 times larger than delay amount T1, and delay amount T3 is 2.29 times larger than delay amount T1.

As described above, when repeater 23 is driven by the power supply voltage of 2.5 V or 3.3 V, and the CAS latency is defined, repeater 23 controls or adjusts the phase of clock CLKQ applied to banks 11 and 13 to match with the phase of clock CLKQ applied to banks 10 and 12, and outputs clock CLKQ thus adjusted to banks 11 and 13.

Thereby, delay caused in clock CLKQ between driver 21 and repeater 22 is removed, and banks 10–13 receive clock CLKQ having the same phases, and output the read data to the input/output terminals in synchronization with received clock CLKQ.

The semiconductor memory device of the second embodiment may be prepared by applying semiconductor memory device 100 of the first embodiment to semiconductor memory device 110.

The semiconductor memory device of the second embodiment is merely required to locate the plurality of repeaters in the positions at the same distance from the banks.

According to the second embodiment, since the semiconductor memory device is provided with the plurality of repeaters, which are located at the same distance from the banks, the amount of delay of the clock caused between each repeater and each of the corresponding banks can be the same as the others.

Since the plurality of repeaters are located near the banks, the amount of delay caused between the repeater and the bank can be reduced.

Further, the repeater located near the driver supplies the received clock to the bank after matching the phase thereof with the phase of the clock applied from the other repeater. Therefore, the output timing of read data in each bank can be substantially the same as that in the other banks.

When the power supply voltage of the semiconductor memory device changes and the CAS latency is defined, the repeater at a short distance from the driver supplies the received clock to the bank after adjusting the phase of the clock with that of the clock output from the other repeater. Therefore, when the power supply voltage of the semiconductor memory device changes and the CAS latency is defined, the output timing of read data in each bank can be substantially the same as that in the other banks.

Third Embodiment

Figure 5:
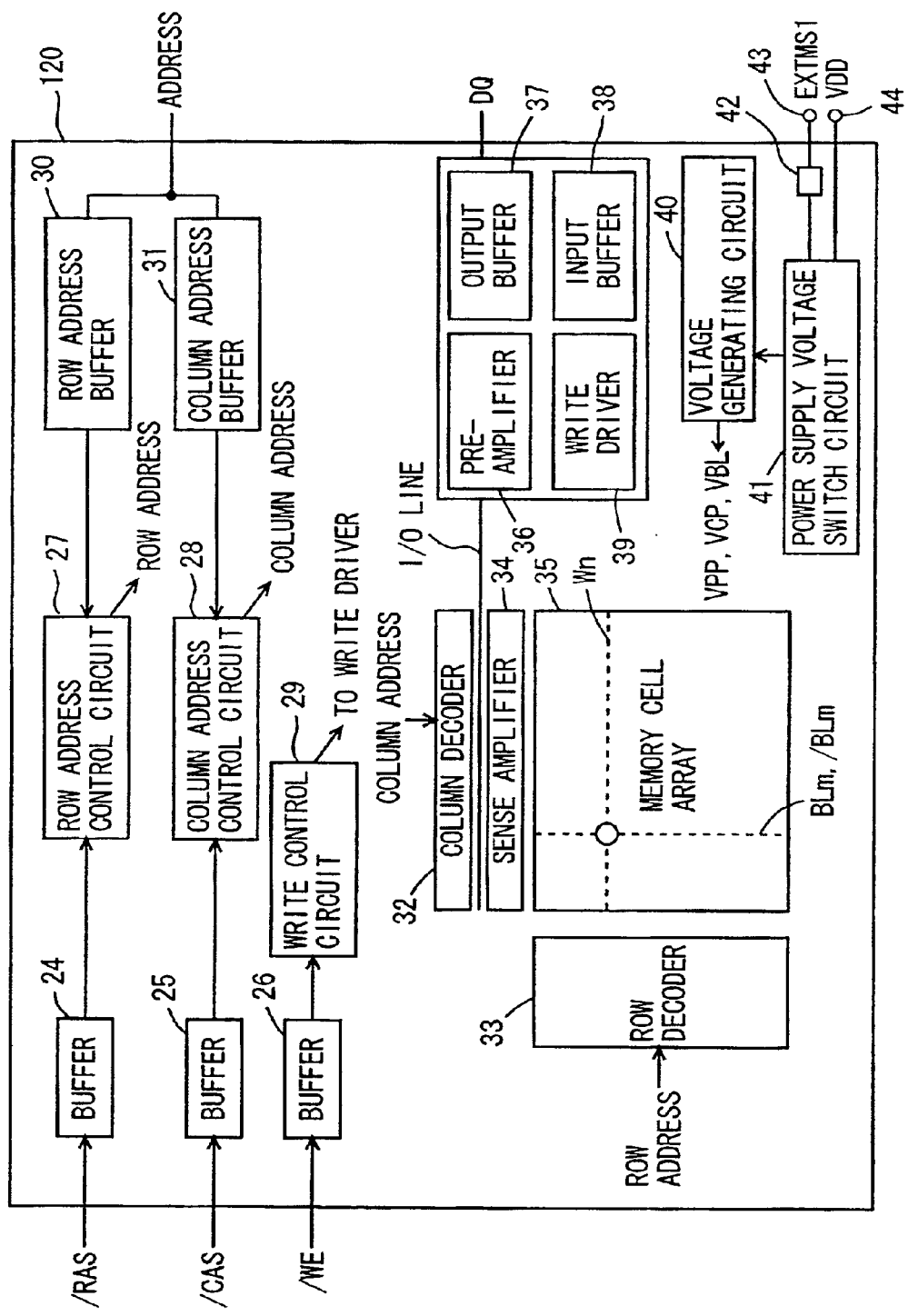
FIG. 5 is a schematic block diagram of a semiconductor memory device of a third embodiment.

Referring to FIG. 5, a semiconductor memory device 120 of a third embodiment includes buffers 24–26, a row address control circuit 27, a column address control circuit 28, a write control circuit 29, a row address buffer 30, a column address buffer 31, a column decoder 32, a row decoder 33, a sense amplifier 34, a memory cell array 35, a preamplifier 36, an output buffer 37, an input buffer 38, a write driver 39, a voltage generating circuit 40, a power supply voltage switch circuit 41, a pad 42 and terminals 43 and 44.

Buffer 24 latches a row address strobe signal /RAS, and outputs the same to row address control circuit 27. Buffer 25 latches a column address strobe signal /CAS, and outputs the same to column address control circuit 28. Buffer 26 latches a write enable signal /WE, and outputs the same to write control circuit 29.

When row address control circuit 27 receives an address from row address buffer 30 in accordance with the same timing as the switching of row address strobe signal /RAS, which is applied from buffer 24, from H-level to L-level, row address control circuit 27 outputs the received address to row decoder 33 as a row address.

When column address control circuit 28 receives an address from column address buffer 31 in accordance with the same timing as the switching of column address strobe signal /CAS, which is applied from buffer 25, from H-level to L-level, column address control circuit 28 outputs the received address to column decoder 32 as a column address.

When write control circuit 29 receives write enable signal /WE at L-level from buffer 26, it controls write driver 39 to write the write data into the memory cell. Row address buffer 30 latches the received address, and outputs the same to row address control circuit 27. Column address buffer 31 latches the received address, and outputs the same to column address control circuit 28.

Column decoder 32 decodes the column address received from column address control circuit 28, and activates the bit line pair designated by the decoded column address. Row decoder 33 decodes the row address received from row address control circuit 27, and activates the word line designated by the decoded row address.

Sense amplifier 34 amplifies the read data, which is read from the bit line pair activated by column decoder 32, and outputs the amplified read data to preamplifier 36 through an I/O line. Sense amplifier 34 writes the write data, which is written onto the I/O line by write driver 39, onto the bit line pair activated by column decoder 32. Memory cell array 35 includes a plurality of memory cells arranged in rows and columns, a plurality of bit line pairs BLm and /BLm arranged in the column direction, a plurality of equalize circuits arranged corresponding to the plurality of bit line pairs BLm and /BLm, and a plurality of word lines Wn arranged in the row direction.

Preamplifier 36 amplifies the read data received from the I/O line, and outputs the same to output buffer 37. Output buffer 37 latches the read data applied from preamplifier 36, and outputs the same to an input/output terminal DQ. Input buffer 38 latches the write data applied from input/output terminal DQ, and outputs the same to write driver 39. Write driver 39 writes the write data applied from input buffer 38 onto the I/O line.

Voltage generating circuit 40 generates internal voltages VPP, VCP and VBL based on the power supply voltage applied from power supply voltage switch circuit 41. Internal voltage VPP is output to row decoder 33. Internal voltage VCP is applied to a cell plate electrode of each of the plurality of memory cells included in memory cell array 35. Internal voltage VBL is output to each of the plurality of equalize circuits included in the memory cell array.

Internal voltage VPP is a voltage for activating each of the plurality of word lines Wn included in memory cell array 35, and is formed of a voltage level higher than power supply voltage VDD. In general, a word line driver activates the word line. However, it is assumed that row decoder 33 also serves as the word line driver, and the word line driver is not shown in FIG. 5 for the sake of simplicity. Therefore, voltage generating circuit 40 generates and supplies internal voltage VPP to row decoder 33. Internal voltage VCP is a cell plate voltage, and is supplied to a cell plate electrode, which is one of electrodes of a capacitor forming the memory cell, for holding the written data in the memory cell. Further, internal voltage VBL is a precharge voltage, and is used for equalizing the plurality of bit line pairs before input/output of data to and from the memory cell. Internal voltage VBL is usually set to half the power supply voltage VDD (=VDD/2).

Power supply voltage switch circuit 41 receives signal EXTMS1 from pad 42, receives power supply voltage VDD from terminal 44, switches the voltage level of power supply voltage VDD in accordance with the voltage level of signal EXTMS1, and supplies power supply voltage VDD at the switched voltage level to voltage generating circuit 40 and various portions of semiconductor memory device 120. Power supply voltage switch circuit 41 switches the voltage level in a manner, which will be described later. Signal EXTMS1 is formed of a voltage at a high or low voltage level. In the following description, it is assumed that the signal EXTMS1 at L-level is input when the power supply voltage is at a high voltage level, and signal EXTMS1 at H-level is input when the power supply voltage is at a low voltage level.

Pad 42 outputs signal EXTMS1 applied from terminal 43 to power supply voltage switch circuit 41. When semiconductor memory device 120 is driven by power supply voltage VDD of 2.5 V, signal EXTMS1 at H-level is input from terminal 43 to semiconductor memory device 120. When semiconductor memory device 120 is driven by power supply voltage VDD of 3.3 V, signal EXTMS1 at L-level is input from terminal 43 to semiconductor memory device 120.

Referring to FIG. 6, power supply voltage switch circuit 41 includes a voltage down converter 411, an N-channel MOS transistor 412 and a P-channel MOS transistor 413. Voltage down converter 411 produces power supply voltage VDD of 2.5 V by lowering power supply voltage VDD of 3.3 V supplied from terminal 44, and outputs power supply voltage VDD of 2.5 V thus produced to the source terminal of N-channel MOS transistor 412. N-channel MOS transistor 412 receives signal EXTMS1 on its gate terminal, and supplies power supply voltage VDD of 2.5 V applied from voltage down converter 411 to voltage generating circuit 40 and various portions of semiconductor memory device 120 when signal EXTMS1 is at H-level. P-channel MOS transistor 413 receives power supply voltage VDD applied from terminal 44 on its source terminal, and also receives signal EXTMS1 on its gate terminal. When P-channel MOS transistor 413 receives signal EXTMS1 at L-level on its gate terminal, it supplies power supply voltage VDD of 3.3 V to voltage generating circuit 40 and various portions of semiconductor memory device 120.

Accordingly, when semiconductor memory device 120 is driven by the power supply voltage of 3.3 V, power supply voltage switch circuit 41 receives signal EXTMS1 at L-level and power supply voltage VDD of 3.3 V. Thereby, N-channel MOS transistor 412 is turned off, and P-channel MOS transistor 413 is turned on. Power supply voltage switch circuit 41 supplies power supply voltage VDD of 3.3 V, which is supplied from terminal 44, to voltage generating circuit 40 and the various portions of semiconductor memory device 120.

When semiconductor memory device 120 is driven by the power supply voltage of 2.5 V, power supply voltage switch circuit 41 receives signal EXTMS1 at H-level and power supply voltage VDD of 3.3 V. Thereby, N-channel MOS transistor 412 is turned on, and P-channel MOS transistor 413 is turned off. Voltage down converter 411 produces power supply voltage VDD of 2.5 V by lowering power supply voltage VDD of 3.3 V, and outputs the produced power supply voltage VDD of 2.5 V to the source terminal of N-channel MOS transistor 412. N-channel MOS transistor 412 supplies power supply voltage VDD of 2.5 received on its source terminal to voltage generating circuit 40 and the various portions of semiconductor memory device 120.

In semiconductor memory device 120, as described above, the voltage level of power supply voltage VDD is switched in accordance with the voltage level forming signal EXTMS1, and power supply voltage VDD at the switched voltage level is supplied to voltage generating circuit 40 and the various portions of semiconductor memory device 120. Voltage generating circuit 40 generates internal voltages VPP, VCP and VBL based on power supply voltage VDD supplied from power supply voltage switch circuit 41, and supplies internal voltages VPP, VCP and VBL thus generated to row decoder 33, the cell plate electrode of memory cell and the equalize circuit, respectively. Row address strobe signal /RAS, column address strobe signal /CAS, write enable signal /WE and the address are input to semiconductor memory device 120, and the data is input/output to and from each of the plurality of memory cells included in memory cell array 35 in accordance with the normal operation.

Owing to reception of signal EXTMS1, therefore, semiconductor memory device 120 can function as the semiconductor memory device driven by the power supply voltage of 2.5 V or the semiconductor memory device driven by the power supply voltage of 3.3 V. Thus, semiconductor memory device 120 is configured to allow adaptation of one type of the semiconductor memory device to two power supply voltages at different voltage levels.

The description has been given on the semiconductor memory devices, each of which is adaptable to the two power supply voltages at different voltage levels. However, the invention may be applied to a semiconductor memory device, which is adaptable to a plurality of power supply voltages at different voltage levels.

According to the third embodiment, the semiconductor memory device includes the power supply voltage switch circuit, which switches the voltage level of the externally supplied power supply voltage between the plurality of different voltage levels in accordance with the voltage level of the externally applied signal, and supplies the power supply voltage at the switched voltage level to the voltage generating circuit generating the internal voltage. Therefore, one type of the semiconductor memory device can be adapted to the plurality of power supply voltages at different voltage levels.

Fourth Embodiment

Figure 7:
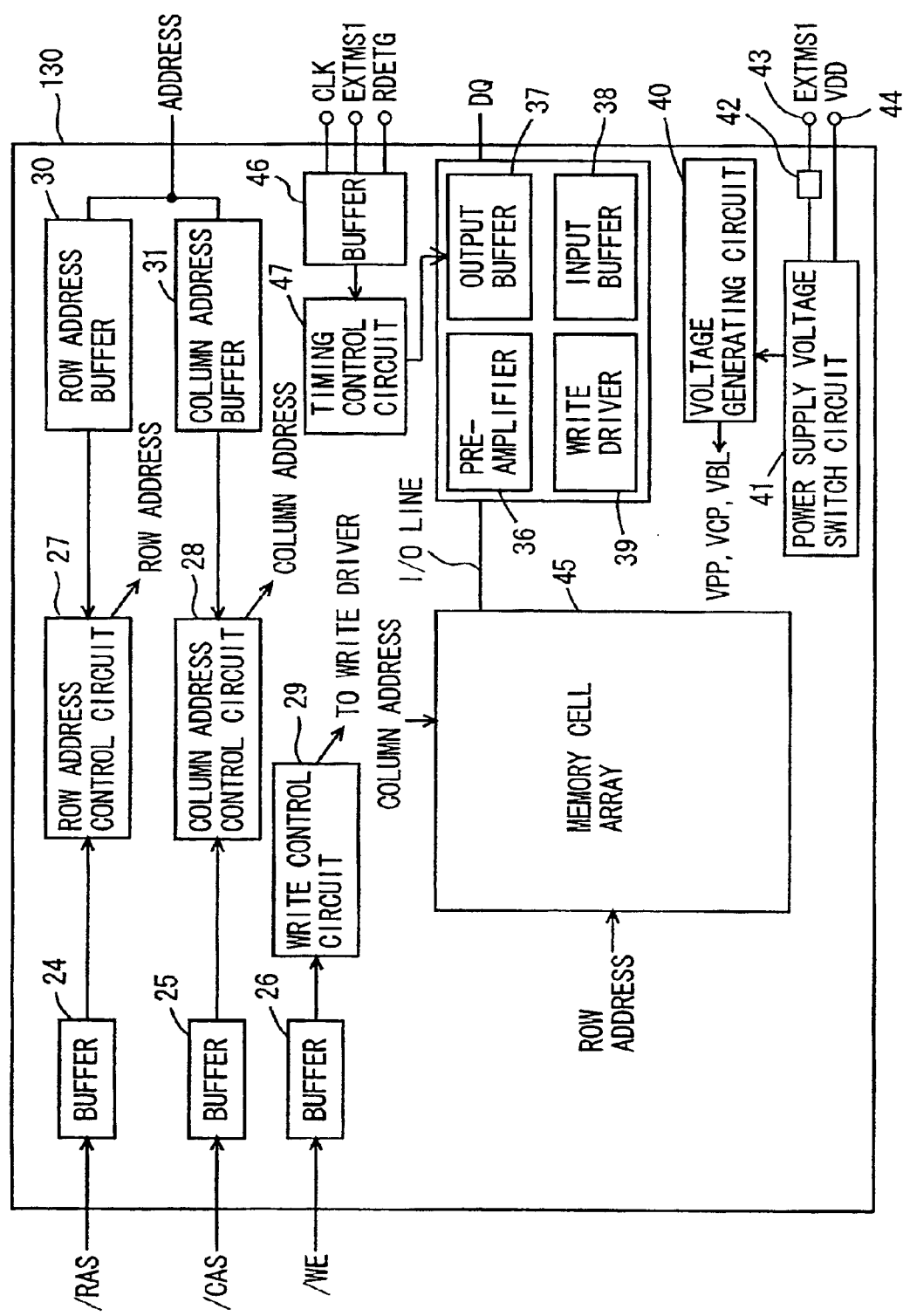
FIG. 7 is a schematic block diagram of a semiconductor memory device of a fourth embodiment.

Referring to FIG. 7, a semiconductor memory device 130 of a fourth embodiment is the same as semiconductor memory device 120 except for that a buffer 46 and a timing control circuit 47 are added, and a memory cell array 45 is employed instead of column decoder 32, row decoder 33, sense amplifier 34 and memory cell array 35. Accordingly, memory cell array 45 includes a plurality of memory cells, a plurality of bit line pairs, a plurality of word lines, a plurality of equalize circuits, a column decoder, a row decoder, a word line driver and a sense amplifier.

Buffer 46 latches externally input clock CLK, signal EXTMS1 and a signal RDETG, and outputs the same to timing control circuit 47. Buffer 46 outputs latched clock CLK to row address control circuit 27, column address control circuit 28, write control circuit 29, input buffer 38 and write driver 39. Thereby, data is input/output to and from each of the plurality of memory cells included in memory cell array 45 in synchronization with clock CLK.

When semiconductor memory device 130 is driven by the power supply voltage of 3.3 V, transistors operate faster than those in the semiconductor memory device driven by the power supply voltage of 2.5 V, and therefore the timing of output of read data from the memory cell may not match with the timing of the read data output operation performed with the power supply voltage of 2.5 V. For preventing this mismatch, timing control circuit 47 adjusts or controls the phase of clock CLKQ for output of the read data and the phase of signal RDETG defining the output timing of the read data, and outputs clock CLKQ and signal RDETG thus controlled to output buffer 37 so that output buffer 37 may output the read data to input/output terminal DQ in accordance with the same timing in both the cases where semiconductor memory device 130 is driven by the power supply voltage of 2.5 V, and where semiconductor memory device 130 is driven by the power supply voltage of 3.3 V. Output buffer 37 outputs the read data received from preamplifier 36 to input/output terminal DQ in accordance with the timing of signal RDETG applied from timing control circuit 47 and in synchronization with clock CLKQ.

Figure 8:
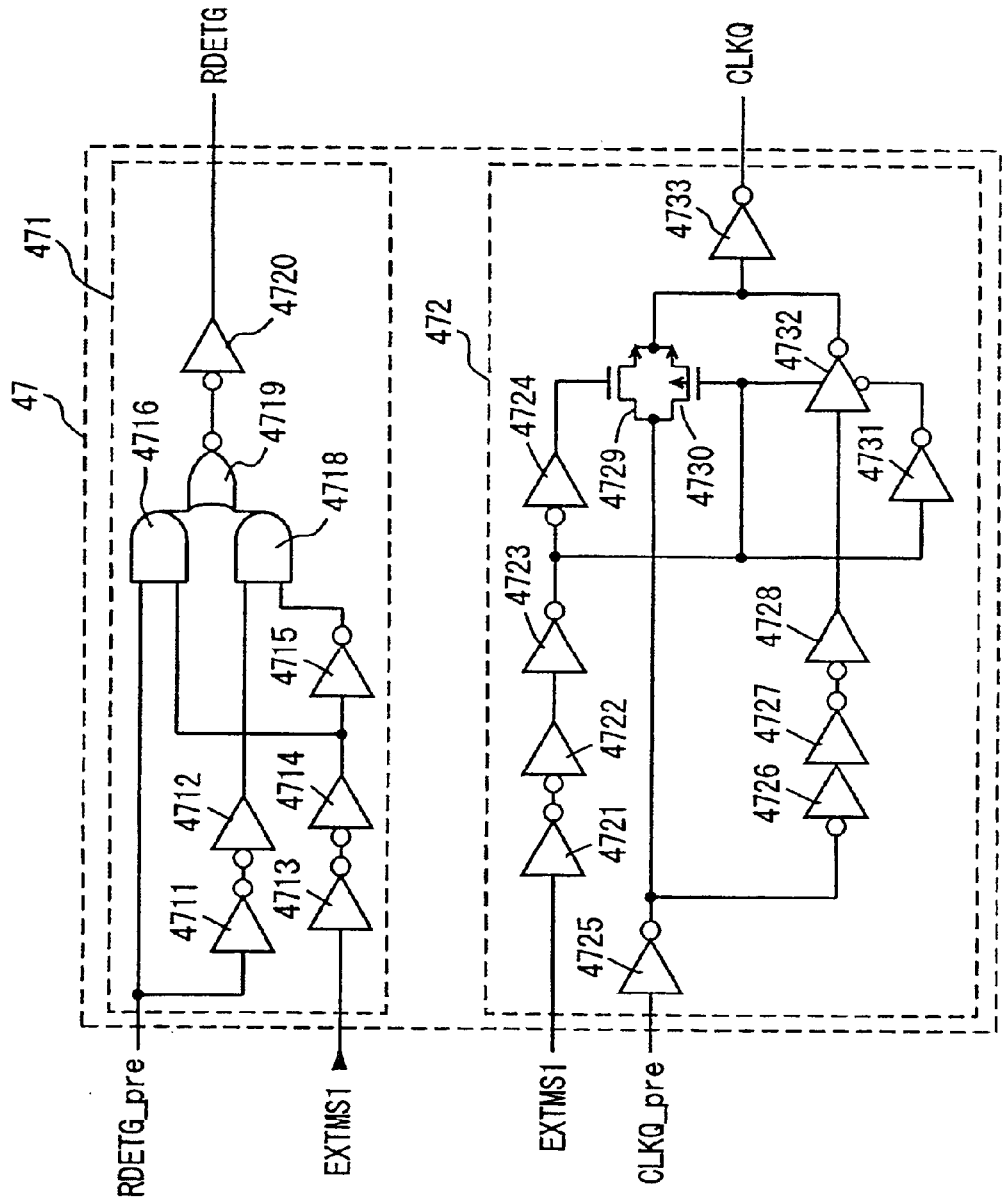
FIG. 8 is a circuit diagram of a timing control circuit shown in FIG. 7.

Referring to FIG. 8, timing control circuit 47 includes a signal control circuit 471 and a clock control circuit 472. Signal control circuit 471 is formed of inverters 4711–4715 and 4720, AND gates 4716 and 4718, and a NOR gate 4719.

Inverters 4711 and 4712 delay a signal RDETG_pre, which is based on signal RDETG and is applied from buffer 46, by a predetermined amount, and outputs the same to one of terminals of AND gate 4718. In this case, inverters 4711 and 4712 delay the phase of signal RDETG_pre so that the phase of signal RDETG_pre is constant in both the cases where the power supply voltage is 2.5 V, and where the power supply voltage is 3.3 V. AND gate 4716 receives signal RDETG_pre on one of its terminals, and receives a signal at the same logical level as signal EXTMS1 on the other terminal. AND gate 4716 performs logical AND between the two signals applied thereto, and outputs a result of the operation to one of terminals of NOR gate 4719. AND gate 4718 receives signal RDETG_pre delayed by a predetermined amount on one of its terminals and signal EXTMS1 whose logical level is inverted on the other of its terminals. AND gate 4718 performs logical AND between the two signals applied thereto, and outputs a result of the operation to the other terminal of NOR gate 4719.

NOR gate 4719 performs logical OR between the output signals of AND gates 4716 and 4718, and inverts a result of the operation for outputting the same to inverter 4720. Inverter 4720 inverts the output signal of NOR gate 4719 to output signal RDETG to output buffer 37.

When semiconductor memory device 130 is driven by the power supply voltage of 2.5 V, signal EXTMS1 at H-level is input. When semiconductor memory device 130 is driven by the power supply voltage of 3.3 V, signal EXTMS1 at L-level is input. Therefore, when semiconductor memory device 130 is driven by the power supply voltage of 2.5 V, AND gate 4718 receives the signal at L-level from inverter 4715, and therefore outputs the signal at L-level to the other terminal of NOR gate 4719 independently of the logical level of the output signal of inverter 4712. Since AND gate 4716 receives the signal at H-level from inverter 4714, it outputs the signal at the logical level, which is variable in accordance with the logical level of signal RDETG_pre, to one of the terminals of NOR gate 4719. NOR gate 4719 outputs to inverter 4720 the signal, which is prepared by inverting a result of logical OR between the output signals of AND gates 4716 and 4718, and thus the signal prepared by inverting the signal, of which logical level is variable in accordance with the logical level of signal RDETG_pre. Inverter 4720 outputs, as signal RDETG, to output buffer 37 the signal prepared by inverting the output signal of NOR gate 4719, i.e., the signal having the logical level, which is variable in accordance with the logical level of signal RDETG_pre. Accordingly, signal control circuit 471 outputs signal RDETG_pre, which determines the timing of data reading, to output buffer 37 without delaying it when semiconductor memory device 130 is driven by power supply voltage of 2.5 V.

When semiconductor memory device 130 is driven by the power supply voltage of 3.3 V, AND gate 4716 receives the signal at L-level from inverter 4714, and therefore outputs the signal at L-level to one of the terminals of NOR gate 4719 independently of the logical level of signal RDETG_pre. Since AND gate 4718 receives the signal at H-level from inverter 4715, it outputs the signal having the logical level, which is variable in accordance with the logical level of the signal prepared by delaying signal RDETG_pre by a predetermined amount, to the other terminal of NOR gate 4719. NOR gate 4719 outputs to inverter 4720 the signal prepared by inverting a result of logical OR between the output signals of AND gates 4716 and 4718, i.e., the signal having the logical level, which is variable in accordance with the logical level of the signal prepared by delaying signal RDETG_pre by the predetermined amount. Inverter 4720 outputs, as signal RDETG, to output buffer 37 a signal prepared by inverting the output signal of NOR gate 4719, i.e., a signal having the logical level, which is variable in accordance with the logical level of the signal prepared by delaying signal RDETG_pre by the predetermined amount. Accordingly, signal control circuit 471 delays signal RDETG_pre determining the output timing of read data by a predetermined amount, and outputs the same to output buffer 37 when semiconductor memory device 130 is driven by the power supply voltage of 3.3 V.

Clock control circuit 472 is formed of inverters 4721–4728, 4731–4733, an N-channel MOS transistor 4729 and a P-channel MOS transistor 4730. Inverter 4732 is a clocked inverter. Each of inverters 4721–4723 inverts the input signal and outputs the output signal. Inverter 4724 inverts the output signal of inverter 4723, and outputs the same to the gate terminal of N-channel MOS transistor 4729. Inverter 4731 inverts the output signal of inverter 4723, and outputs the same to a clock terminal of inverter 4732.

Inverter 4725 inverts a clock CLKQ_pre based on clock CLK applied from buffer 46. Inverters 4726–4728 delay the output signal of inverter 4725 by a predetermined amount, and output the same to inverter 4732. In this operation, inverters 4726–4728 delay the phase of the inverted signal of clock CLKQ_pre so that the phase of clock CLKQ may be constant in both the cases where power supply voltage is 2.5 V, and where the power supply voltage is 3.3 V. N- and P-channel MOS transistors 4729 and 4730 form a transfer gate. N-channel MOS transistor 4729 receives the output signal of inverter 4724 on its gate terminal, and also receives the output signal of inverter 4725 on its source terminal. P-channel MOS transistor 4730 receives the output signal of inverter 4723 on its gate terminal, and receives the output signal of inverter 4725 on its source terminal. Inverter 4732 receives, as clocks, the inverted signal of the output signal of inverter 4731 and the output signal of inverter 4723.

Inverter 4733 inverts the output signal of inverter 4732 or the output signals of N- and P-channel MOS transistors 4729 and 4730, and outputs clock CLKQ to output buffer 37.

When semiconductor memory device 130 is driven by the power supply voltage of 2.5 V, it receives signal EXTMS1 at H-level so that N-channel MOS transistor 4729 receives the signal at H-level applied from inverter 4724 on its gate terminal, and P-channel MOS transistor 4730 receives the signal at L-level applied from inverter 4723 on its gate terminal. Also, inverter 4732 receives the signal at L-level applied from inverter 4723 and the signal at H-level applied from inverter 4731. Thereby, inverter 4732 is deactivated so that N- and P-channel MOS transistors 4729 and 4730 are turned on. N- and P-channel MOS transistors 4729 and 4730 receive the signal prepared by inverting clock CLKQ_pre from inverter 4725, and outputs the received signal to inverter 4733. Inverter 4733 inverts the received signal to output clock CLKQ to output buffer 37. Therefore, clock control circuit 472 outputs the externally supplied clock to output buffer 37 without delaying the phase thereof when semiconductor memory device 130 is driven by the power supply voltage of 2.5 V.

When semiconductor memory device 130 is driven by the power supply voltage of 3.3 V, it receives signal EXTMS1 at L-level so that N-channel MOS transistor 4729 receives on its gate terminal the signal at L-level from inverter 4724, P-channel MOS transistor 4730 receives on its gate terminal the signal at H-level from inverter 4723, and inverter 4732 receives the signal at H-level applied from inverter 4723 and the signal at L-level applied from inverter 4731. Thereby, N- and P-channel MOS transistors 4729 and 4730 are turned off, and inverter 4732 is activated. Inverter 4732 inverts the signal prepared by delaying clock CLKQ_pre by a predetermined amount, and outputs the same to inverter 4733. Inverter 4733 inverts the output signal of inverter 4732, and outputs the same to output buffer 37. Therefore, clock control circuit 472 delays the phase of the externally applied clock by a predetermined amount for outputting the same to output buffer 37 when semiconductor memory device 130 is driven by the power supply voltage of 3.3 V.

As described above, timing control circuit 47 outputs signal RDETG, which defines the timing of output of the read data, to output buffer 37 without delaying the phase of signal RDETG by signal control circuit 471 when power supply voltage is 2.5 V. When power supply voltage is 3.3 V, timing control circuit 47 outputs signal RDETG, which defines the timing of output of the read data, to output buffer 37 after signal control circuit 471 delays the phase of signal RDETG by a predetermined amount.

When power supply voltage is 2.5 V, timing control circuit 47 outputs clock CLKQ to output buffer 37 without delaying the phase of clock CLKQ by clock control circuit 472. When power supply voltage is 3.3 V, timing control circuit 47 outputs clock CLKQ to output buffer 37 after clock control circuit 472 delays the phase of clock CLKQ by a predetermined amount.

Output buffer 37 outputs the read data applied from preamplifier 36 to input/output terminal DQ in accordance with the same timing as signal RDETG applied from timing control circuit 47 and in synchronization with clock CLKQ. Thereby, the read data can be applied to input/output terminal DQ in accordance with the same timing even when a change occurs in voltage level of the power supply voltage driving semiconductor memory device 130.

It has been described that the inverters for delaying signal RDETG_pre are two in number. According to the invention, however, these inverters are not restricted to two in number, and may generally be even in number. Also, it has been described that the inverters for delaying clock CLKQ_pre are three in number. According to the invention, however, these inverters are not restricted to three in number, and may generally be odd in number.

Structures and operations other than the above are the same as those of the third embodiment.

According to the fourth embodiment, the semiconductor memory device is provided with a timing control circuit for controlling or adjusting the output timing of the read data and the phase of the clock in view of the changes in operation speed of the transistors, which occur due to changes in voltage level of the power supply voltage. Therefore, the read data can be output in accordance with constant timing even when the voltage level of power supply voltage changes.

Fifth Embodiment

Figure 9:
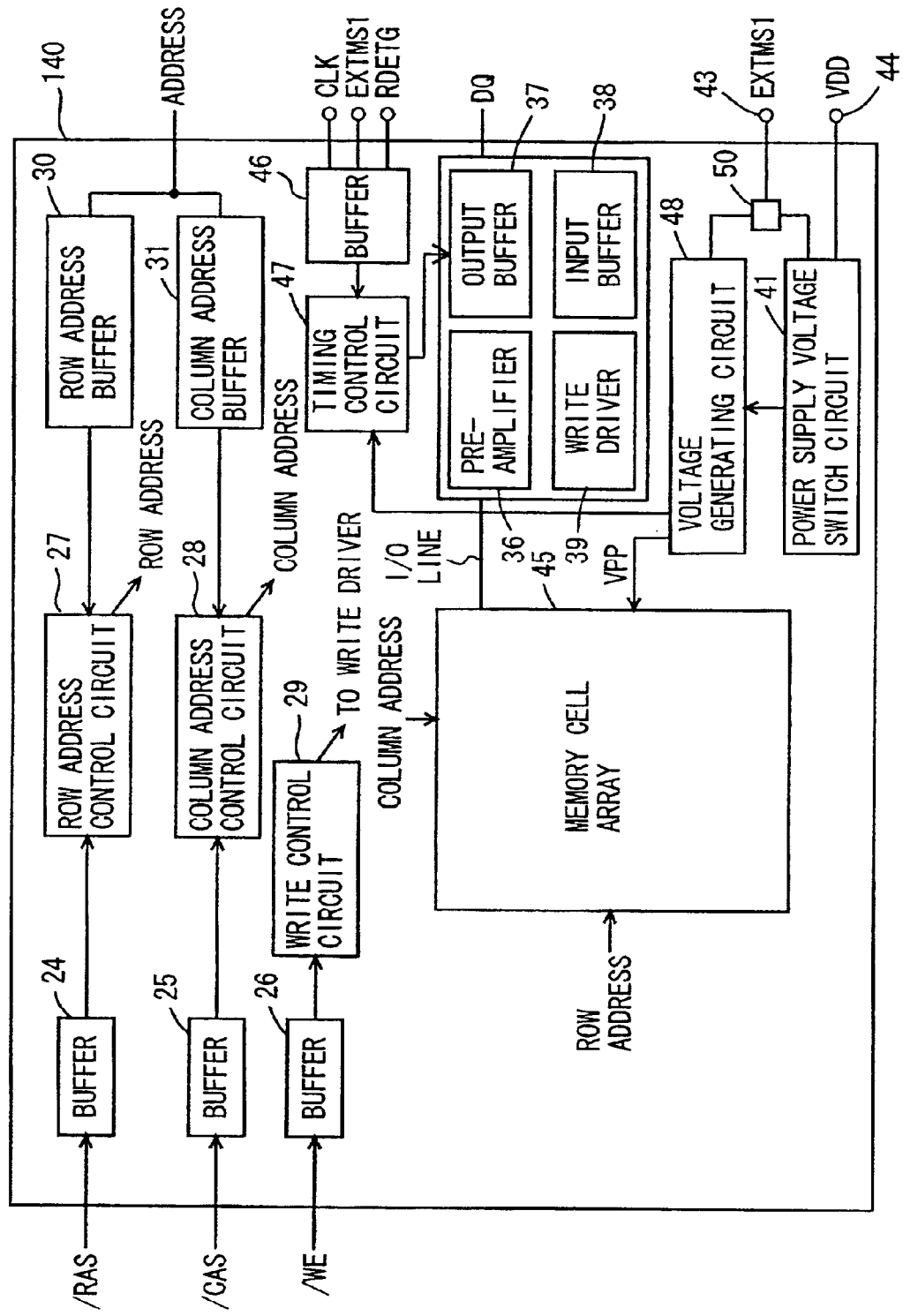
FIG. 9 is a schematic block diagram of a semiconductor memory device of a fifth embodiment.

Referring to FIG. 9, a semiconductor memory device 140 of a fifth embodiment differs from semiconductor memory device 130 in that voltage generating circuit 40 is replaced with a voltage generating circuit 48, and pad 42 is replaced with a pad 50. Structures other than the above are the same as those of semiconductor memory device 130.

Pad 50 outputs signal EXTMS1 applied from terminal 43 to power supply voltage switch circuit 41 and voltage generating circuit 48. Voltage generating circuit 48 generates internal voltage VPP by boosting power supply voltage VDD supplied from power supply voltage switch circuit 41, and supplies internal voltage VPP thus generated to the word line driver included in memory cell array 45. Voltage generating circuit 48 supplies internal voltage VPP generated thereby to timing control circuit 47 only when semiconductor memory device 140 is driven by the power supply voltage of 2.5 V.

Referring to FIG. 10, voltage generating circuit 48 includes a VPP generating circuit 481 and an N-channel MOS transistor 482. VPP generating circuit 481 generates internal voltage VPP by boosting power supply voltage VDD supplied from power supply voltage switch circuit 41, and supplies internal voltage VPP thus generated to the word line driver and the source terminal of N-channel MOS transistor 482. N-channel MOS transistor 482 receives signal EXTMS1 on its gate terminal, and receives internal voltage VPP applied from VPP generating circuit 481 on its source terminal. When N-channel MOS transistor 482 receives signal EXTMS1 at H-level on its gate terminal, it supplies internal voltage VPP received on its source terminal to inverter 4724 (see FIG. 8) of timing control circuit 47.

Inverter 4724 of timing control circuit 47 outputs a signal at H-level to the gate terminal of N-channel MOS transistor 4729 when semiconductor memory device 140 is driven by the power supply voltage of 2.5 V. Thus, inverter 4724 outputs a signal for turning on N-channel MOS transistor 4729, which outputs the inverted signal of clock CLKQ_pre to inverter 4733 without delaying the phase of the inverted signal, when semiconductor memory device 140 is driven by the power supply voltage of 2.5 V. Thereby, inverter 4724 receives, on its power supply node, internal voltage VPP at a higher voltage level than power supply voltage VDD from voltage generating circuit 48, and outputs a signal at H-level formed of internal voltage VPP to the gate terminal of N-channel MOS transistor 4729 so that N-channel MOS transistor 4729 outputs the output signal of inverter 4725 to inverter 4733 without delaying it.

Accordingly, when semiconductor memory device 140 is driven by the power supply voltage of 2.5 V, delay of clock CLKQ can be prevented.

Structures and operations other than the above are the same as those of the fourth embodiment.

According to the fifth embodiment, the semiconductor memory device includes the voltage generating circuit, which supplies the internal voltage formed of the voltage level higher than the power supply voltage, in the circuit for selecting the clock during driving by the power supply voltage at the low voltage level. Therefore, delay of the clock can be prevented during the driving by the low power supply voltage.

Sixth Embodiment

Figure 11:
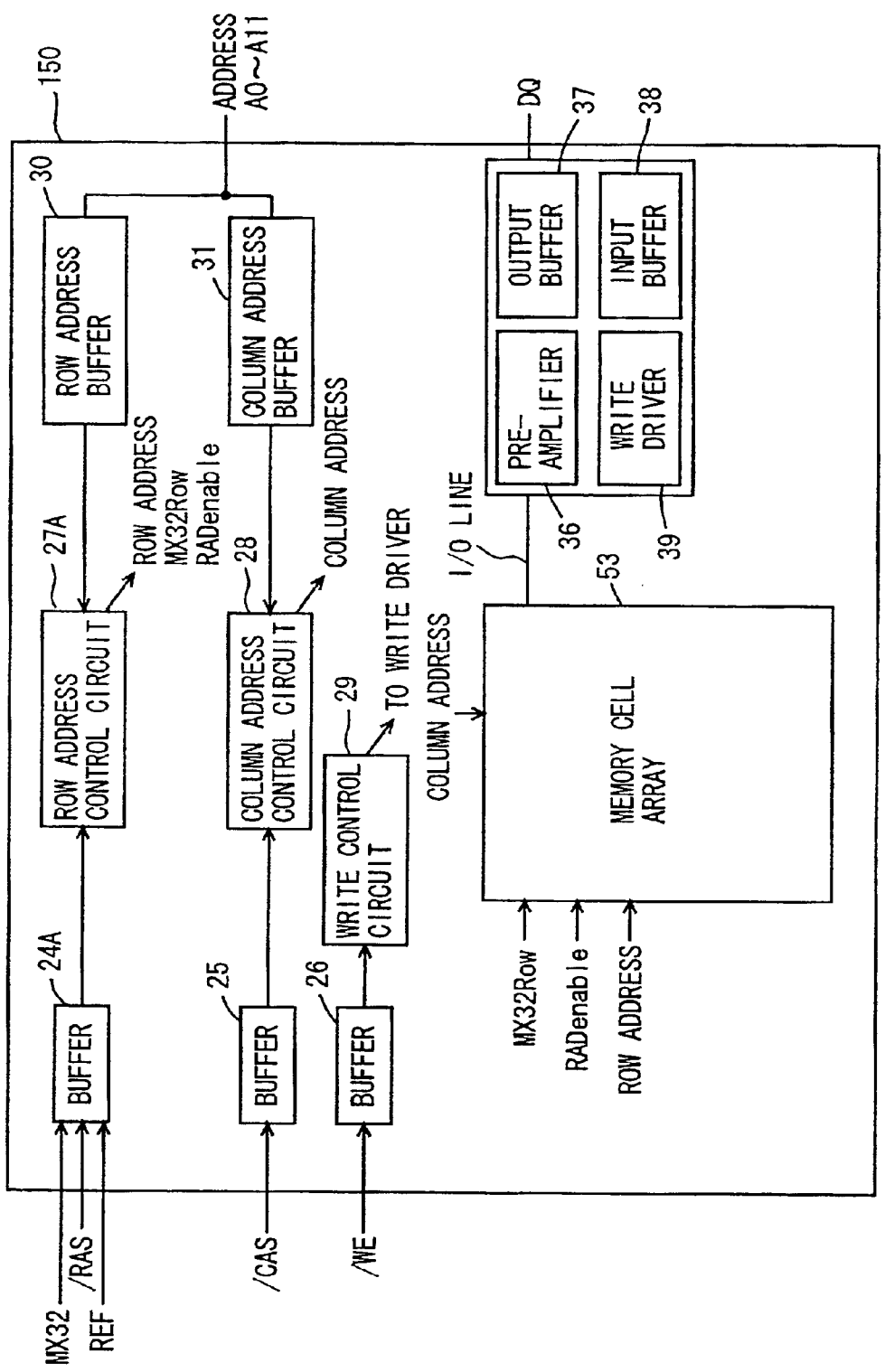
FIG. 11 is a schematic block diagram of a semiconductor memory device of sixth to eighth embodiments.

Referring to FIG. 11, a semiconductor memory device 150 according to a sixth embodiment of the invention includes buffers 24A, 25 and 26, a row address control circuit 27A, column address control circuit 28, write control circuit 29, row address buffer 30, column address buffer 31, preamplifier 36, output buffer 37, input buffer 38, write driver 39 and a memory cell array 53.

Buffers 25 and 26, column address control circuit 28, write control circuit 29, row address buffer 30, column address buffer 31, preamplifier 36, output buffer 37, input buffer 38 and write driver 39 are the same as those, which are already described with reference to FIG. 5.

Buffer 24A latches a signal MX32, row address strobe signal /RAS and refresh signal REF applied thereto, and outputs them to row address control circuit 27A.

Row address control circuit 27A outputs, as the row address, addresses A0–A11 received from row address buffer 30 to the row decoder included in memory cell array 53 in accordance with the timing of switching of row address strobe signal /RAS applied from buffer 24A from H-level to L-level. Row address control circuit 27A produces a signal RADenable at H-level when a control circuit (not shown) instructs the reading of data from the memory cell included in memory cell array 53, and outputs signal RADenable at H-level thus produced to the row decoder included in memory cell array 53. Further, row address control circuit 27A produces a signal MX32Row based on signal MX32 and refresh signal REF applied from buffer 24A in a manner, which will be described later, and outputs signal MX32Row thus produced to the row decoder included in memory cell array 53.

Figure 12:
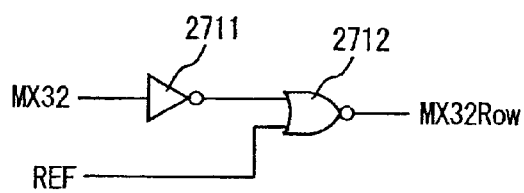
FIG. 12 is a circuit diagram of a signal generating circuit included in a row address control circuit shown in FIG. 11.

Referring to FIG. 12, row address control circuit 27A includes a signal generating circuit 271. Signal generating circuit 271 is formed of an inverter 2711 and a NOR gate 2712. Inverter 2711 inverts signal MX32 applied from buffer 24A, and applies the same to one of terminals of NOR gate 2712. NOR gate 2712 performs logical OR between the output signal of inverter 2711 and refresh signal REF applied from buffer 24A, and inverts a result of the operation for outputting signal MX32Row to the row decoder.

Figure 13:
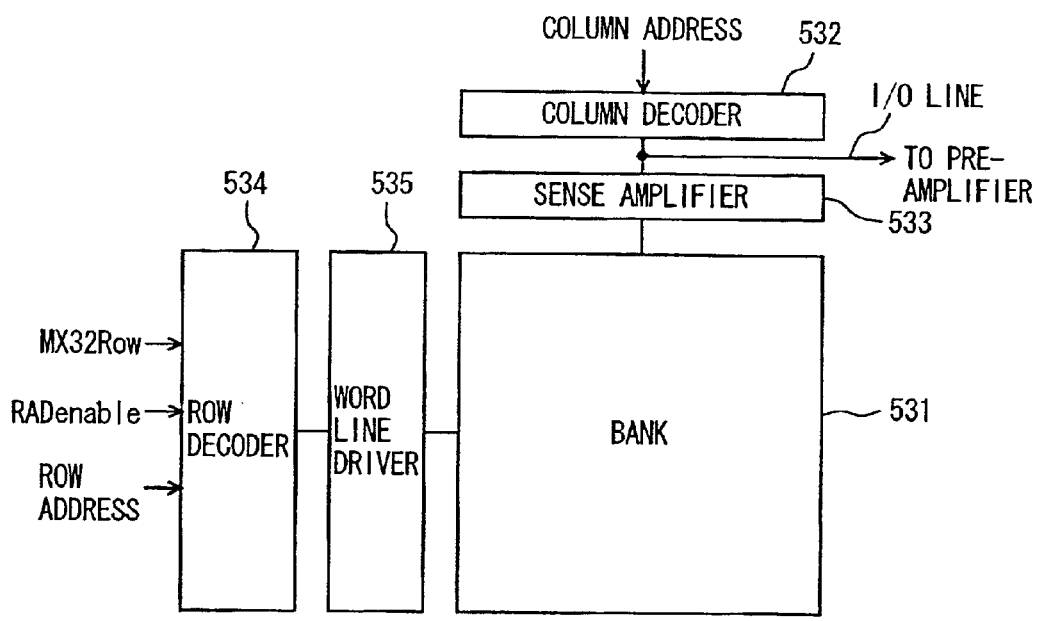
FIG. 13 is a schematic block diagram of a memory cell array shown in FIG. 11.

Referring to FIG. 13, memory cell array 53 includes a bank 531, a column decoder 532, a sense amplifier 533, a row decoder 534 and a word line driver 535. Memory cell array 53 usually includes a plurality of banks, but FIG. 13 shows only one bank as well as circuits required for input/output of data to and from memory cells included in this bank for the sake of illustration.

Bank 531 includes a plurality of memory cells arranged in rows and columns, a plurality of bit line pairs and a plurality of word lilies. The plurality of memory cells are arranged in four divided regions. From each of the four regions, 8 bits of data can be output. Column decoder 532 decodes the column address input from column address control circuit 28, and activates the bit line pair designated by the decoded column address. When reading data, sense amplifier 533 amplifies the read data, which is read from the bit line pair activated by column decoder 532, and outputs the same to preamplifier 36 through the I/O line. When writing data, sense amplifier 533 writes the write data carried on the I/O line onto the bit line pair activated by column decoder 532.

Row decoder 534 decodes the row address applied from row address control circuit 27A, and outputs the decoded row address to word line driver 535. Row decoder 534 produces signals RAD<11> and /RAD<11> for selecting one of the four regions forming bank 531 based on signal MX32Row, a highest bit RA<11> of the row address and signal RADenable applied from row address control circuit 27A, and outputs produced signals RAD<11> and /RAD<11> to word line driver 535.

Word line driver 535 activates the word line designated by the row address in the region, which is selected by signals RAD<11> and /RAD<11> applied from row decoder 534.

Figure 14:
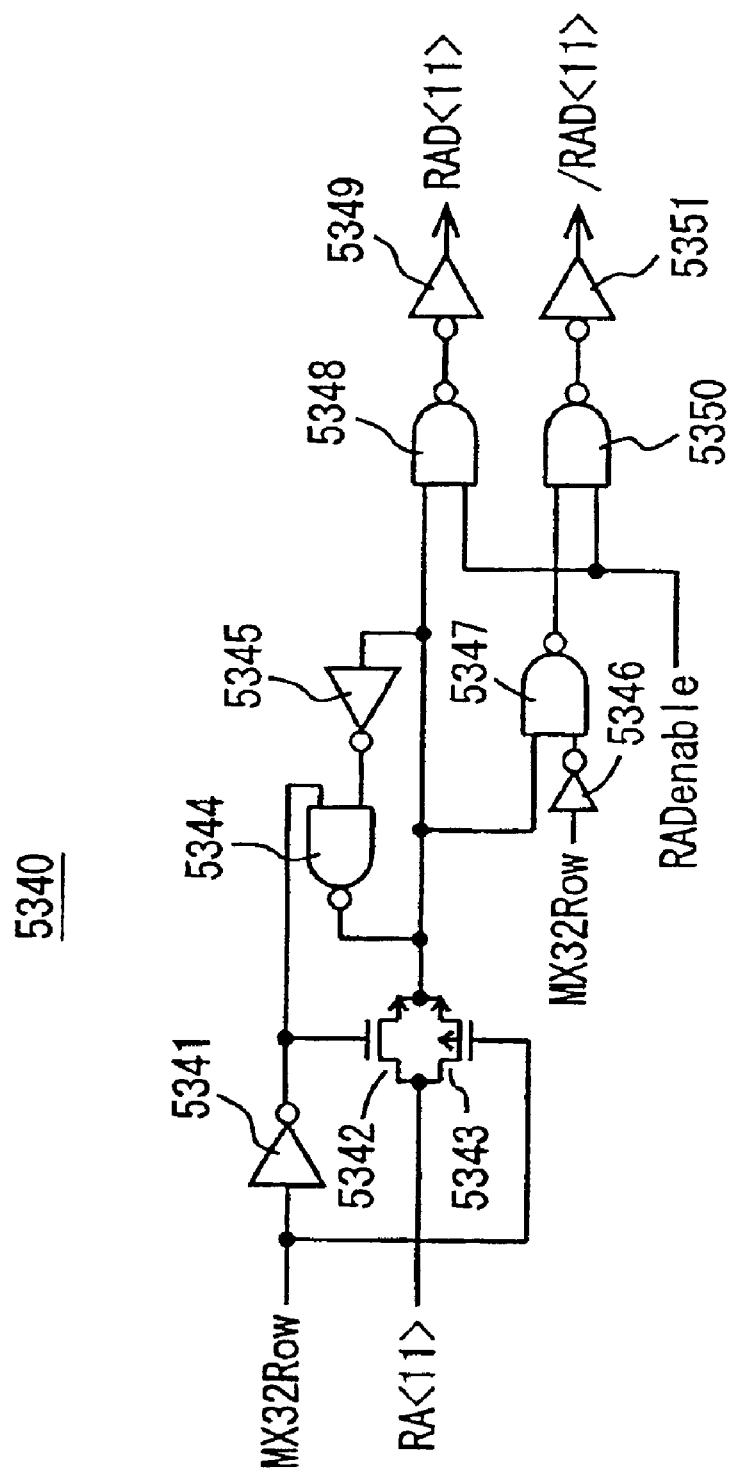
FIG. 14 is a circuit diagram of a latch circuit included in the row decoder shown in FIG. 13.

Referring to FIG. 14, row decoder 534 includes a latch circuit 5340. Latch circuit 5340 includes inverters 5341, 5345, 5346, 5349 and 5351, an N-channel MOS transistor 5342, a P-channel MOS transistor 5343, and NAND gates 5344, 5347, 5348 and 5350.

Inverter 5341 inverts signal MX32Row applied from row address control circuit 27A, and applies the inverted signal to a gate terminal of N-channel MOS transistor 5342 and one of terminals of NAND gate 5344. N- and P-channel MOS transistors 5342 and 5343 form a transfer gate. N-channel MOS transistor 5342 receives the output signal of inverter 5341 on its gate terminal, and receives highest bit RA<11> of the row address applied from row address control circuit 27A on its source terminal. P-channel MOS transistor 5343 receives signal MX32Row on its gate terminal, and receives highest bit RA<11> of the row address on its source terminal.

Inverter 5345 inverts the output signal of N- and P-channel MOS transistors 5342 and 5343, i.e., highest bit RA<11> of the row address, and applies the same to the other terminal of NAND gate 5344. NAND gate 5344 performs logical AND between the output signals of inverters 5341 and 5345, and outputs a signal prepared by inverting a result of the operation to one of terminals of each of NAND gates 5347 and 5348.

Inverter 5346 inverts signal MX32Row, and outputs the same to the other terminal of NAND gate 5347. NAND gate 5347 performs logical AND between the output signals of NAND gates 5344 and inverter 5346, and outputs a signal prepared by inverting a result of the AND operation to one of terminals of NAND gate 5350. NAND gate 5348 performs logical AND between signal RADenable at H-level applied from row address control circuit 27A and the output signal of N- and P-channel MOS transistors 5342 and 5343, and outputs a signal prepared by inverting a result of the AND operation to inverter 5351.

Inverter 5349 inverts the output signal of NAND gate 5348, and outputs signal RAD<11> to word line driver 535. Inverter 5351 inverts the output signal of NAND gate 5350, and outputs signal /RAD<11> to word line driver 535.

Figure 15:
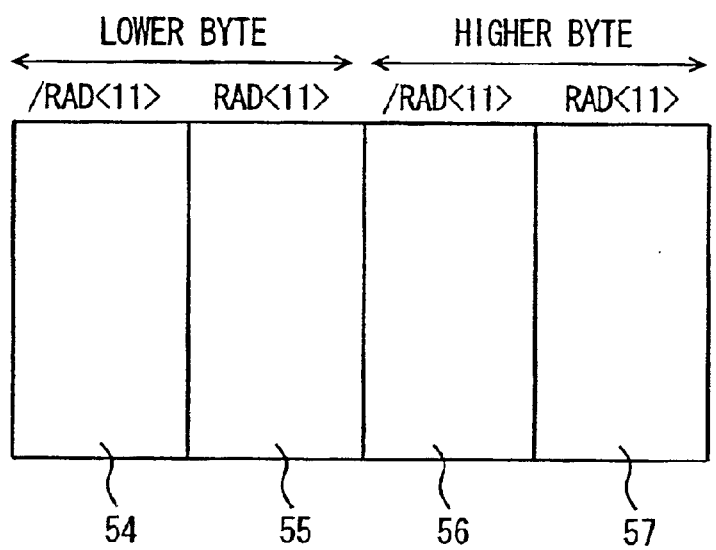
FIG. 15 shows a structure of a bank shown in FIG. 13.

Referring to FIG. 15, bank 531 is formed of regions 54–57. Regions 54 and 55 form lower bytes, and regions 56 and 57 form higher bytes. Eight bits of data are input/output to and from each of regions 54–57. Regions 54 and 56 are selected in accordance with the logical level of signal /RAD<11>, and regions 55 and 57 are selected in accordance with the logical level of signal RAD<11>.

Semiconductor memory device 150 functions as a semiconductor memory device having a word structure of "×16" or "×32". For operating semiconductor memory device 150 having the word structure of "×16", signal MX32 at L-level is applied to semiconductor memory device 150. For operating semiconductor memory device 150 as the device having the word structure of "×32", signal MX32 at H-level is applied to semiconductor memory device 150. Refresh signal REF is at L-level unless the memory cells are to be refreshed.

Referring to FIG. 12 again, when semiconductor memory device 150 is to be operated as the device having the word structure of "×16", signal generating circuit 271 receives signal MX32 at L-level and refresh signal REF at L-level, and inverter 2711 outputs the signal at H-level to one of the terminals of NOR gate 2712. NOR gate 2712 performs logical OR between the signal at H-level applied from inverter 2711 and the refresh signal at L-level, and outputs signal MX32Row at L-level prepared by inverting a result of the OR operation to latch circuit 5340 of row decoder 534.

When semiconductor memory device 150 is to be operated as the semiconductor memory device having the word structure of "×32", signal generating circuit 271 receives signal MX32 at L-level and refresh signal REF at L-level, and inverter 2711 outputs the signal at L-level to one of terminals of NOR gate 2712. NOR gate 2712 performs logical OR between the signal at L-level applied from inverter 2711 and the refresh signal at L-level, and outputs signal MX32Row at H-level prepared by inverting a result of the operation to latch circuit 5340 of row decoder 534.

Row address control circuit 27A outputs the row address and signal RADenable at H-level to latch circuit 5340 of row decoder 534.

Referring to FIG. 14, when semiconductor memory device 150 is to be operated as the semiconductor memory device having the word structure of "×16", latch circuit 5340 receives signal MX32Row at L-level, signal RADenable at H-level and highest bit RA<11> of the row address from row address control circuit 27A.

Thereby, inverter 5341 applies the signal at H-level, which is prepared by inverting signal MX32Row at L-level, to the gate terminal of N-channel MOS transistor 5342 and one of the terminals of NAND gates 5344. Further, P-channel MOS transistor 5343 receives signal MX32Row at L-level on its gate terminal. Therefore, N- and P-channel MOS transistors 5342 and 5343 are turned on to apply highest bit RA<11> of the row address to one of the terminals of each of NAND gates 5347 and 5348.

Description will now be given on the case where highest bit RA<11> of the row address is at L level. In this case, inverter 5345 inverts a signal at L-level to output a signal at H-level to the other terminal of NAND gate 5344. NAND gate 5344 performs logical AND between the signal at H-level applied from inverter 5341 and the signal at H-level applied from inverter 5345, and outputs a signal at L-level prepared by inverting a result of the AND operation to one of terminals of each of NAND gates 5347 and 5348.

Inverter 5346 inverts signal MX32Row at L-level to output a signal at H-level to the other terminal of NAND gate 5347. NAND gate 5347 performs logical AND between the signal at L-level applied from N- and P-channel MOS transistors 5342 and 5343 and NAND gate 5344 and the signal at H-level applied from inverter 5346, and outputs a signal at H-level prepared by inverting a result of the operation to one of the terminals of NAND gate 5350.

NAND gate 5348 performs logical AND between the signal at L-level applied from N- and P-channel MOS transistors 5342 and 5343 and NAND gate 5344, and signal RADenable at H-level applied from row address control circuit 27A, and outputs a signal at H-level prepared by inverting a result of the operation to inverter 5349. Inverter 5349 outputs signal RAD<11> at L-level prepared by inverting the signal at H-level to word line driver 535.

NAND gate 5350 performs logical AND between the signal at H-level applied from NAND gate 5347 and signal RADenable at H-level, and outputs a signal at L-level prepared by inverting a result of the operation to inverter

5351. Inverter 5351 outputs signal /RAD<11> at H-level prepared by inverting the signal at L-level to word line driver 535.

Accordingly, when highest order bit RA<11> of the row address is at L-level, signal RAD<11> at L-level and signal /RAD<11> at H-level are output to word line driver 535.

Then, description will be given on the case where highest bit RA<11> of the row address is at H-level. In this case, inverter 5345 inverts the signal at H-level to output a signal at L-level to the other terminal of NAND gate 5344. NAND gate 5344 performs logical AND between the signal at H-level applied from inverter 5341 and the signal at H-level applied from inverter 5345, and outputs a signal at H-level prepared by inverting a result of the operation to one of the terminals of each of NAND gates 5347 and 5348.

Inverter 5346 inverts signal MX32Row at L-level, and outputs a signal at H-level to the other terminal of NAND gate 5347. NAND gate 5347 performs logical AND between the signal at H-level applied from N- and P-channel MOS transistors 5342 and 5343 and NAND gate 5344, and the signal at H-level applied from inverter 5346, and outputs a signal at L-level prepared by inverting a result of the operation to one of the terminals of NAND gate 5350.

NAND gate 5348 performs logical AND between the signal at H-level applied from N- and P-channel MOS transistors 5342 and 5343 and NAND gate 5344, and signal RADenable at H-level applied from row address control circuit 27A, and outputs a signal at L-level prepared by inverting a result of the operation to inverter 5349. Inverter 5349 inverts the signal at L-level to output signal RAD<11> at H-level to word line driver 535.

NAND gate 5350 performs logical AND between the signal at L-level applied from NAND gate 5347 and signal RADenable at H-level, and outputs a signal at H-level prepared by inverting a result of the operation to inverter 5351. Inverter 5351 inverts the signal at H-level to output signal /RAD<11> at L-level to word line driver 535.

Accordingly, when highest bit RA<11> of the row address is at H-level, signal RAD<11> at H-level and signal /RAD<11> at L-level are output to word line driver 535.

Word line driver 535 selects regions 55 and 57 in bank 531 in accordance with signal RAD<11> at H-level and signal /RAD<11> at L-level, and activates the word line, which is designated by the row address applied from row decoder 534, in each of regions 55 and 57. Thereby, data of 8 bits is input/output as a higher byte to or from region 57, and data of 8 bits is input/output as a lower byte to or from region 55 so that data of 16 bits in total is input/output.

Word line driver 535 selects regions 54 and 56 in bank 531 in accordance with signal RAD<11> at L-level and signal /RAD<11> at H-level, and activates the word line, which is designated by the row address applied from row decoder 534, in each of regions 54 and 56. Thereby, data of 8 bits is input/output as a higher byte to or from region 56, and data of 8 bits is input/output as a lower byte to or from region 54 so that data of 16 bits in total is input/output.

As described above, when semiconductor memory device 150 is to be operated as the semiconductor memory device having the word structure of "×16", switching is performed by highest bit RA<11> of the row address to select regions 54 and 56, or regions 55 and 57 in bank 531 for input/output of the data of 16 bits.

When semiconductor memory device 150 is to be operated as the semiconductor memory device having the word structure of "×32", latch circuit 5340 receives signal MX32Row at H-level, signal RADenable at H-level and highest bit RA<11> of the row address from row address control circuit 27A.

Thereby, inverter 5341 inverts signal MX32Row at H-level, and applies the signal at L-level to the gate terminal of N-channel MOS transistor 5342 and one of the terminals of NAND gate 5344. P-channel MOS transistor 5343 receives signal MX32Row at H-level on its gate terminal. Therefore, N- and P-channel MOS transistors 5342 and 5343 are turned off, and highest bit RA<11> of the row address is not latched by latch circuit 5340.

NAND gate 5344 necessarily outputs the signal at H-level to one of terminals of each of NAND gates 5347 and 5348 based on the signal at L-level applied from inverter 5341. Inverter 5346 inverts signal MX32Row at H-level to output a signal at L-level to the other terminal of NAND gate 5347. NAND gate 5347 performs logical AND between the signal at H-level applied from NAND gate 5344 and the signal at L-level applied from inverter 5346, and outputs a signal at H-level prepared by inverting a result of the operation to one of the terminals of NAND gate 5350.

NAND gate 5348 performs logical AND between the signal at H-level applied from NAND gate 5344 and signal RADenable at H-level applied from row address control circuit 27A, and outputs a signal at L-level prepared by inverting a result of the operation to inverter 5349. Inverter 5349 inverts the signal at L-level to output signal RAD<11> at H-level to word line driver 535.

NAND gate 5350 performs logical AND between the signal at H-level applied from NAND gate 5347 and signal RADenable at H-level, and outputs a signal at L-level prepared by inverting a result of the operation to inverter 5351. Inverter 5351 inverts the signal at L-level to output signal /RAD<11> at H-level to word line driver 535.

Word line driver 535 selects all regions 54–57 in bank 531 in accordance with signals RAD<11> and /RAD<11> at H-level, activates the word line, which is designated by the row address applied from row decoder 534, in each of regions 54–57. Thereby, data of 16 bits are input/output as a higher byte to and from regions 56 and 57, and data of 16 bits are input/output as a lower byte to and from regions 54 and 55 so that data of 32 bits in total is input/output.

As described above, when semiconductor memory device 150 is to be operated as the semiconductor memory device having the word structure of "×32", all regions 54–57 in bank 531 are selected to input/output data of 32 bits.

Description has been given on the operation in one bank for inputting and outputting data of 16 bits and data of 32 bits in accordance with the word structure of semiconductor memory device 150 switched between "×16" and "×32". In the other banks, operations similar to those already described are performed to input and output data of 16 bits and data of 32 bits in accordance with the selected word structure.

The word structure to be selected is not restricted to "×16" and "×32", and other word structures may be employed. Further, the number of word structures to be selected is not restricted to two, and may be three or more.

According to the sixth embodiment, the semiconductor memory device includes the latch circuit, which produces the signals for selecting the four regions forming the bank in accordance with the word structure. Therefore, data of the bits, of which number corresponds to the selected word structure, can be input and output. As a result, it is possible to produce the semiconductor memory device, which allows adaptation of only one kind to a plurality of word structures.

Seventh Embodiment

A semiconductor memory device of a seventh embodiment is the same as semiconductor memory device 150 already described. The seventh embodiment relates to a refresh operation in the case where semiconductor memory device 150 is to be operated as the semiconductor memory device having the word structure of "×32".

For performing the refresh operation in semiconductor memory device 150 functioning as the semiconductor memory device having the word structure of "×32", signal MX32 at H-level and refresh signal REF at H-level are input to semiconductor memory device 150.

Thereby, signal generating circuit 271 included in row address control circuit 27A outputs signal MX32Row at L-level to latch circuit 5340 of row decoder 534 based on signal MX32 at H-level and refresh signal REF at H-level.

Row address control signal 27A outputs signal RADenable at H-level and highest bit RA<11> of the row address to latch circuit 5340, and outputs the row address to row decoder 534.

Latch circuit 5340 latches highest bit RA<11> of the row address based on signal MX32Row at L-level and signal RADenable at H-level, as already described, and selectively outputs a combination of signal RAD<11> at H-level and signal /RAD<11> at L-level and a combination of signal RAD<11> at L-level and signal /RAD<11> at H-level to word line driver 535 in accordance with the logical level of highest bit RA<11>.

Thereby, word line driver 535 selects regions 54 and 56 or regions 55 and 57 in bank 531, and activates the two word lines in the selected two regions, as already described.

Accordingly, when semiconductor memory device 150 with the word structure of "×32" is to be refreshed, the refresh operation is performed while handling semiconductor memory device 150 as a semiconductor memory device having a word structure of "×16". This is because the specifications of the semiconductor memory device having the word structure of "×32" define that, in the refresh operation, two word lines are to be enabled similarly to the case of the word structure of "×16".

According to the seventh embodiment, the semiconductor memory device includes the latch circuit, which produces a signal for selecting two regions from the four regions forming the bank in the refresh operation of the semiconductor memory device having the word structure of "×32". In the refresh operation, the semiconductor memory device of the word structure of "×32" can function as the semiconductor memory device having the word structure of "×16".

Eighth Embodiment

A semiconductor memory device according to an eighth embodiment can be represented by the same block diagram as semiconductor memory device 150. In the eighth embodiment, row address control circuit 27A further includes an address counter 272 shown in FIG. 16.

Figure 16:
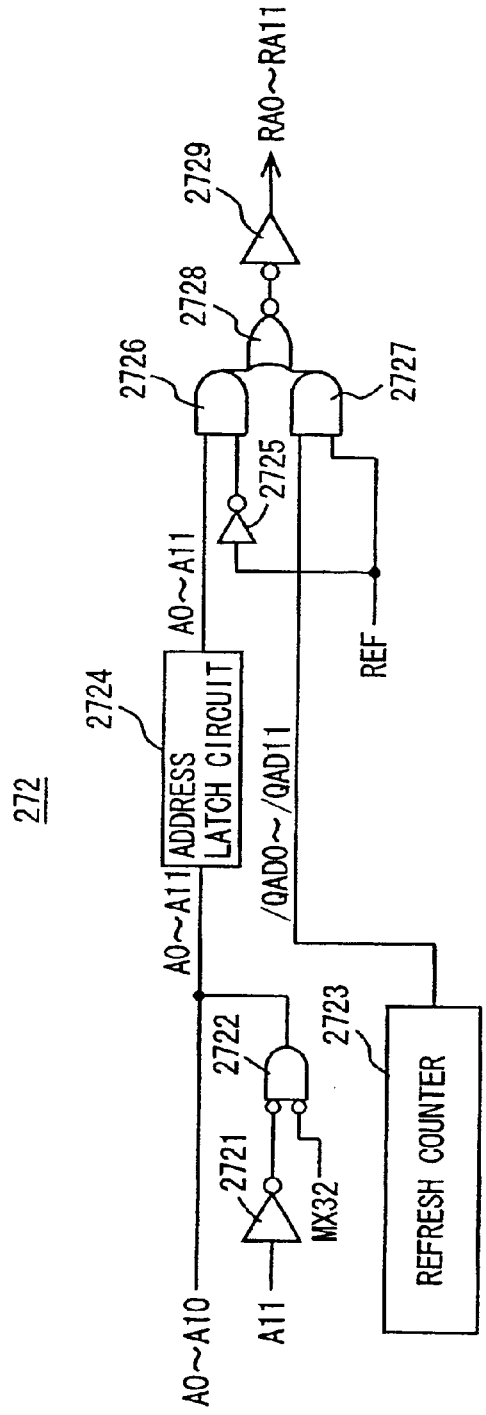
FIG. 16 is a circuit diagram of an address counter included in a row address control circuit shown in FIG. 11 and included in the eighth embodiment.

Referring to FIG. 16, address counter 272 is formed of inverters 2721, 2725 and 2729, a NAND gate 2722, a refresh counter 2723, an address latch circuit 2724, AND gates 2726 and 2727, and a NOR gate 2728.

Inverter 2721 inverts the logical level of highest address A11 among addresses A0–A11 applied from row address buffer 30, and outputs the same to one of terminals of NAND gate 2722. NAND gate 2722 performs logical AND between a signal prepared by inverting the output signal of inverter 2721 and a signal prepared by inverting signal MX32, and outputs the same to address latch circuit 2724. When semiconductor memory device 150 is to be operated as the semiconductor memory device having the word structure of "×16", signal MX32 at L-level is input so that NAND gate 2722 outputs address A11, which is input to inverter 2721, to address latch circuit 2724 as it is. When semiconductor memory device 150 is to be operated as the semiconductor memory device having the word structure of "×32", signal MX32 at H-level is applied so that NAND gate 2722 outputs address A11 at L-level to address latch circuit 2724 regardless of the logical level of address A11 applied to inverter 2721.

This is for the following reason. When semiconductor memory device 150 is to be operated as the semiconductor memory device having the word structure of "×16", it is necessary to divide four regions 54–57 into a group of regions 54 and 56 and a group of regions 55 and 57 in accordance with the logical level of highest address A11 (indicated by "RA<11>" in the above description) among addresses A0–A11 for selectively activating the region groups, as already described. Therefore, row address control circuit 27A must output address A11 to latch circuit 5340 of row decoder 534 while holding the logical level of externally applied address A11.

When semiconductor memory device 150 is to be operated as the semiconductor memory device having the word structure of "×32", all four regions 54–57 are selected regardless of the logical level of highest address A11 (indicated by "RA<11>" in the above description) among addresses A0–A11, as already described. Therefore, row address control circuit 27A can output address A11, which is externally applied, to latch circuit 5340 of row decoder 534 without holding the logical level of address A11.

Address latch circuit 2724 latches addresses A0–A11, which are a sum of addresses A0–A10 applied from row address buffer 30 and address A11 applied from NAND gate 2722, and outputs latched addresses A0–A11 to one of the terminals of AND gate 2726.

In the refresh operation of semiconductor memory device 150, refresh counter 2723 counts the address, and outputs addresses /QAD0–/QAD11 thus counted to one of the terminals of AND gate 2727.

Inverter 2725 inverts refresh signal REF to output the same to the other terminal of AND gate 2726. AND gate 2726 performs logical AND between addresses A0–A11 applied from address latch circuit 2724 and the output signal of inverter 2725, and outputs a result of the operation to one of the terminals of NOR gate 2728. AND gate 2727 performs logical AND between addresses /QAD0–/QAD11 applied from refresh counter 2723 and refresh signal REF, and outputs a result of the operation to the other terminal of NOR gate 2728.

NOR gate 2728 performs logical OR between the output signals of AND gates 2726 and 2727, and outputs a signal prepared by inverting a result of the operation to inverter 2729. Inverter 2729 inverts the output signal of NOR gate 2728, and outputs row address RA0–RA11 to row decoder 534.

In the normal operation of semiconductor memory device 150, refresh signal REF at L-level is applied so that AND gate 2727 outputs a signal at L-level to the other terminal of NOR gate 2728 regardless of the logical level of addresses /QAD0–/QAD11.

Since AND gate 2726 receives the signal at H-level from inverter 2725, AND gate 2726 outputs addresses A0–A11 applied from address latch circuit 2724 to one of the terminals of NOR gate 2728. Thereby, NOR gate 2728 outputs signals /A0–/A11, which are prepared by inverting addresses A0–A11 applied from AND gate 2726, to inverter 2729, and inverter 2729 outputs addresses A0–A11, which are prepared by inverting signals /A0–/A11, as row address RA0–RA11 to row decoder 534.

In the refresh operation of semiconductor memory device 150, refresh signal REF at H-level is applied so that AND gate 2726 receives a signal at L-level from inverter 2725. Thereby, AND gate 2726 outputs the signal at L-level to one of the terminals of NOR gate 2728 regardless of the logical level of addresses A0–A11 applied from address latch circuit 2724.

AND gate 2727 receives refresh signal REF at H-level on the other terminal so that it outputs addresses /QAD0–/QAD11 received refresh counter 2723 to the other terminal of NOR gate 2728. NOR gate 2728 inverts addresses /QAD0–/QAD11 applied from AND gate 2727, and outputs signals QAD0–QAD11 thus prepared to inverter 2729. Inverter 2729 inverts signals QAD0–QAD11 to output addresses /QAD0–/QAD11, as row address RA0–RA11, to row decoder 534.

Therefore, address counter 272 outputs externally applied addresses A0–A11 as row address RA0–RA11 to row decoder 534 in the normal operation, and outputs addresses /QAD0–/QAD11 counted by refresh counter 2723 as row address RA0–RA11 to row decoder 534 in the refresh operation. As a result, refresh counter 2723 can be used as a counter, which is common to the word structure of "×16" and the word structure of "×32".

In the above description, the highest address is represented as address RA11. This is by way of example. If a row address space of the semiconductor memory device increases, the highest address of the increased row address is used for performing the control described above.

Structures and operations other than the above are the same as those of the sixth and seventh embodiments.

According to the eighth embodiment, the semiconductor memory device includes the address counter, which outputs as the row address the address counted by one counter in the refresh operation of the semiconductor memory device having the word structure of "×16" and in the refresh operation of the semiconductor memory device having the word structure of "×32". Therefore, one counter can be used commonly to the cases using different word structures, respectively.

Ninth Embodiment

Figure 17:
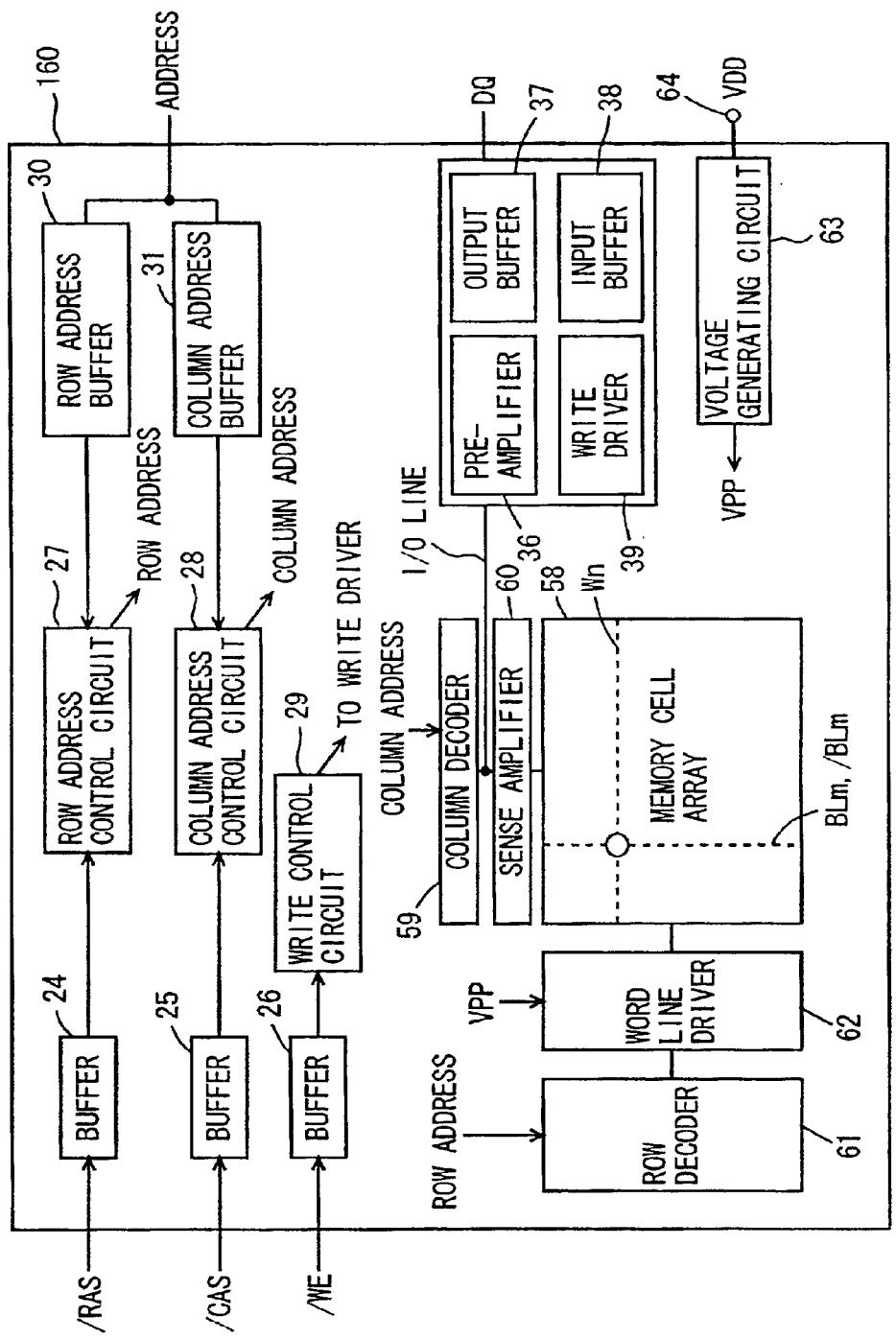
FIG. 17 is a schematic block diagram of a semiconductor memory device of a ninth embodiment.

Referring to FIG. 17, a semiconductor memory device 160 of a ninth embodiment includes buffers 24–26, row address control circuit 27, column address control circuit 28, row address buffer 30, column address buffer 31, write control circuit 29, preamplifier 36, output buffer 37, input buffer 38, write driver 39, a memory cell array 58, a column decoder 59, a sense amplifier 60, a row decoder 61, a word line driver 62, a voltage generating circuit 63 and a terminal 64.

Buffers 24–26, row address control circuit 27, column address control circuit 28, row address buffer 30, column address buffer 31, write control circuit 29, preamplifier 36, output buffer 37, input buffer 38 and write driver 39 are the same as those already described.

Memory cell array 58 includes a plurality of memory cells arranged in rows and columns, a plurality of bit line pairs BLm and /BLm, a plurality of equalize circuits arranged corresponding to the plurality of bit line pairs BLm and /BLm, respectively, and a plurality of word lines Wn.

Column decoder 59 decodes the column address applied from column address control circuit 28, and activates the bit line pair designated by the column address thus decoded. Sense amplifier 60 writes write data onto the bit line pair activated by column decoder 59, or outputs read data from the bit line pair activated by column decoder 59 to preamplifier 36 through the I/O line.

Row decoder 61 decodes the row address applied from row address control circuit 27, and outputs the decoded row address to word line driver 62. Word line driver 62 outputs internal voltage VPP supplied from voltage generating circuit 63 to the word line, which is designated by the row address applied from row decoder 61, and thereby activates the word line designated by the row address.

Voltage generating circuit 63 boosts power supply voltage VDD supplied from terminal 64 to generate and supply internal voltage VPP to word line driver 62. Voltage generating circuit 63 includes a pump capacitor for boosting power supply voltage VDD to internal voltage VPP.

Figure 18:
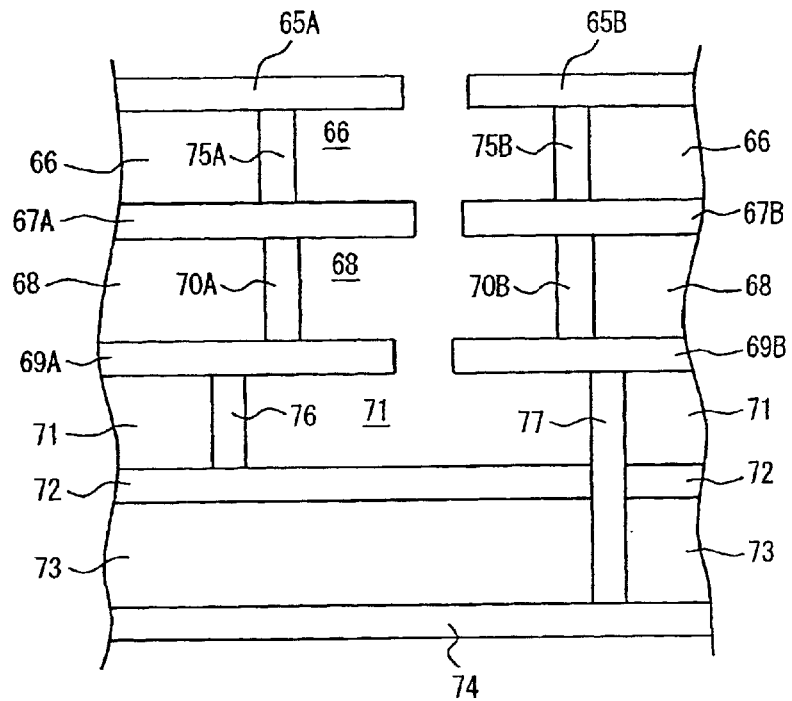
FIG. 18 is a cross section of a region including a pump capacitor.

Referring to FIG. 18, description will now be given on the pump capacitor included in voltage generating circuit 63. FIG. 18 shows a sectional structure of a portion including voltage generating circuit 63 of semiconductor memory device 160. Voltage generating circuit 63 includes a field diffusion layer 74, an insulating layer 73, a transfer gate 72, an insulating layer 71, bit lines 69A and 69B, an insulating layer 68, first-layer aluminum interconnections 67A and 67B, an insulating layer 66 and second-layer aluminum interconnections 65A and 65B, which are layered in this order so that field diffusion layer 74 is located at the lowest layer, and aluminum interconnections 65A and 65B are located at the highest layer.

Aluminum interconnection 65A is connected to aluminum interconnection 67A through a contact hole 75A. Aluminum interconnection 65B is connected to aluminum interconnection 67B through a contact hole 75B. Aluminum interconnection 67A is connected to bit line 69A through a contact hole 70A. Aluminum interconnection 67B is connected to bit line 69B through a contact hole 70B. Bit line 69A is connected to transfer gate 72 through a contact hole 76. Bit line 69B is connected to field diffusion layer 74 through a through-hole 77.

Transfer gate 72, insulating layer 73 and field diffusion layer 74 form a pump capacitor. Therefore, internal voltage VPP boosted by a bootstrap effect of the delay circuit and pump capacitor is generated across the opposite electrodes of the pump capacitor, and internal voltage VPP thus generated is transmitted to aluminum interconnections 65A and 65B through contact hole 76, through-hole 77, bit lines 69A and 69B, contact holes 70A and 70B, aluminum interconnections 67A and 67B, and contact holes 75A and 75B, and is supplied to word line driver 62 from aluminum interconnections 65A and 65B.

Figure 19:
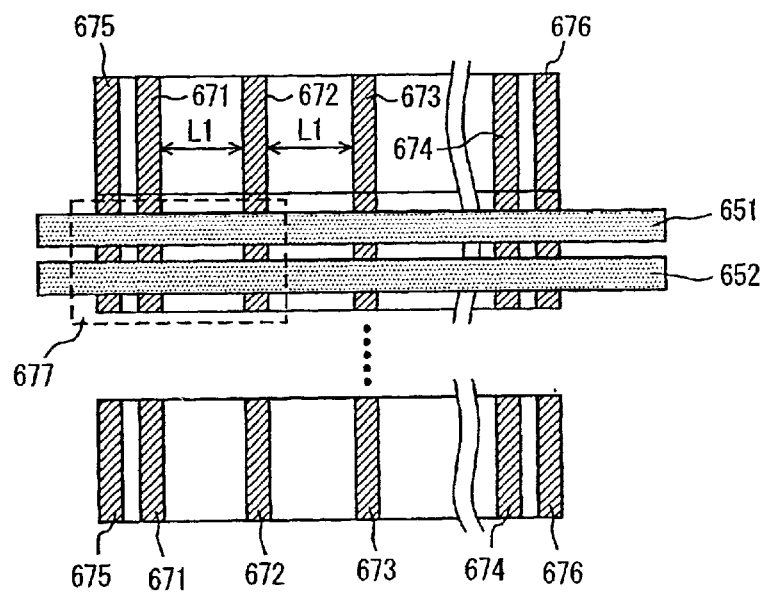
FIG. 19 is a plan of the region including the pump capacitor.

FIG. 19 is a plan of the region including the pump capacitor viewed from the side of the aluminum interconnections at the second layer. Aluminum interconnections 671–674 at the first layer are formed as interconnections connected to field diffusion layer 74, and are spaced by a predetermined distance L1 from each other. Aluminum interconnections 675 and 676 at the first layer are formed as interconnections connected to transfer gate 72. Aluminum interconnections 651 and 652 at the second layer are formed perpendicularly to aluminum interconnections 671–676 at the first layer.

In the ninth embodiment, therefore, the pump capacitor is formed such that the longer side of the pump capacitor is parallel to aluminum interconnections 651 and 652 at the second layer. Accordingly, aluminum interconnections 671–674 connected to field diffusion layer 74 are spaced from each other by wider distance L1 than those in a conventional structure so that it is possible to increase the number of other interconnections disposed, e.g., between aluminum interconnections 671 and 672, and between aluminum interconnections 672 and 673.

Figure 20:
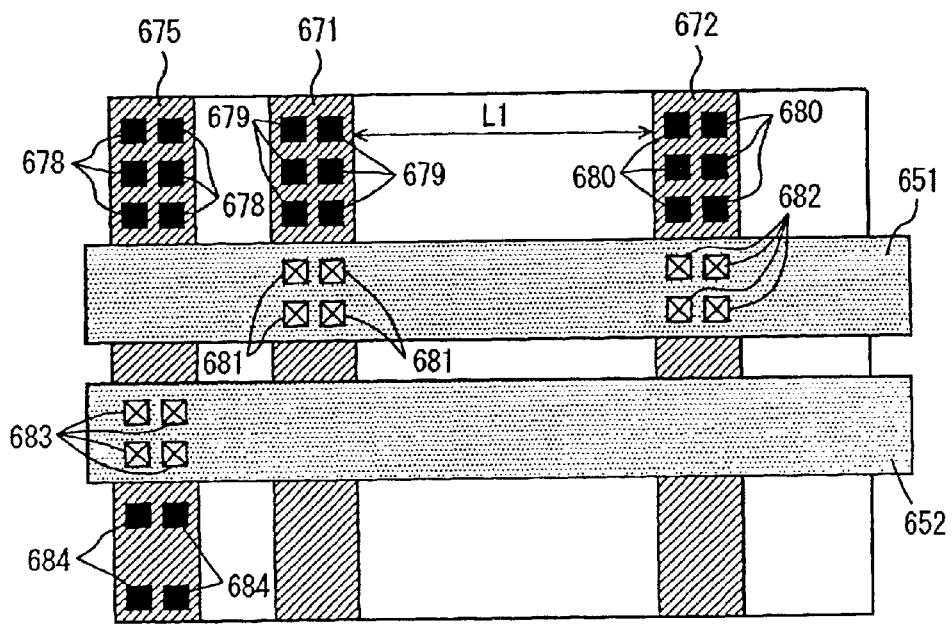
FIG. 20 shows, on an enlarged scale, a portion of the region shown in FIG. 19.

FIG. 20 shows, on an enlarged scale, a region 677 in FIG. 19. Aluminum interconnections 671 and 672 at the first layer are connected to the bit line through contact holes 679 and 680s, and are connected to aluminum interconnection 651 at the second layer through contact holes 681 and 682s.

Aluminum interconnection 675 at the first layer is connected to the bit lines through contact holes 678 and 684s, and is connected to aluminum interconnection 652 at the second layer through contact holes 683.

By reducing widths of aluminum interconnections 671, 672 and 675 at the first layer, resistances thereof may increase. However, by increasing contact holes 678–680 and 684, it is possible to suppress the above increase in resistance due to reduction in interconnection width. Accordingly, reduction in widths of aluminum interconnections 671, 672 and 675 at the first layer does not significantly increase the resistance, and the advantage achieved by increasing the contact holes outweighs the disadvantage due to the reduction in width. As a result, even if the interconnection widths of aluminum interconnections 671, 672 and 675 at the first layer are reduced to an extent allowing formation of contact holes 678–684 equal in number to contact holes in a conventional structure, the resistances of aluminum interconnections 671, 672 and 675 do not significantly increase, and it is possible to achieve substantially the advantage that space L1 between aluminum interconnections 671 and 672 can be further increased.

Figure 47:
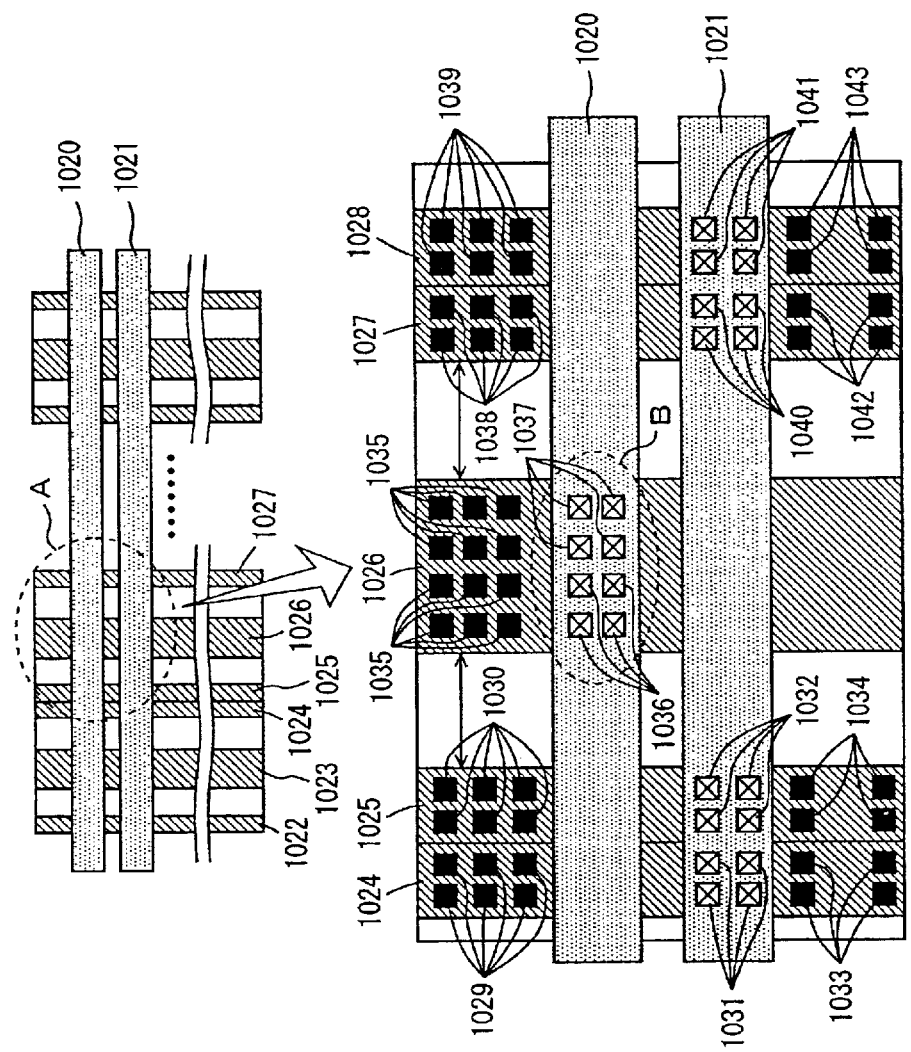
FIG. 47 is a plan of a region including a pump capacitor in the conventional semiconductor memory device.

As described above, even if the distance L1 between aluminum interconnections 671 and 672 at the first layer is wider than that in the conventional structure, the number of contact holes 678–684 is the same as those in the conventional structure (see FIG. 47), and other interconnections more than those in the conventional structure can be disposed between aluminum interconnections 671–676 while suppressing increase in resistance of aluminum interconnections 671, 672 and 675.

Figure 21:
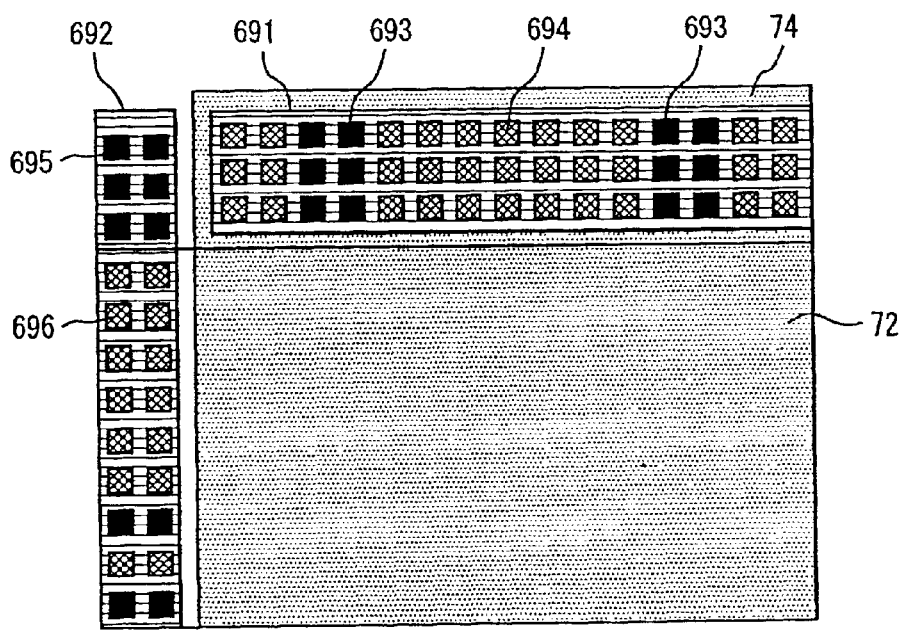
FIG. 21 is a plan of a certain pump capacitor.
Figure 48:
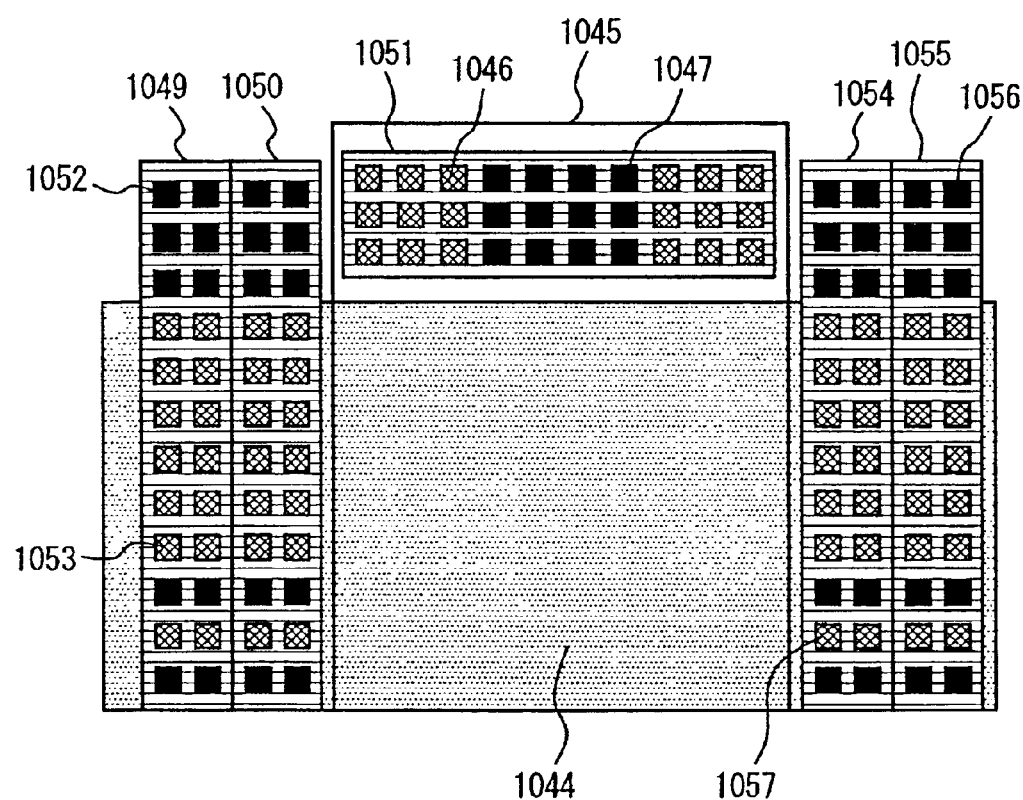
FIG. 48 is a plan of a certain pump capacitor.
Figure 49:
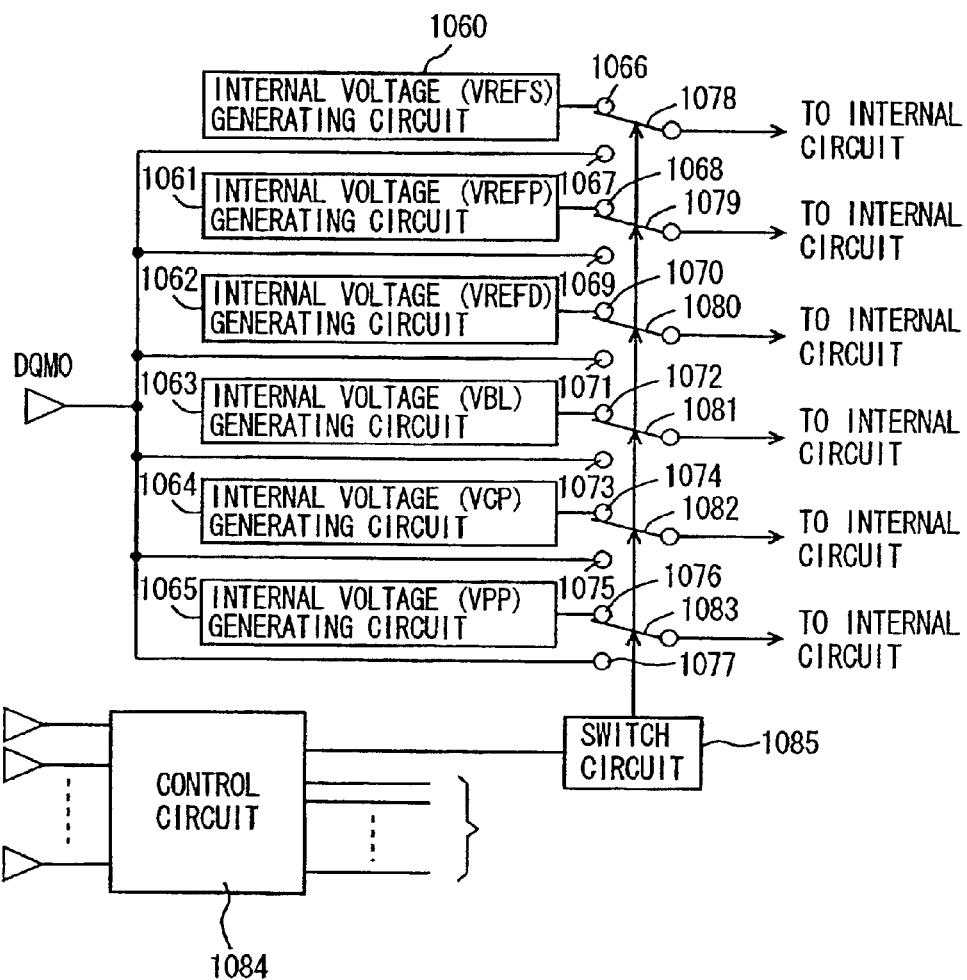
FIG. 49 is a schematic block diagram of an internal voltage generating circuit and a control circuit in the conventional semiconductor memory device.
Figure 50:
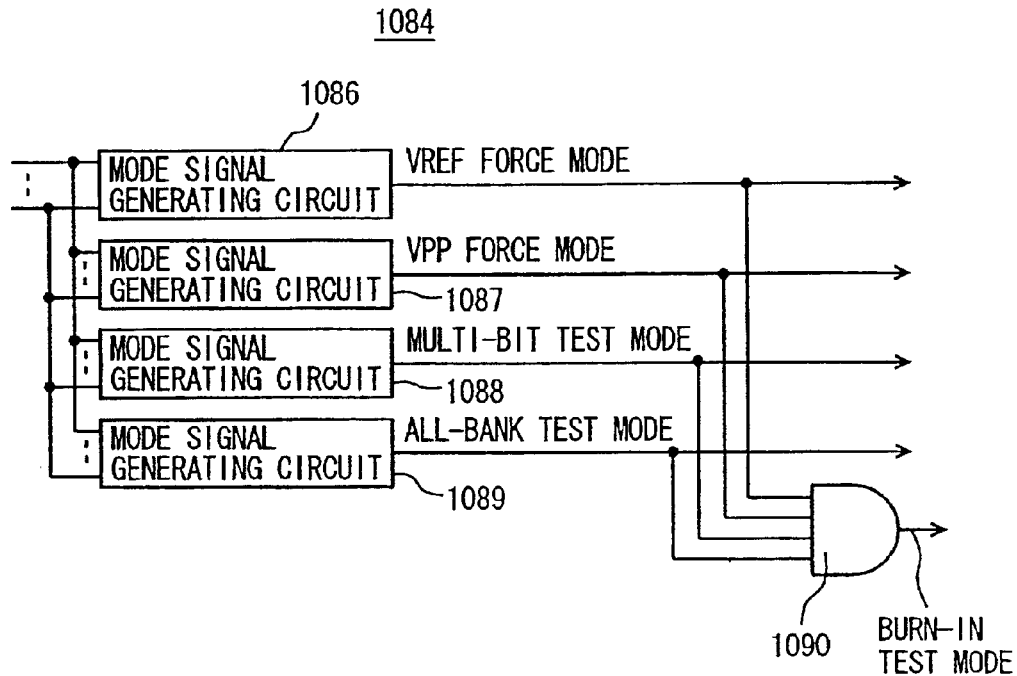
FIG. 50 is a schematic block diagram of a control circuit shown in FIG. 49.
Figure 51:
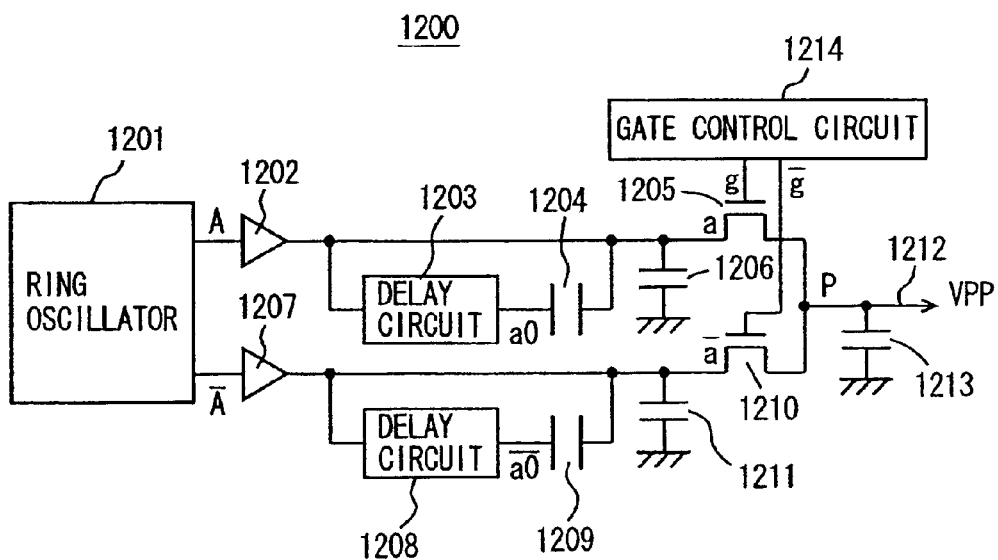
FIG. 51 is a circuit diagram of a pump circuit boosting a power supply voltage in the conventional semiconductor memory device.
Figure 52:
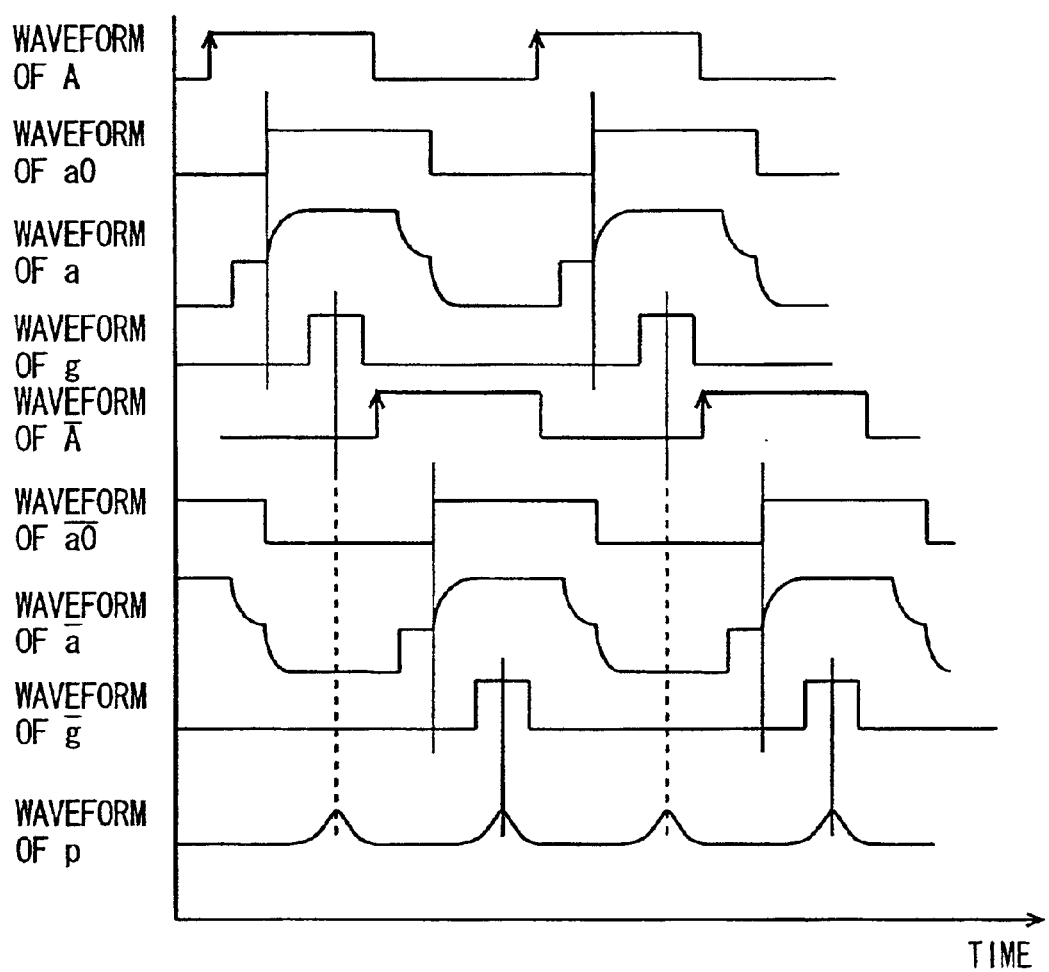
FIG. 52 is a timing chart of signals for representing an operation of generating an internal voltage by the pump circuit shown in FIG. 51.

FIG. 21 shows one of the pump capacitors. Transfer gate 72 and field diffusion layer 74 partially overlap with each other, bit line 691 is formed on field diffusion layer 74, and bit line 692 is formed on transfer gate 72. Although the longer side of the pump capacitor in this invention is parallel to the aluminum interconnections at the second layer, contact holes 693–696 do not change in number (see FIG. 48).

Figure 22:
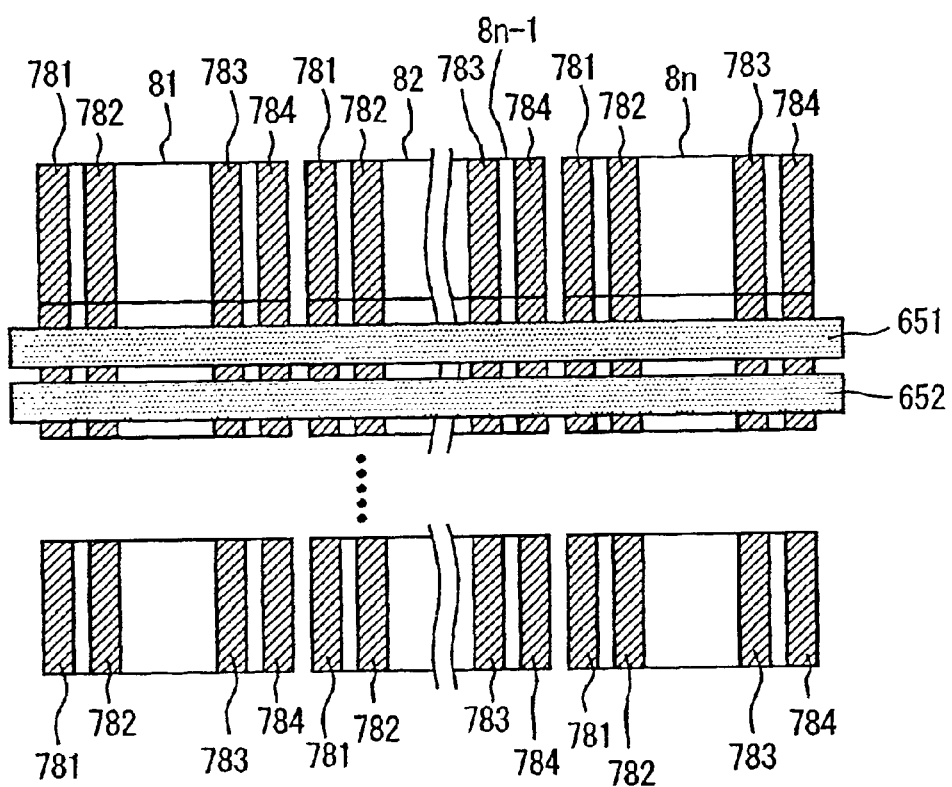
FIG. 22 is a plan of a pump capacitor formed of a plurality of capacitors.

In the ninth embodiment, the pump capacitor may be formed of a plurality of capacitors connected in parallel. As shown in FIG. 22, a pump capacitor is formed of capacitors 81–8n. Each of capacitors 81–8n includes aluminum interconnections 781–784 at the first layer. Aluminum interconnections 781 and 784 are connected to transfer gate 72, and aluminum interconnections 782 and 783 are connected to field diffusion layer 74.

Since the pump capacitor is formed of the plurality of capacitors 81–8n, the size of pump capacitor can be adjusted stepwise. However, the number of capacitors is substantially determined not to cause such a situation that the space between aluminum interconnections 781–784 is narrower than that in the conventional structure due to increase in number of aluminum interconnections 781 and 784 provided at the first layer 1 for supplying the potential to transfer gate 72.

According to the ninth embodiment, the pump capacitor, which generates internal voltage VPP by boosting power supply voltage VDD, is disposed such that the longer side thereof is parallel to the aluminum interconnections at the second layer. Therefore, the space between the aluminum interconnections at the first layer can be wider than that in the conventional structure. Consequently, it is possible to increase the number of other interconnections disposed in empty regions not occupied by the aluminum interconnections at the first layer.

According to the ninth embodiment of the invention, since the pump capacitor is formed of a plurality of capacitors connected in parallel, the size of pump capacitor can be adjusted stepwise. Since the aluminum interconnections at the first layer are larger in number than those in the prior art, paths of the aluminum interconnections at the second layer can be easily changed.

Tenth Embodiment

Figure 23:
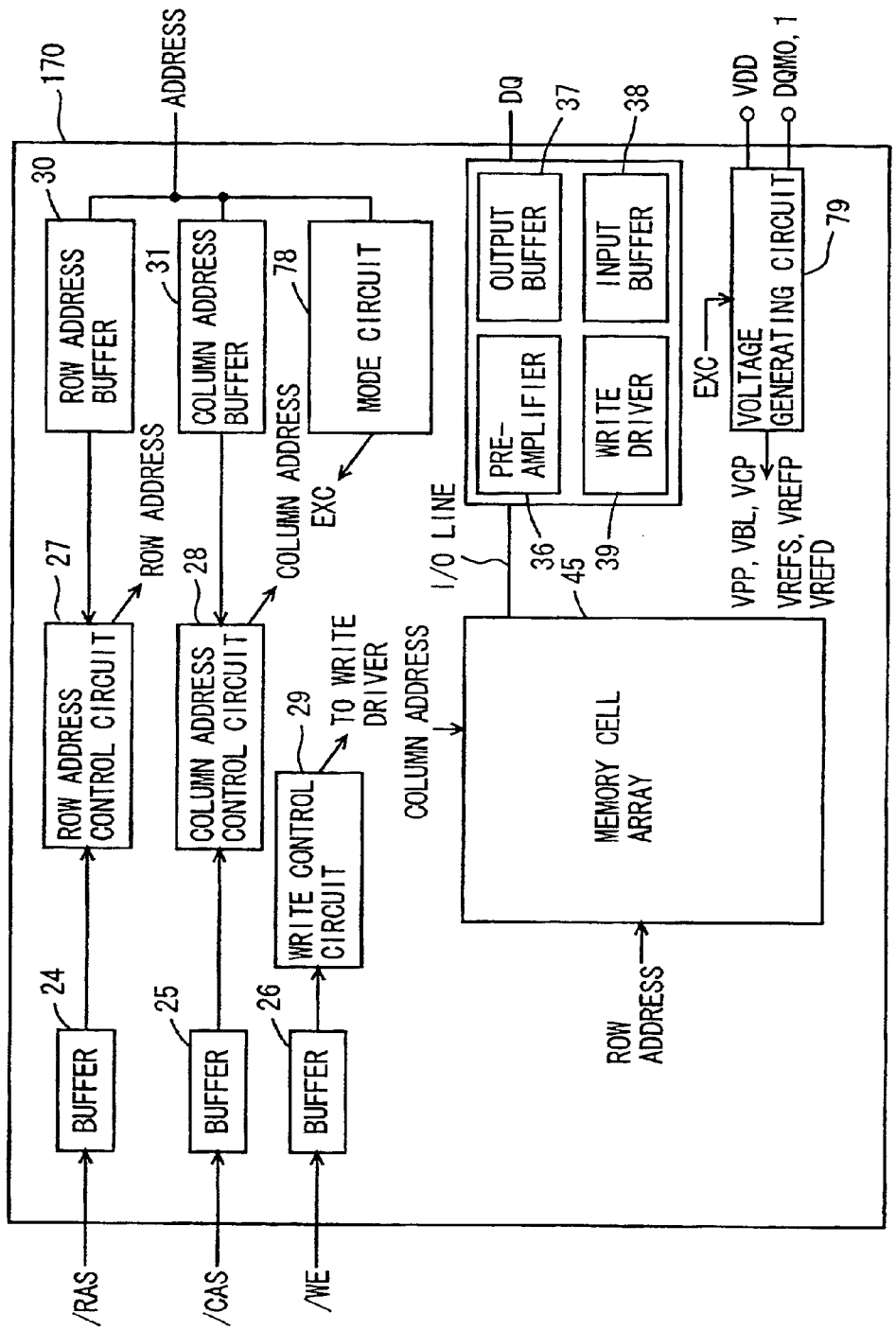
FIG. 23 is a schematic block diagram of a semiconductor memory device of a tenth embodiment.

Referring to FIG. 23, a semiconductor memory device 170 of a tenth embodiment differs from semiconductor memory device 130 in that buffers 46 and timing control circuit 47 of semiconductor memory device 130 are replaced with a mode circuit 78, voltage generating circuit 40 is replaced with a voltage generating circuit 79, and power supply voltage switch circuit 41 and pad 42 are eliminated. Structures other than the above are the same as those of semiconductor memory device 130. Mode circuit 78 produces VREF force mode signal, VPP force mode signal, multi-bit test mode signal, all-bank test mode signal and burn-in test mode signal based on an externally applied address. Mode circuit 78 outputs a switch signal EXC to voltage generating circuit 79 when the burn-in test mode signal is produced.

Voltage generating circuit 79 generates internal voltages VPP, VBL, VCP, VREFS, VREFP and VREFD based on externally applied power supply voltage VDD. When switch signal EXC applied from mode circuit 78 is at L-level, voltage generating circuit 79 supplies internal voltage VPP generated thereby to the word line driver included in memory cell array 45, supplies internal voltage VBL generated thereby to the plurality of equalize circuits included in memory cell array 45, supplies internal voltage VCP generated thereby to cell plate electrodes of the plurality of memory cells included in memory cell array 45, and supplies internal voltages VREFS, VREFP and VREFD generated thereby to the internal circuits requiring reference voltages.

When voltage generating circuit 79 receives switch signal EXC at H-level from mode circuit 78, it supplies the voltages, which are supplied from terminals for data mask signals DQM0 and DQM1, to the internal circuits such as a word line driver instead of internal voltages VPP, VBL, VREFS, VREFP and VREFD generated thereby.

Figure 24:
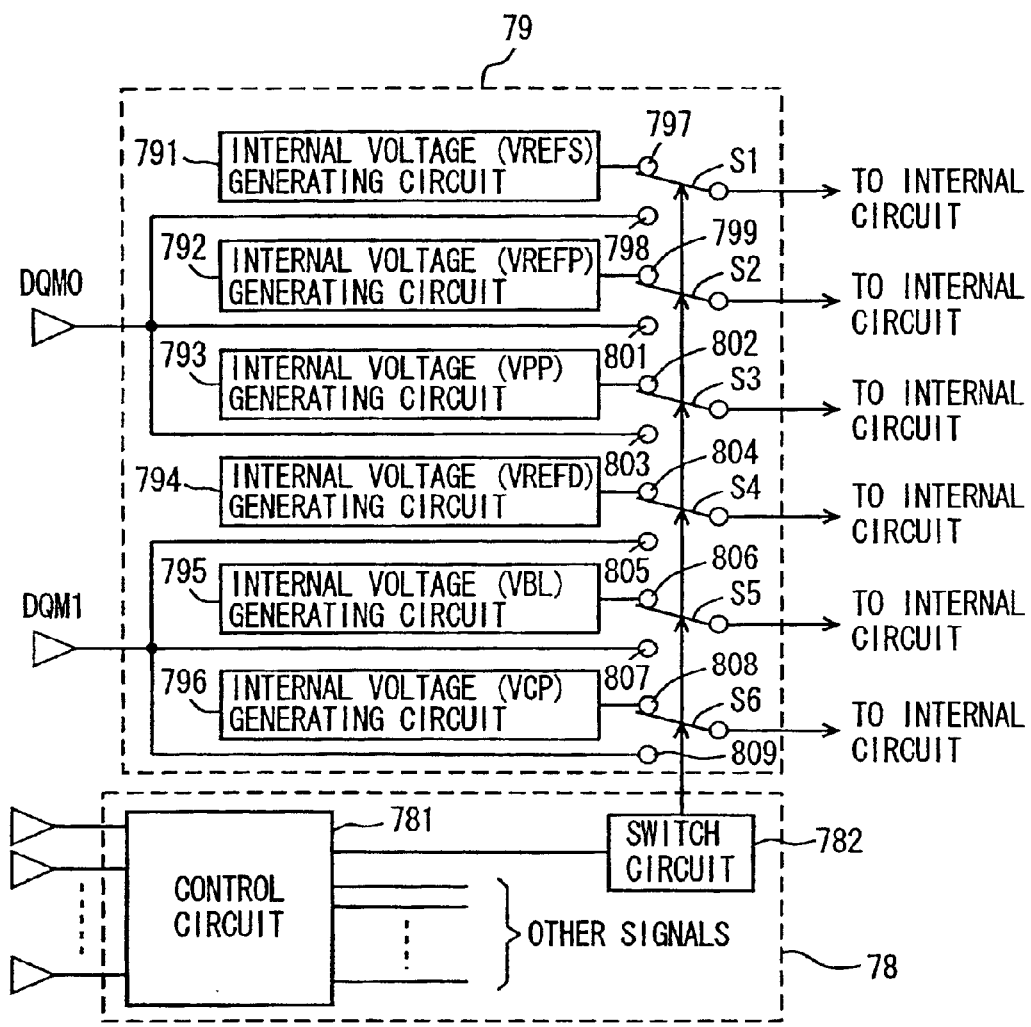
FIG. 24 is a schematic block diagram of a control circuit and a voltage generating circuit shown in FIG. 23.

Referring to FIG. 24, mode circuit 78 includes a control circuit 781 and a switch circuit 782. Control circuit 781 generates VREF force mode signal, VPP force mode signal, multi-bit test mode signal, all-bank test mode signal and burn-in test mode signal independently of each other based on the externally applied address in a manner, which will be described later, and outputs the generated burn-in test mode signal to switch circuit 782. Control circuit 781 outputs the mode signals other than the burn-in test mode signal to various portions in semiconductor memory device 170.

Switch circuit 782 receives the burn-in test mode signal from control circuit 781, and generates switch signal EXC at H-level when the burn-in test mode signal is at H-level. When the burn-in test mode signal is at L-level, switch circuit 782 generates switch signal EXC at L-level. Switch circuit 782 outputs switch signal EXC thus generated to voltage generating circuit 79.

Voltage generating circuit 79 includes internal voltage generating circuits 791–796, terminals 797–799 and 801–809, and switches S1–S6. Internal voltage generating circuits 791–796 generate and output internal voltages VREFS, VREFP, VPP, VREFD, VBL and VCP to terminals 797, 799, 802, 804, 806 and 808, respectively. Terminals 798, 801 and 803 are supplied with a voltage from the terminal for data mask signal DQM0, and terminals 805, 807 and 809 are supplied with a voltage from the terminal for data mask signal DQM1.

When switches S1–S6 receive switch signal EXC at L-level from switch circuit 782, these switches S1–S6 are connected to terminals 797, 799, 802, 804, 806 and 808, respectively. When switches S1–S6 receive switch signal EXC at H-level, these switches S1–S6 are connected to terminals 798, 801, 803, 805, 807 and 809, respectively.

Figure 25:
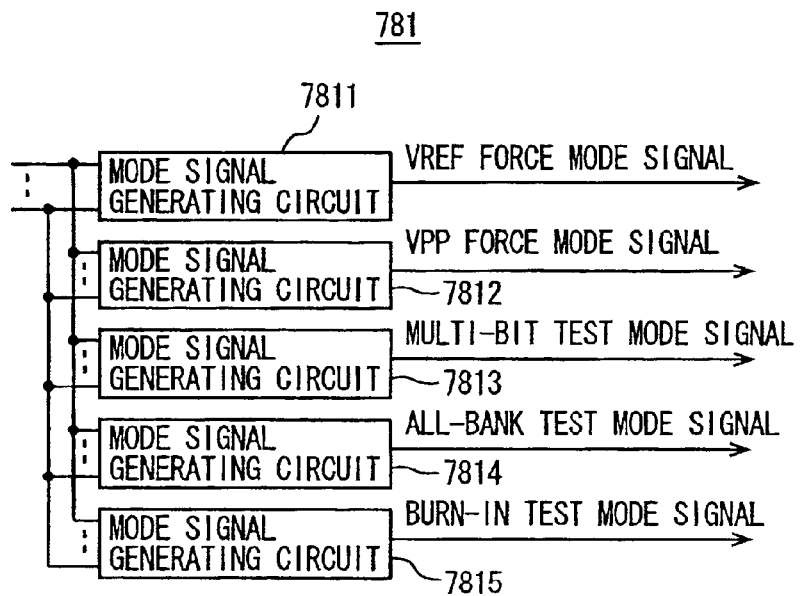
FIG. 25 is a schematic block diagram of the control circuit shown in FIG. 24.

Referring to FIG. 25, control circuit 781 is formed of mode signal generating circuits 7811–7815. Mode signal generating circuits 7811–7815 generate VREF force mode signal, VPP force mode signal, multi-bit test mode signal, all-bank test mode signal and burn-in test mode signal based on the externally applied address, respectively.

Figure 26:
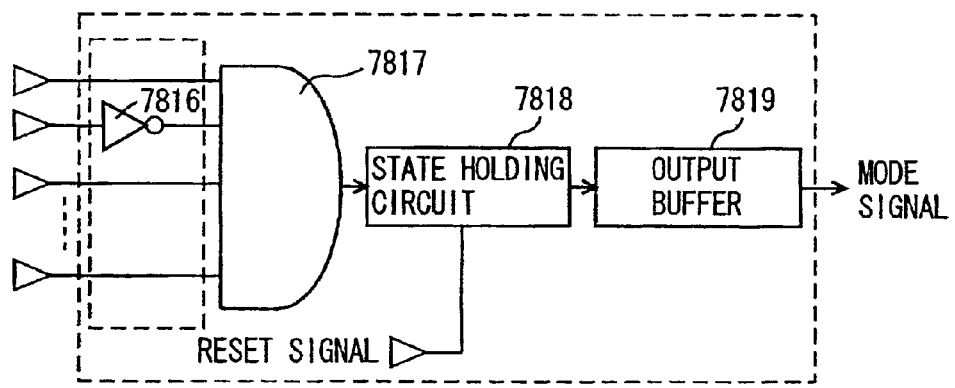
FIG. 26 is a circuit block diagram of a mode signal generating circuit shown in FIG. 25.

Referring to FIG. 26, each of mode signal generating circuits 7811–7815 includes an inverter 7816, an AND gate 7817, a state holding circuit 7818 and an output buffer 7819. AND gate 7817 receives arbitrary one address among the externally applied addresses via inverter 7816, and directly receives the other addresses. AND gate 7817 performs logical AND on the receives addresses, and outputs a result to state holding circuit 7818.

State holding circuit 7818 holds the signal applied from AND gate 7817 until input of a reset signal, and will outputs the signal held thereby to output buffer 7819. Output buffer 7819 latches the signal applied from state holding circuit 7818, and outputs one of VREF force mode signal, VPP force mode signal, multi-bit test mode signal, all-bank test mode signal and burn-in test mode signal.

For generating various mode signals, different addresses are input to AND gate 7817 through inverter 7816. Assuming that mode signal generating circuits 7811–7815 receive addresses A0–A4, respectively, address A0 is input through inverter 7816 to mode signal generating circuit 7811, and address A1 is input through inverter 7816 to mode signal generating circuit 7812. Also, address A2 is input through inverter 7816 to mode signal generating circuit 7813, address A3 is input through inverter 7816 to mode signal generating circuit 7814, and address A4 is input through inverter 7816 to mode signal generating circuit 7815.

Among addresses A0–A4 applied to mode signal generating circuits 7811–7815, respectively, only the address applied to inverter 7816 is at L-level, and the other addresses are at H-level. More specifically, when VREF force mode signal is to be generated, address A0 at L-level and addresses A1–A4 at H-level are input to mode signal generating circuits 7811–7815, respectively. Thereby, AND gate 7817 of mode signal generating circuit 7811 generates and outputs a signal at H-level to state holding circuit 7818. Mode signal generating circuit 7811 generates the VREF force mode signal at H-level. AND gate 7817 in each of mode signal generating circuits 7812–7815 generates and applies a signal at L-level to state holding circuit 7818. Each of mode signal generating circuits 7812–7815 generates VPP force mode signal at L-level, multi-bit test mode signal at L-level, all-bank test mode signal at L-level and burn-in test mode signal at L-level.

When one of the VPP force mode signal, multi-bit test mode signal, all-bank test mode signal and burn-in test mode signal is to be activated, an operation similar to that already described is performed to activate the intended mode signal among the VPP force mode signal, multi-bit test mode signal, all-bank test mode signal and burn-in test mode signal.

Referring to FIG. 24 again, when control circuit 781 generates the burn-in test mode signal at H-level in the manner described above, switch circuit 782 generates switch signal EXC at H-level in accordance with the burn-in test mode signal at H-level, and outputs the generated switch signal EXC at H-level to switches S1–S6 of voltage generating circuit 79. Thereby, switches S1–S6 are connected to terminals 798, 801, 803, 805, 807 and 809, respectively. Switches S1–S3 supply the voltage, which is supplied from the terminal for data mask signal DQM0, to the internal circuits, and switches S4–S6 supply the voltage, which is supplied from the terminal for data mask signal DQM1, to the internal circuits.

When control circuit 781 generates the burn-in test mode signal at L-level, switch circuit 782 generates switch signal EXC at L-level in accordance with the burn-in test mode signal at L-level, and outputs the same to switches S1–S6 of voltage generating circuit 79. Thereby, switches S1–S6 are connected to terminals 797, 799, 802, 804, 806 and 808, and supply internal voltages VREFS, VREFP, VPP, VREFD, VBL and VCP to the internal circuits, respectively.

In the burn-in test mode, voltage generating circuit 79 receives switch signal EXC at H-level from switch circuit 782, and supplies the voltage applied from the terminal for data mask signal DQM0 to internal circuits instead of internal voltages VREFS, VREFP and VPP. Also, it supplies the voltage applied from the terminal for data mask signal DQM1 to internal circuits instead of internal voltages VREFD, VBL and VCP. Accordingly, semiconductor memory device 170 can perform the burn-in test by externally applying the two voltages at different voltage levels in the burn-in test mode. As a result, determination of non-defective and defective products can be accurately performed.

According to a tenth embodiment, the semiconductor memory device includes the voltage generating circuit for supplying the voltages, which are received through the two terminals for the two data mask signals, to the internal circuits in the burn-in test mode. Therefore, the burn-in test can be performed under different conditions in the burn-in test mode. Consequently, determination of non-defective and defective products can be accurately performed.

Eleventh Embodiment

Figure 27:
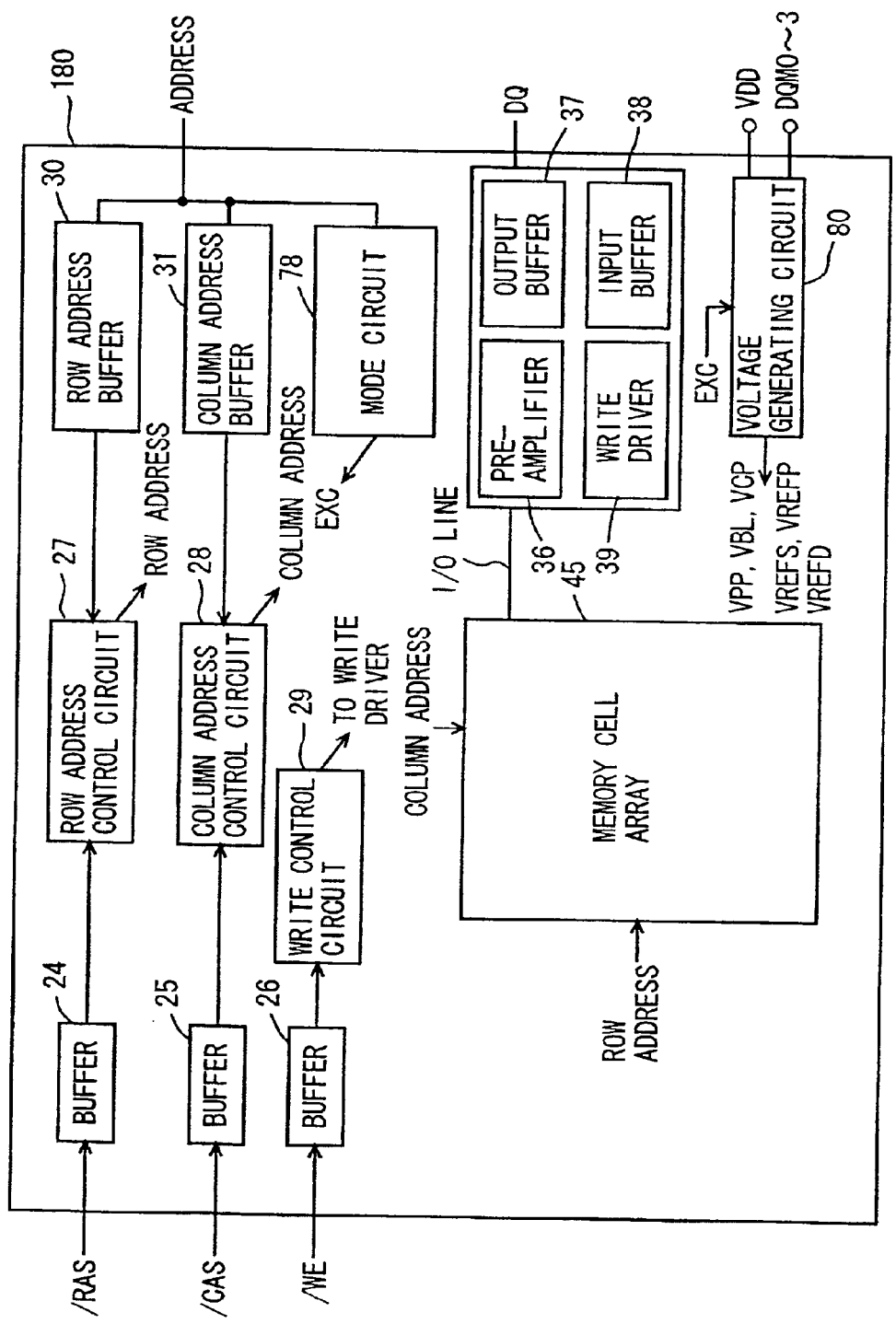
FIG. 27 is a schematic block diagram of a semiconductor memory device of an eleventh embodiment.

Referring to FIG. 27, a semiconductor memory device 180 according to an eleventh embodiment differs from semiconductor memory device 170 in that voltage generating circuit 79 is replaced with a voltage generating circuit 80. Structures other than the above are the same as those of semiconductor memory device 170. In semiconductor memory device 180, four data mask signals DQM0–DQM3 are input instead of data mask signals DQM0 and DQM1.

Figure 28:
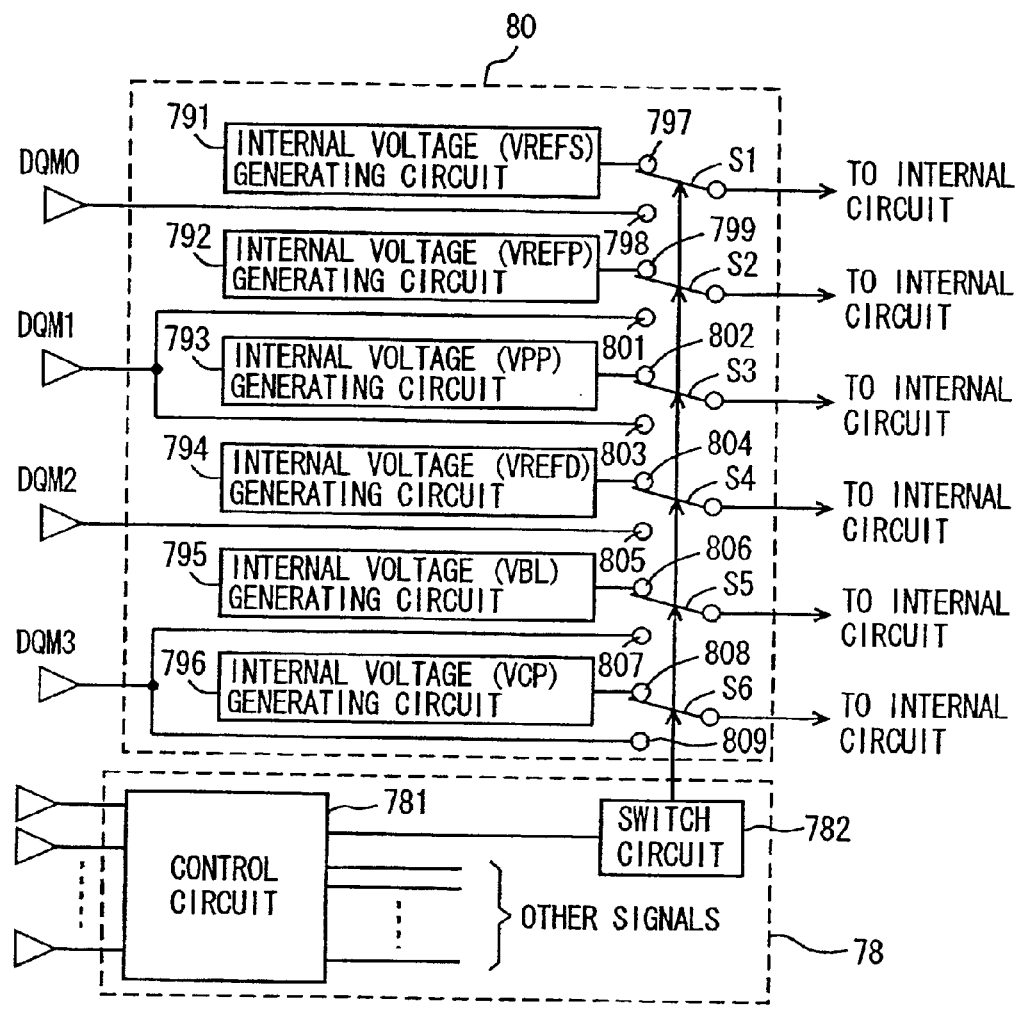
FIG. 28 is a schematic block diagram of a control circuit and a voltage generating circuit shown in FIG. 27.

Referring to FIG. 28, voltage generating circuit 80 is formed of the same components as voltage generating circuit 79. Voltage generating circuit 80 differs from voltage generating circuit 79 in that terminal 798 is supplied with a voltage applied from a terminal for data mask signal DQM0, terminals 801 and 803 are supplied with a voltage applied from a terminal for data mask signal DQM1, a terminal 805 is supplied with a voltage applied from a terminal for data mask signal DQM2, and terminals 807 and 809 are supplied with a voltage applied from a terminal for data mask signal DQM3.

Accordingly, when voltage generating circuit 80 receives switch signal EXC at H-level from switch circuit 782 in the burn-in test mode, switches S1–S6 are connected to terminals 798, 801, 803, 805, 807 and 809, respectively, and the externally applied four voltages are supplied to the internal circuits.

Structures and operations other than the above are the same as those in the tenth embodiment.

According to the eleventh embodiment, the semiconductor memory device includes the voltage generating circuit for supplying the voltages, which are applied from the four terminals for the four data mask signals, to the internal circuits in the burn-in test mode. Therefore, the burn-in test mode can be performed under further different conditions in the burn-in test mode. As a result, defective and non-defective products can be determined further accurately.

Twelfth Embodiment

Figure 29:
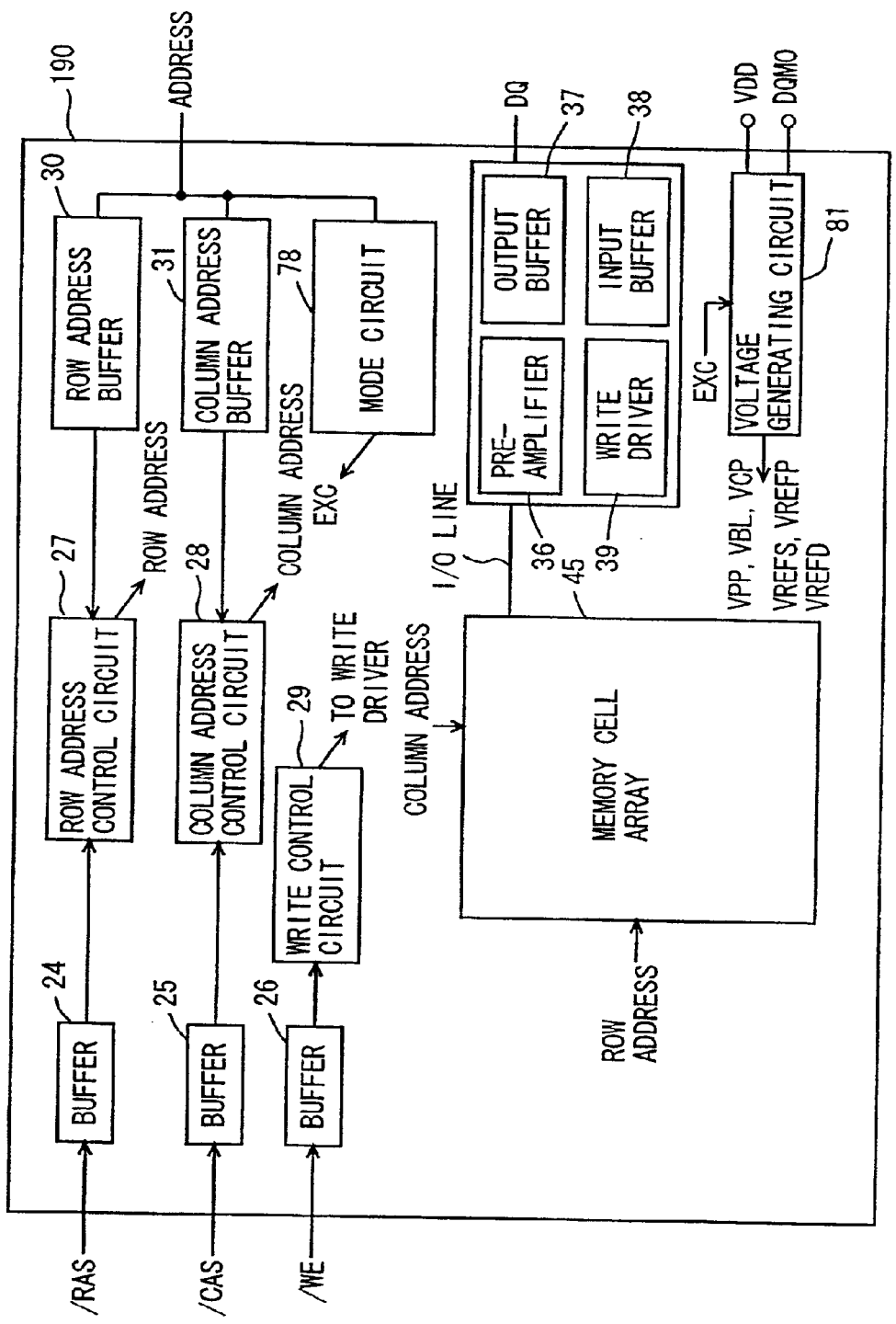
FIG. 29 is a schematic block diagram of a semiconductor memory device of a twelfth embodiment.

Referring to FIG. 29, a semiconductor memory device 190 according to a twelfth embodiment differs from semiconductor memory device 180 in that voltage generating circuit 80 is replaced with a voltage generating circuit 81. Structures other than the above are the same as those of semiconductor memory device 180.

Figure 30:
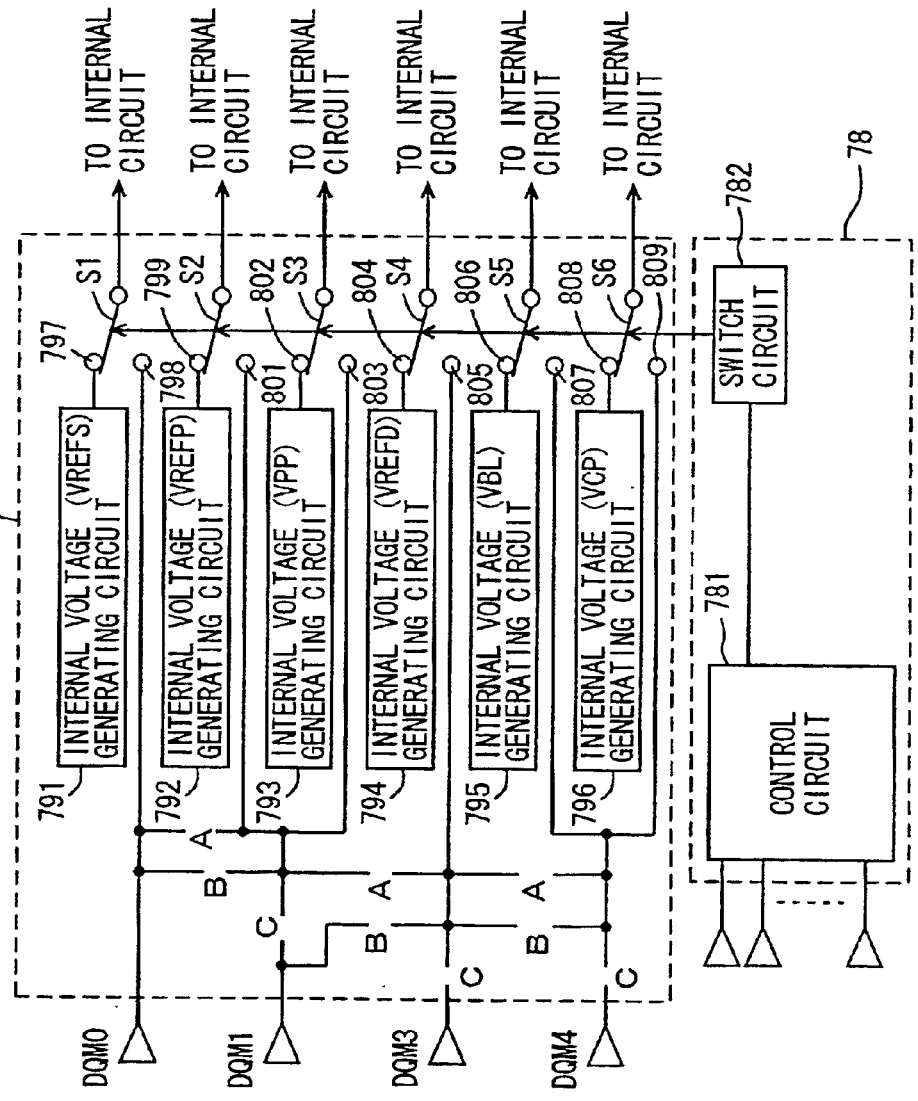
FIG. 30 is a schematic block diagram of a control circuit and a voltage generating circuit shown in FIG. 29.

Referring to FIG. 30, voltage generating circuit 81 differs from voltage generating circuit 80 in that portions A, B and C to be connected/disconnected by aluminum are additionally formed. The number of terminal(s) for data mask signals DQM depends on the word structure of semiconductor memory device 190. When the word structure is "×8", the data mask signal is one. When the word structure is "×16", the data mask signals are two. When the word structure is "×32", the data mask signals are four.

Accordingly, a connection made of aluminum is formed in each portion "A" for the word structure of "×8". For the word structure of "×16", a connection made of aluminum is formed in each portion "B". For the word structure of "×32", a connection made of aluminum is formed in each portion "C". Thereby, the voltage can be applied to the internal circuits from the data mask signal terminals, of which number depends on the determined word structure, in the burn-in test mode.

Structures and operations other than the above are the same as those in the eleventh embodiment.

According to the twelfth embodiment, the semiconductor memory device includes the voltage generating circuit, which switches the number of voltage(s) applied from the data mask signal terminal(s) depending on the word structure in the burn-in test mode, and supplies the voltage(s) applied from the data mask signal terminal(s) to the internal circuits. Therefore, the number of voltage(s) supplied to the internal circuits can be changed in the burn-in test mode in accordance with the one word structure selected from the plurality of word structures.

Thirteenth Embodiment

Figure 31:
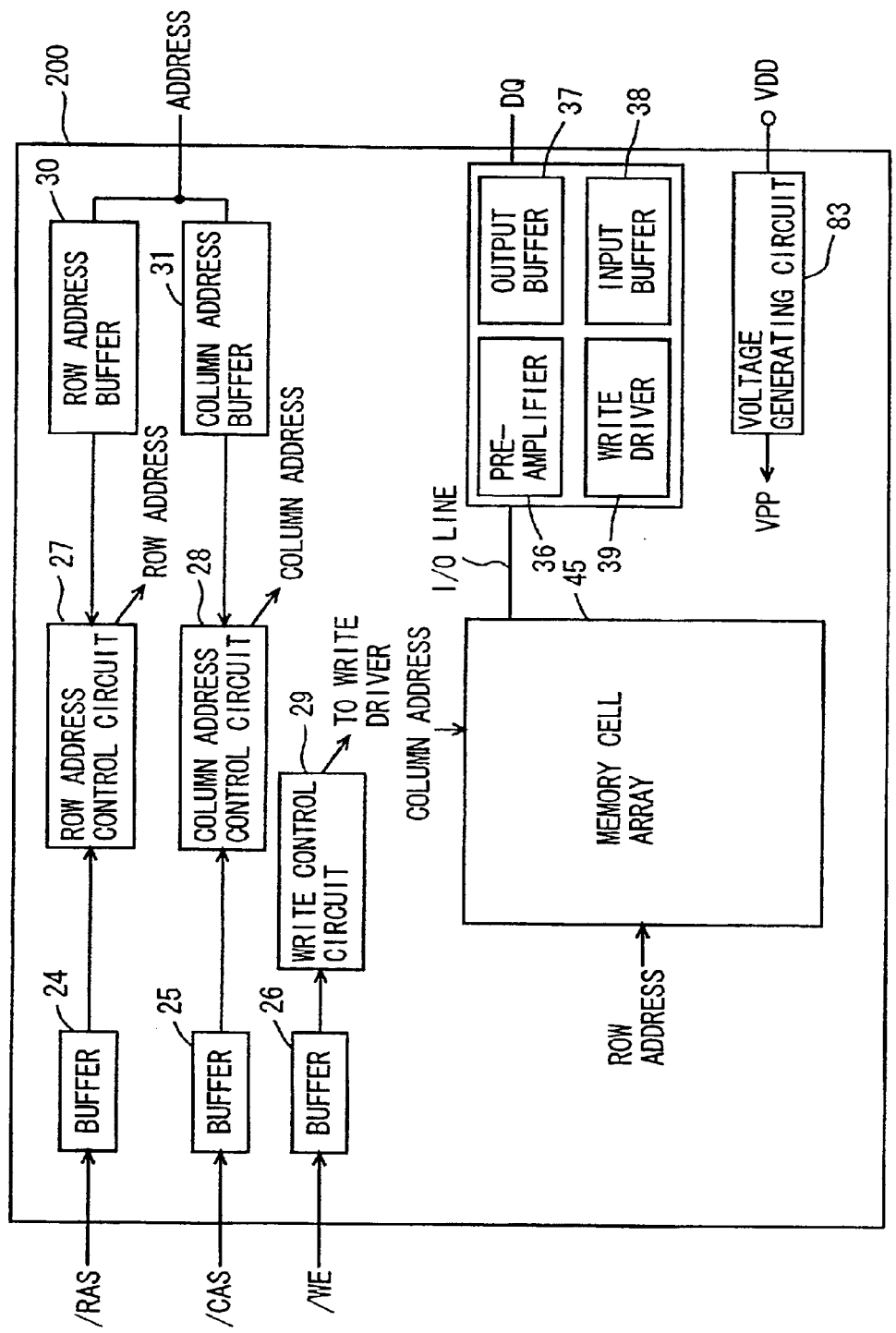
FIG. 31 is a schematic block diagram of a semiconductor memory device of a thirteenth embodiment.

Referring to FIG. 31, a semiconductor memory device 200 according to a thirteenth embodiment differs from semiconductor memory device 190 in that mode circuit 78 is not employed, and voltage generating circuit 81 is replaced with a voltage generating circuit 83. Structures other than the above are the same as those of semiconductor memory device 190.

Voltage generating circuit 83 boosts externally supplied power supply voltage VDD to generate internal voltage VPP, and supplies internal voltage VPP thus generated to the word line driver included in memory cell array 45.

Referring to FIG. 32, voltage generating circuit 83 includes a ring oscillator 831, buffers 832, 837, 842 and 847, delay circuits 833, 838, 843 and 848, pump capacitors 834, 839, 844 and 849, N-channel MOS transistors 835, 840, 845 and 850, and a gate control circuit 852.

Ring oscillator 831 produces four pulse signals A, /A, B and /B having phases shifted by 90 degrees from each other, and outputs these signals to buffers 832, 837, 842 and 847, respectively. Four pulse signals A, /A, B and /B have amplitudes, which periodically change between ground voltage GND and power supply voltage VDD.

Buffer 832 latches pulse signal A, and outputs the same to delay circuit 833 and one of terminals of pump capacitor 834. Delay circuit 833 delays the pulse signal received from buffer 832 by a predetermined amount, and outputs the same to the other electrode of pump capacitor 834. Pump capacitor 834 boosts power supply voltage VDD to produce internal voltage VPP based on the pulse signal applied from buffer 832 and the pulse signal applied from delay circuit 833, and outputs the internal voltage VPP to a source terminal of N-channel MOS transistor 835. N-channel MOS transistor 835 receives on its gate terminal a signal g from gate control circuit 852, and supplies internal voltage VPP boosted by pump capacitor 834 to a power supply interconnection 854 when signal g is at H-level.

Buffers 837, 842 and 847, delay circuits 838, 843 and 848, pump capacitors 839, 844 and 849, and N-channel MOS transistors 840, 845 and 850 serve the same functions as buffer 832, delay circuit 833, pump capacitor 834 and N-channel MOS transistor 835, respectively. N-channel MOS transistors 840, 845 and 850 receive, on their gate terminals, signals /g, f and /f from gate control circuit 852, respectively.

Gate control circuit 852 produces signals g, /g, f and /f setting the timing of supply of internal voltage VPP to power supply interconnection 854 based on a control signal applied from a control circuit (not shown), and outputs signal g to the gate terminal of N-channel MOS transistor 835. Also, gate control circuit 852 outputs signals /g, f and /f to the gate terminals of N-channel MOS transistors 840, 845 and 850, respectively. Capacitors 836, 841, 846, 851 and 853 are parasitic capacitors.

Figure 33:
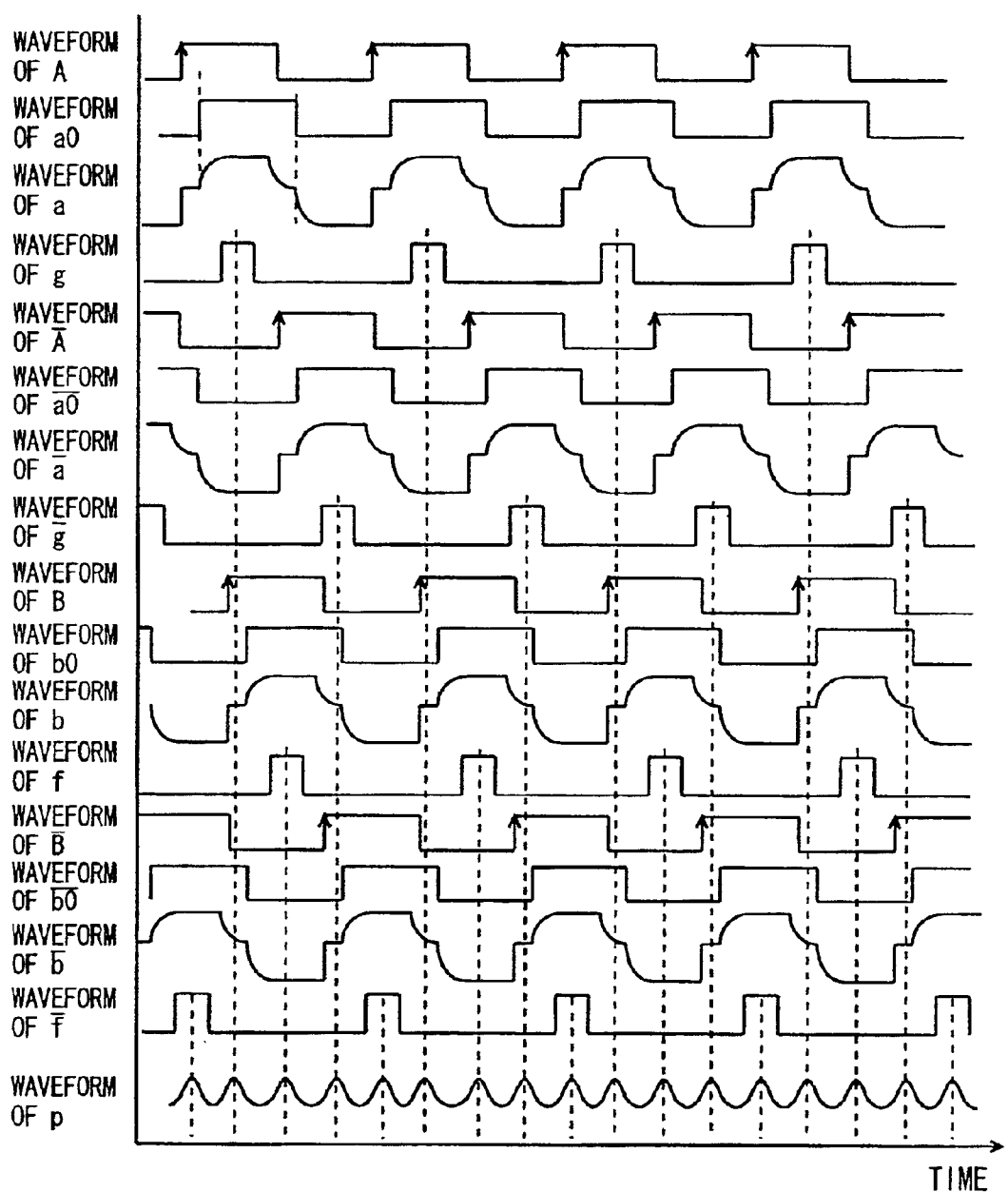
FIG. 33 is a timing chart of signals for representing an operation of generating an internal voltage by the voltage generating circuit shown in FIG. 32.

Referring to FIG. 33, description will now be given on the operation of voltage generating circuit 83. Ring oscillator 831 generates pulse signals A, /A, B and /B having phases shifted by 90 degrees from each other, and outputs them to buffers 832, 837, 842 and 847, respectively. Buffer 832 latches and outputs pulse signal A, and delay circuit 833 delays the pulse signal applied from buffer 832 by a predetermined amount, and outputs a signal a0 to the other electrode of pump capacitor 834. Thereby, signal a is pulled up to a level of up to VPP (>VDD) owing to the bootstrap effect by delay circuit 833 and pump capacitor 834. When N-channel MOS transistor 835 receives signal g from gate control circuit 852, N-channel MOS transistor 835 is turned on to supply internal voltage VPP to power supply interconnection 854 only while signal g is at H-level.

Buffer 837, delay circuit 838 and pump capacitor 839 perform the same operations as buffer 832, delay circuit 833 and pump capacitor 834 to boost power supply voltage VDD of pulse signal /A to internal voltage VPP, and supply signal /A to the source terminal of N-channel MOS transistor 840. When N-channel MOS transistor 840 receives signal /g from gate control circuit 852, N-channel MOS transistor 840 is turned on to supply internal voltage VPP to power supply interconnection 854 only while signal /g is at H-level.

Buffer 842, delay circuit 843 and pump capacitor 844 perform the same operations as buffer 832, delay circuit 833 and pump capacitor 834 to boost power supply voltage VDD of pulse signal B to internal voltage VPP, and supply signal b to the source terminal of N-channel MOS transistor 845. When N-channel MOS transistor 845 receives signal f from gate control circuit 852, N-channel MOS transistor 845 is turned on to supply internal voltage VPP to power supply interconnection 854 only while signal f is at H-level.

Buffer 847, delay circuit 848 and pump capacitor 849 perform the same operations as buffer 832, delay circuit 833 and pump capacitor 834 to boost power supply voltage VDD of pulse signal /B to internal voltage VPP, and supply signal /b to the source terminal of N-channel MOS transistor 850. When N-channel MOS transistor 850 receives signal /f from gate control circuit 852, N-channel MOS transistor 850 is turned on to supply internal voltage VPP to power supply interconnection 854 only while signal /f is at H-level.

As a result, power supply interconnection 854 is supplied with internal voltage VPP formed of a waveform of signal p.

As described above, voltage generating circuit 83 supplies internal voltage VPP to power supply interconnection 854 in accordance with every change of the phase by 90 degrees. Therefore, the voltage level of internal voltage VPP can be stable.

Voltage generating circuit 83 includes the delay circuits and the pump capacitors, which boost the power supply voltage by the bootstrap effect, and the delay circuit and the pump capacitor are arranged corresponding to each of the four pulse signals having phases shifted by 90 degrees from each other. Voltage generating circuit 83 having the above structures is suitable to the semiconductor memory device having the word structure, e.g., of "×32". In the semiconductor memory device having the word structure of "×32", when internal voltage VPP is supplied to the word line, which is activated by the word line driver, in accordance with the input/output of data, the potential on power supply interconnection 854 supplying internal voltage VPP to the word line driver is liable to lower. However, voltage generating circuit 83 supplies internal voltage VPP to power supply interconnection 854 many times as shown in FIG. 33 so that it is possible to suppress lowering of the potential on power supply interconnection 854, which may be caused by supply of internal voltage VPP to the word line by word line driver.

In the above description, the voltage generating circuit supplies internal voltage VPP by boosting the four pulse signals having phases shifted from each other by 90 degrees. According to the invention, however, the pulse signals of different phases are not restricted to four in number, and may be other than four. More specifically, the number of pulse signals of different phases may be determined in accordance with a rate or degree, by which the potential on the power supply interconnection lowers due to supply of internal voltage VPP to the word line by the word line driver.

According to the thirteenth embodiment, the semiconductor memory device includes the voltage generating circuit, which boosts the plurality of pulse signals having mutually different phases and amplitudes variable between the ground voltage and the power supply voltage by the corresponding pump capacitors, respectively, and thereby generates the internal voltage for supplying the same to the power supply interconnection. Therefore, the generated internal voltage can be frequently supplied to the power supply voltage. As a result, it is possible to suppress variations in potential on the power supply interconnection supplying the internal voltage.

Fourteenth Embodiment

Figure 34:
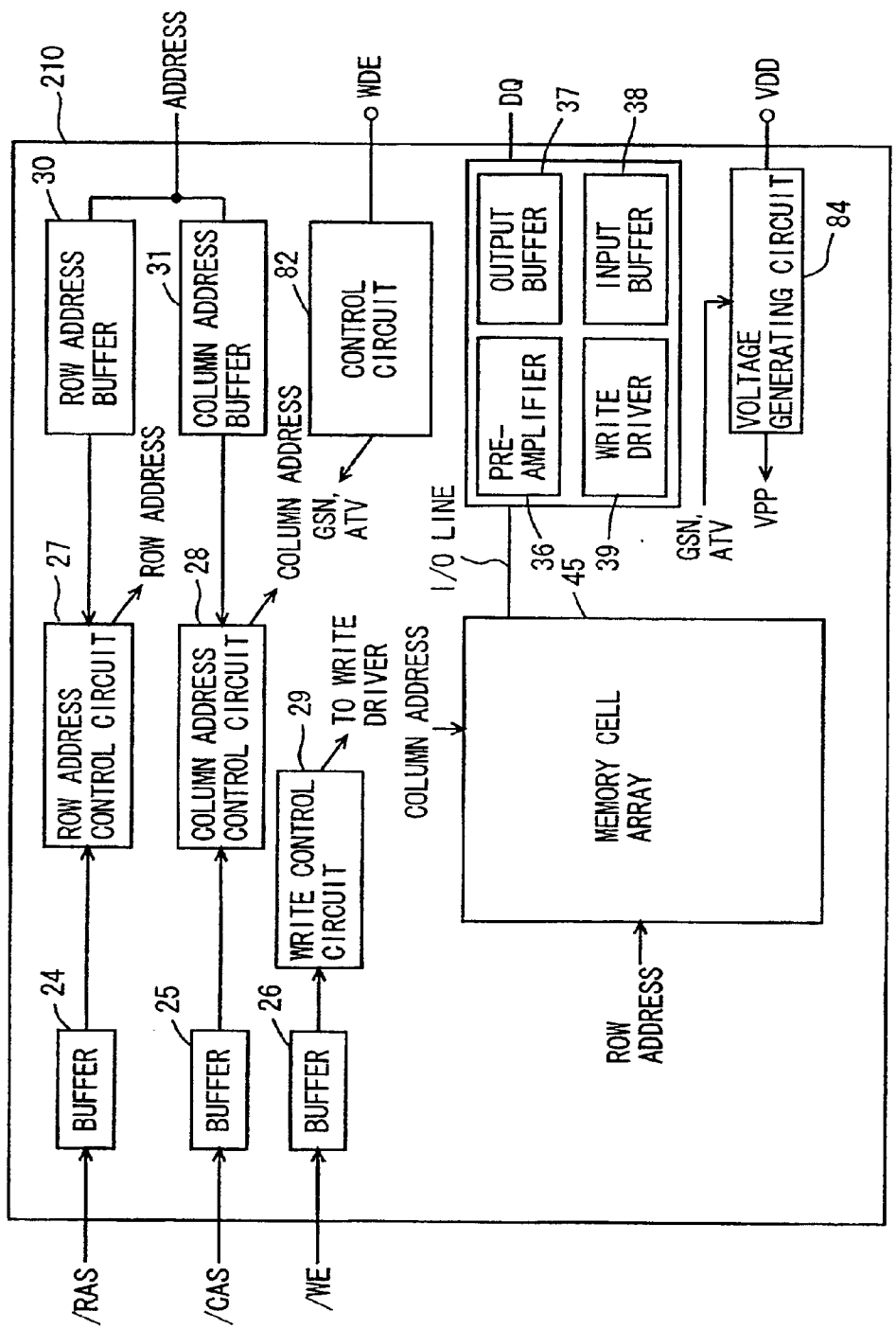
FIG. 34 is a schematic block diagram of a semiconductor memory device of a fourteenth embodiment.

Referring to FIG. 34, a semiconductor memory device 210 according to a fourteenth embodiment differs from semiconductor memory device 200 in that voltage generating circuit 83 is replaced with voltage generating circuit 84, and control circuit 82 is additionally employed. Structures and operations other than the above are the same as those of semiconductor memory device 200.

Control circuit 82 produces a control signal GSN and an activating signal ATV in accordance with the word structure designated by a word structure determination signal WDE, and outputs control signal GSN and activating signal ATV thus produced to voltage generating circuit 84.

Figure 35:
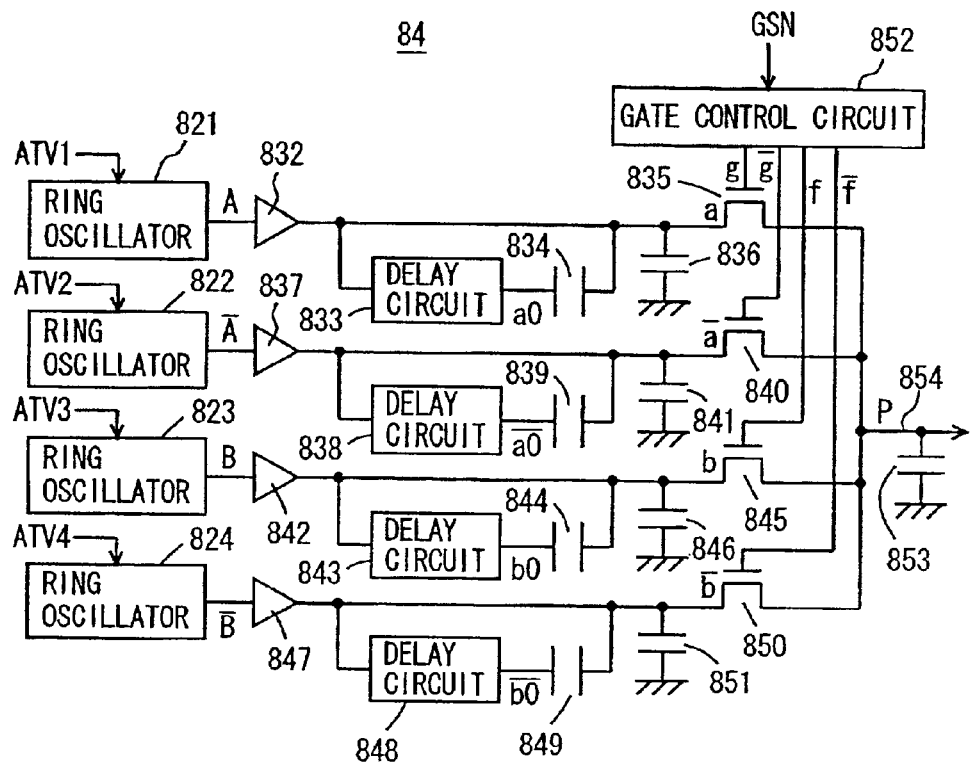
FIG. 35 is a circuit diagram of a voltage generating circuit shown in FIG. 34.

Referring to FIG. 35, voltage generating circuit 84 differs from voltage generating circuit 83 in that ring oscillator 831 is replaced with ring oscillators 821–824. Structures other than the above are the same as those of voltage generating circuit 83. Buffers 832, 837, 842 and 847 are provided corresponding to ring oscillators 821–824, respectively. Ring oscillators 821–824 generate the pulse signals having phases shifted by 90 degrees from each other, and output the generated pulse signals to corresponding buffers 832, 837, 842 and 847, respectively. More specifically, ring oscillator 821 generates pulse signal A (see FIG. 33), ring oscillator 822 generates pulse signal /A (see FIG. 33), ring oscillator 823 generates pulse signal B (see FIG. 33) and ring oscillator 824 generates pulse signal /B (see FIG. 33).

Activating signal ATV applied from control circuit 82 is formed of activating signals ATV1–ATV4, and ring oscillators 821–824 receive activating signals ATV1–ATV4, respectively. Gate control circuit 852 receives control signal GSN from control circuit 82, and produces signals g, /g, f and /f at H- or L-level in accordance with the control signal GSN for outputting produced signals g, /g, f and /f to the gate terminals of N-channel MOS transistors 835, 840, 845 and 850, respectively.

Figure 36:
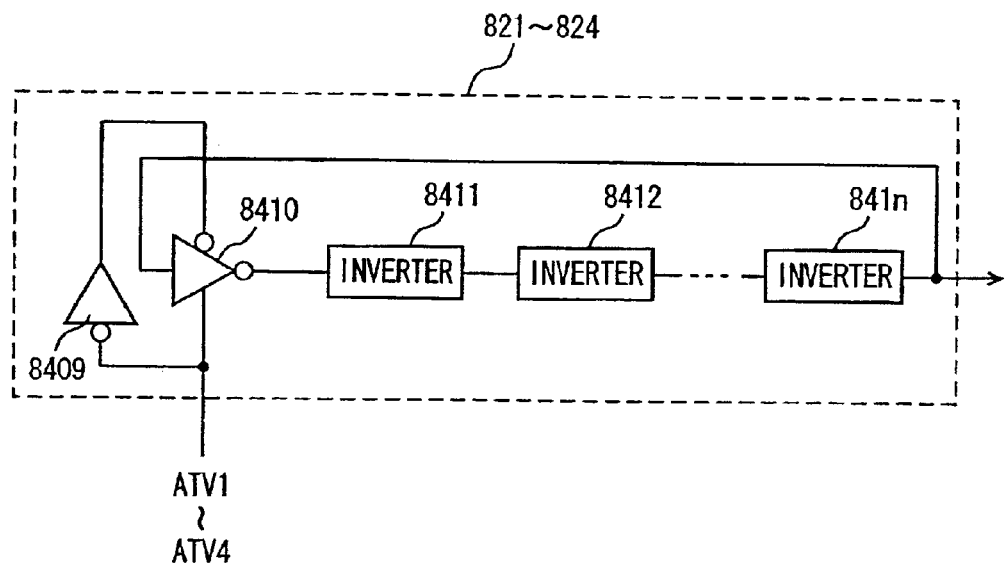
FIG. 36 is a circuit block diagram of a ring oscillator shown in FIG. 35.

Referring to FIG. 36, each of ring oscillators 821–824 is formed of clocked inverter 8410 and inverters 8409 and 8411–841n. Inverter 8409 inverts corresponding one of activating signals ATV–ATV4, and outputs the same to a clock terminal of clocked inverter 8410. Clocked inverter 8410 receives corresponding one of activating signals ATV1–ATV4 as well as an inverted signal (/ATV1–/ATV4) of the activating signal, and thereby is activated or deactivated. More specifically, when ring oscillators 821–824 receive activating signals ATV1–ATV4 at L-level, respectively, each clocked inverter 8410 is deactivated, and does not output the output signal applied from inverter 841n to inverter 8411. Thus, ring oscillators 821–824 stop. When ring oscillators 821–824 receive activating signals ATV1–ATV4 at H-level, respectively, each clocked inverter 8410 is activated to invert and output the output signal applied from inverter 841n to inverter 8411.

Inverters 8411–841n form oscillator circuits in odd stages, and generate pulse signal A (/A, B or /B) having an amplitude variable between ground voltage GND and power supply voltage VDD. Inverter 8411 in the first stage inverts and outputs the output signal of clocked inverter 8410 to inverter 8412 in the following stage when clocked inverter 8410 is active. Inverters 8412–84n-1 invert the output signals of the inverters in the preceding stages, and output the inverted signals to the inverters in the following stages, respectively. Inverter 841n in the final stage applies its output signal to clocked inverter 8410 and corresponding buffer 832, 837, 842 or 847.

In this fourteenth embodiment, the number of the ring oscillators to be activated changes in accordance with the word structure of semiconductor memory device 210. More specifically, when semiconductor memory device 210 is to be served as the semiconductor memory device having the word structure of "×8", ring oscillators 821, 823 and 824 stop. When semiconductor memory device 210 is to be served as the semiconductor memory device having the word structure of "×16", ring oscillators 823 and 824 stop. When semiconductor memory device 210 is to be served as the semiconductor memory device having the word structure of "×32", all ring oscillators 821–824 are activated.

Accordingly, when control circuit 82 receives word structure determination signal WDE designating the word structure of "×8", control circuit 82 produces activating signals ATV1, ATV3 and ATV4 at L-level as well as activating signal ATV2 at H-level and control signal GSN for producing signals g, f and /f at L-level and signal /g at H-level, and outputs the same to voltage generating circuit 84. When control circuit 82 receives word structure determination signal WDE designating the word structure of "×16", control circuit 82 produces activating signals ATV3 and ATV4 at L-level, activating signals ATV1 and ATV2 at H-level, and control signal GSN for producing signals f and /f at L-level and signals g and /g at H-level, and outputs the same to voltage generating circuit 84. When control circuit 82 receives word structure determination signal WDE designating the word structure of "×32", control circuit 82 produces activating signals ATV1–ATV4 at H-level and control signal GSN for producing signals g, /g, f and /f at H-level, and outputs the same to voltage generating circuit 84.

When voltage generating circuit 84 receives activating signals ATV1, ATV3 and ATV4 at L-level, activating signal ATV2 at H-level and control signal GSN for producing signals g, f and /f at L-level and signal /g at H-level, ring oscillators 821, 823 and 824 are stopped, and ring oscillator 822 is activated to output pulse signal /A to buffer 837. Also, gate control circuit 852 produces signals g, f and /f at L-level and signal /g at H-level, and outputs signals g, f and /f at L-level to gate terminals of N-channel MOS transistors 835, 845 and 850, respectively. Signal /g at H-level thus generated is output to the gate terminal of N-channel MOS transistor 840.

Thereby, delay circuit 838 and pump capacitor 839 boosts power supply voltage VDD by the bootstrap effect to output signal /a to the source terminal of N-channel MOS transistor 840. N-channel MOS transistor 840 supplies boosted internal voltage VPP to power supply interconnection 854 only while signal /g is at H-level.

Accordingly, when semiconductor memory device 210 is to be operated as the semiconductor memory device having the word structure of "×8", voltage generating circuit 84 drives only ring oscillator 822 for supplying internal voltage VPP prepared by boosting power supply voltage VDD to power supply interconnection 854.

When voltage generating circuit 84 receives activating signals ATV2 and ATV4 at L-level, activating signals ATV1 and ATV2 at H-level, and control signal GSN for producing signals f and /f at L-level and signals g and /g at H-level from control circuit 82, ring oscillators 823 and 824 stop, and ring oscillators 821 and 822 are activated. Ring oscillator 821 outputs pulse signal A to buffer 832, and ring oscillator 822 outputs pulse signal /A to buffer 837. Gate control circuit 852 produces signals f and /f at L-level and signals g and /g at H-level, and outputs signals f and /f at L-level to the gate terminals of N-channel MOS transistors 845 and 850. Also, gate control circuit 852 outputs signals g and /g at H-level to the gate terminals of N-channel MOS transistors 835 and 840.

Thereby, delay circuit 833 and pump capacitor 834 boost power supply voltage VDD by the bootstrap effect, and output signal a to the source terminal of N-channel MOS transistor 835. N-channel MOS transistor 835 supplies boosted internal voltage VPP to power supply interconnection 854 only while signal g is at H-level. Delay circuit 838 and pump capacitor 839 boost power supply voltage VDD by the bootstrap effect, and output signal /a to the source terminal of N-channel MOS transistor 840. N-channel MOS transistor 840 supplies boosted internal voltage VPP to power supply interconnection 854 only while signal /g is at H-level.

Accordingly, when semiconductor memory device 210 is to be operated as the semiconductor memory device having the word structure of "×16", voltage generating circuit 84 drives ring oscillators 821 and 822 for supplying internal voltage VPP prepared by boosting power supply voltage VDD to power supply interconnection 854.

When voltage generating circuit 84 receives activating signals ATV1–ATV4 at H-level and control signal GSN for producing signals g, /g, f and /f at H-level from control circuit 82, ring oscillators 821–824 are activated. Gate control circuit 852 produces signals g, /g, f and /f at H-level, and outputs them to the gate terminals of N-channel MOS transistors 835, 840, 845 and 850, respectively.

Thereafter, voltage generating circuit 84 generates internal voltage VPP based on pulse signals A, /A, B and /B having phases shifted by 90 degrees from each other, respectively, and supplies internal voltage VPP thus generated to power supply interconnection 854, as already described in connection with the thirteenth embodiment.

As described above, voltage generating circuit 84 activates the ring oscillator(s) of the number corresponding to the word structure of semiconductor memory device 210. Based on the pulse signals, which are generated by the ring oscillator(s) thus activated, voltage generating circuit 84 generates and outputs internal voltage VPP to power supply interconnection 854. Also, voltage generating circuit 84 stops the ring oscillator(s) other than the activated ring oscillator(s). Therefore, variations in potential on power supply interconnection 854 supplying internal voltage VPP can be suppressed even when the word structure changes, and the power consumption can be reduced.

In the above description, four ring oscillators 841–844 generate pulse signals A, /A, B and /B having phases shifted by 90 degrees from each other, and each of ring oscillators 821–824 is activated and deactivated independently of the others. However, the number of ring oscillators is not restricted to four, and may be one, two or three. If the ring oscillator(s) are one, two or three, one of the ring oscillator(s) must produce at least two pulse signals having different phases, and the pulse signals thus produced must be supplied to the buffer independently of each other. For this, such a structure may be employed that a gate circuit is arranged on the output side of the ring oscillator, and is turned on/off by an activating signal applied from control circuit 82.

According to the fourteenth embodiment, the internal voltage prepared by boosting the power supply voltage is generated and supplied to the power supply interconnection based on the pulse signal generated by the ring oscillator(s), of which number corresponds to the word structure of the semiconductor memory device. Therefore, the internal voltage can be stably supplied to the power supply interconnection even when the word structure of the semiconductor memory device changes. Further, the ring oscillator(s) other than the ring oscillator(s) producing the pulse signal are stopped so that the power consumption can be reduced.

Fifteenth Embodiment

Figure 37:
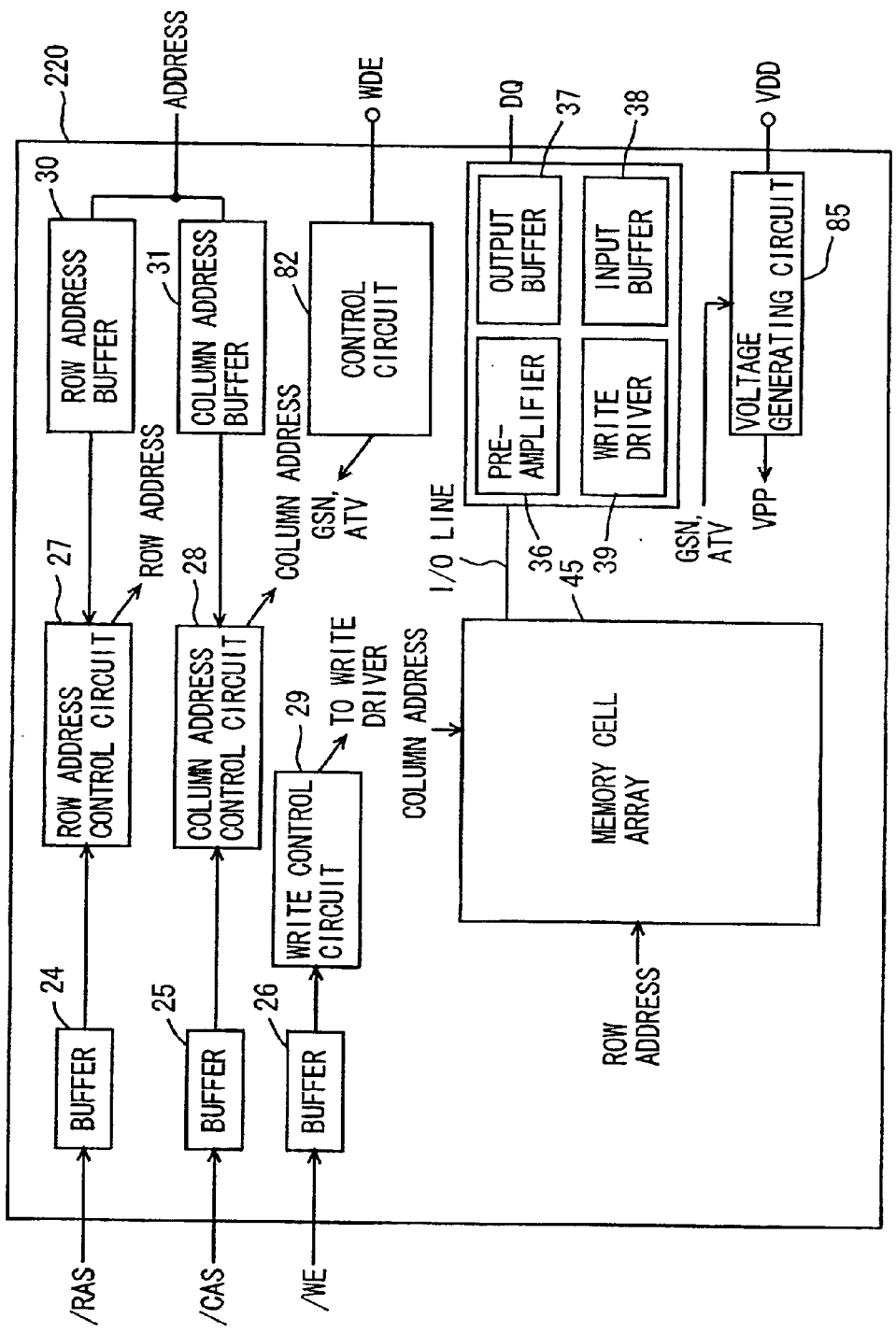
FIG. 37 is a schematic block diagram of a semiconductor memory device of a fifteenth embodiment.

Referring to FIG. 37, a semiconductor memory device 220 of a fifteenth embodiment differs from semiconductor memory device 210 in that voltage generating circuit 84 is replaced with a voltage generating circuit 85. Other structures are the same as those of semiconductor memory device 210.

Figure 38:
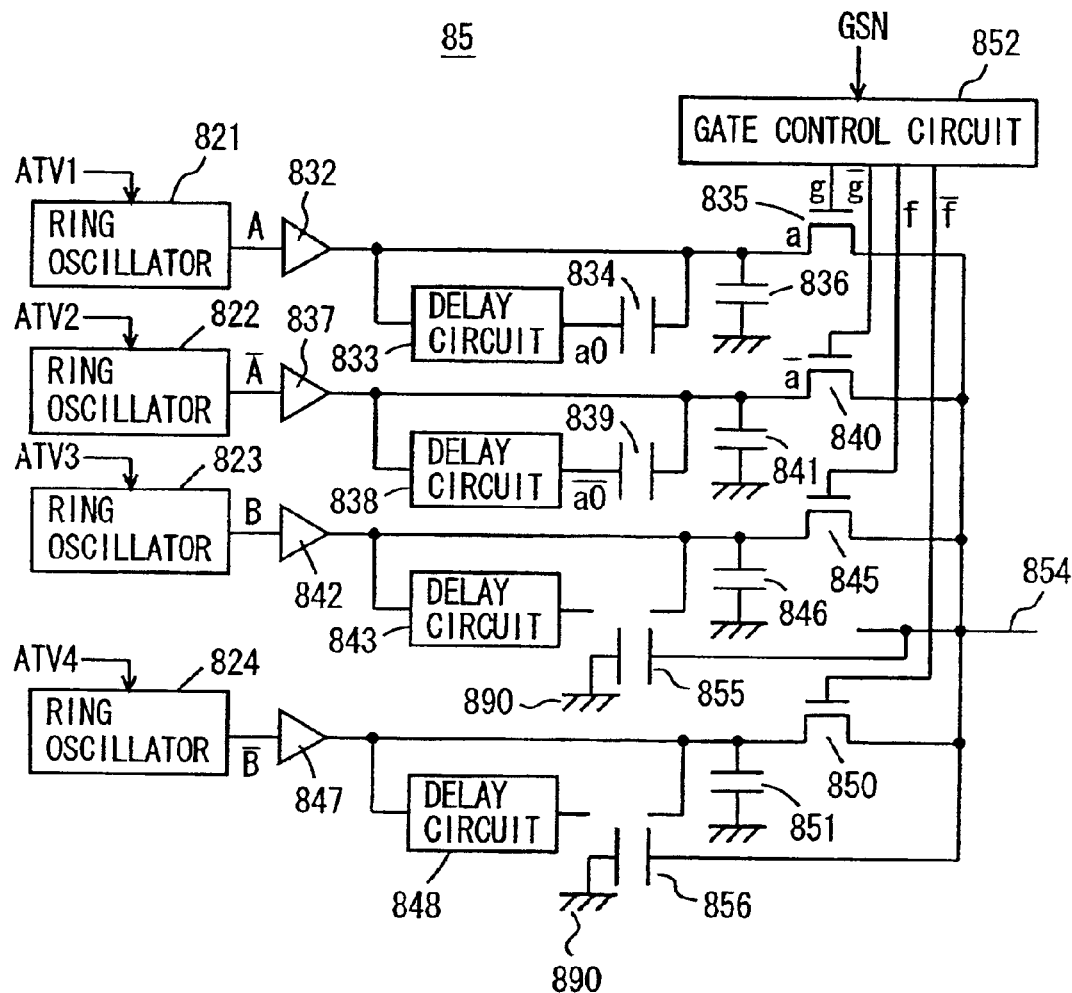
FIG. 38 is a circuit diagram of a voltage generating circuit shown in FIG. 37.

Referring to FIG. 38, voltage generating circuit 85 is the same as voltage generating circuit 84 except for that capacitors 855 and 856 are employed instead of capacitors 844 and 849.

When semiconductor memory device 220 is to be operated as the semiconductor memory device having the word structure of "×16", ring oscillators 823 and 824 stop as already described. Therefore, pump capacitors 844 and 849 not receiving pulse signals B and /B are isolated from delay circuits 843 and 848, and pump capacitors 844 and 849 are replaced with capacitors 855 and 856 decoupled from power supply interconnection 854, respectively. In this case, each of capacitors 855 and 856 is connected between power supply interconnection 854 and a ground node 890.

This further suppresses variations in potential on power supply interconnection 854.

FIG. 38 shows the case of employing the word structure of "×16". In the case of employing the word structure of "×8", ring oscillator 821 is also stopped, and therefore pump capacitor 834 is replaced with a capacitor decoupled from power supply interconnection 854.

In the above description, pump capacitors 844 and 849 are decoupled from the power supply interconnection supplying internal voltage VPP. Alternatively, pump capacitors 844 and 849 may be decoupled from the power supply interconnection supplying power supply voltage VDD or a power supply interconnection supplying another power supply voltage.

Structures and operations other than the above are the same as those of the fourteenth embodiment.

According to the fifteenth embodiment, the semiconductor memory device includes the plurality of pump capacitors, which generate the internal voltage by boosting the power supply voltage based on the plurality of pulse signals having different phases, and also includes the voltage generating circuit, which generates the pulse signals of the number corresponding to the word structure of the semiconductor memory device for supplying the internal voltage to the power supply interconnection. Among the pump capacitors, the pump capacitor(s) not generating the internal voltage prepared by boosting the power supply voltage are used as the capacitor(s) decoupled from the power supply interconnection. Therefore, the internal voltage can be supplied to the power supply interconnection further stably.

Sixteenth Embodiment

Figure 39:
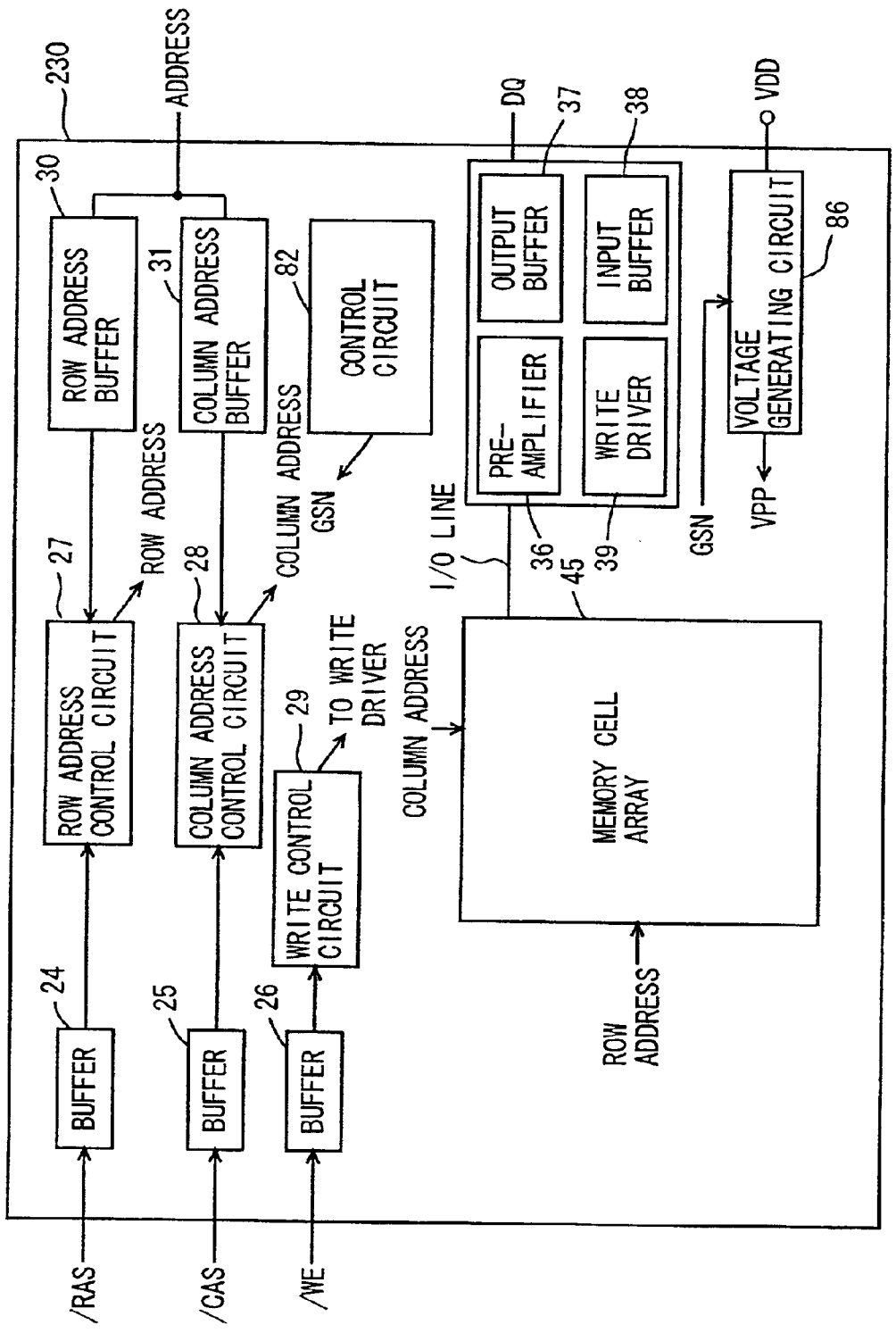
FIG. 39 is a schematic block diagram of a semiconductor memory device of a sixteenth embodiment.

Referring to FIG. 39, a semiconductor memory device 230 of a sixteenth embodiment differs from the semiconductor memory device 200 in that a control circuit 82 is additionally employed, and voltage generating circuit 83 is replaced with a voltage generating circuit 86. Structures other than the above are the same as those of semiconductor memory device 200.

When semiconductor memory device 230 is driven, control circuit 82 produces and outputs control signal GSN to voltage generating circuit 86.

Figure 40:
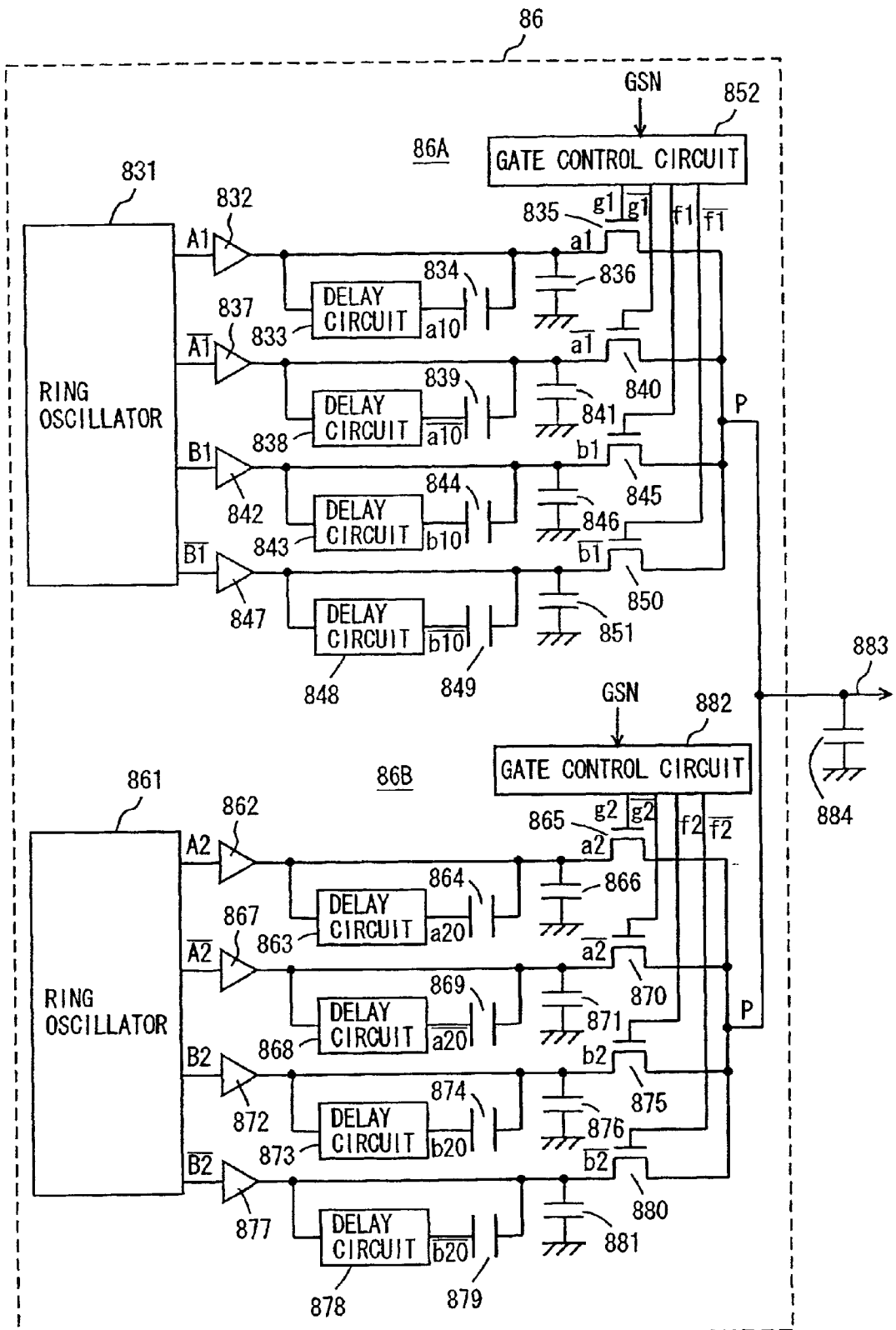
FIG. 40 is a circuit diagram of a voltage generating circuit shown in FIG. 39.

Referring to FIG. 40, voltage generating circuit 86 includes pump circuits 86A and 86B. Pump circuit 86A is the same as voltage generating circuit 83. Pump circuit 86B includes ring oscillator 861, buffers 862, 867, 872 and 877, delay circuits 863, 868, 873 and 878, pump capacitors 864, 869, 874 and 879, N-channel MOS transistors 865, 870, 875 and 880, and a gate control circuit 882.

Ring oscillator 861, buffers 862, 867, 872 and 877, delay circuits 863, 868, 873 and 878, pump capacitors 864, 869, 874 and 879, N-channel MOS transistors 865, 870, 875 and 880, and gate control circuit 882 correspond to ring oscillator 831, buffers 832, 837, 842 and 847, delay circuits 833, 838, 843 and 848, pump capacitors 834, 839, 844 and 849, N-channel MOS transistors 835, 840, 845 and 850, and gate control circuit 852 in pump circuit 86A, and perform the same functions as those, respectively.

Figure 41:
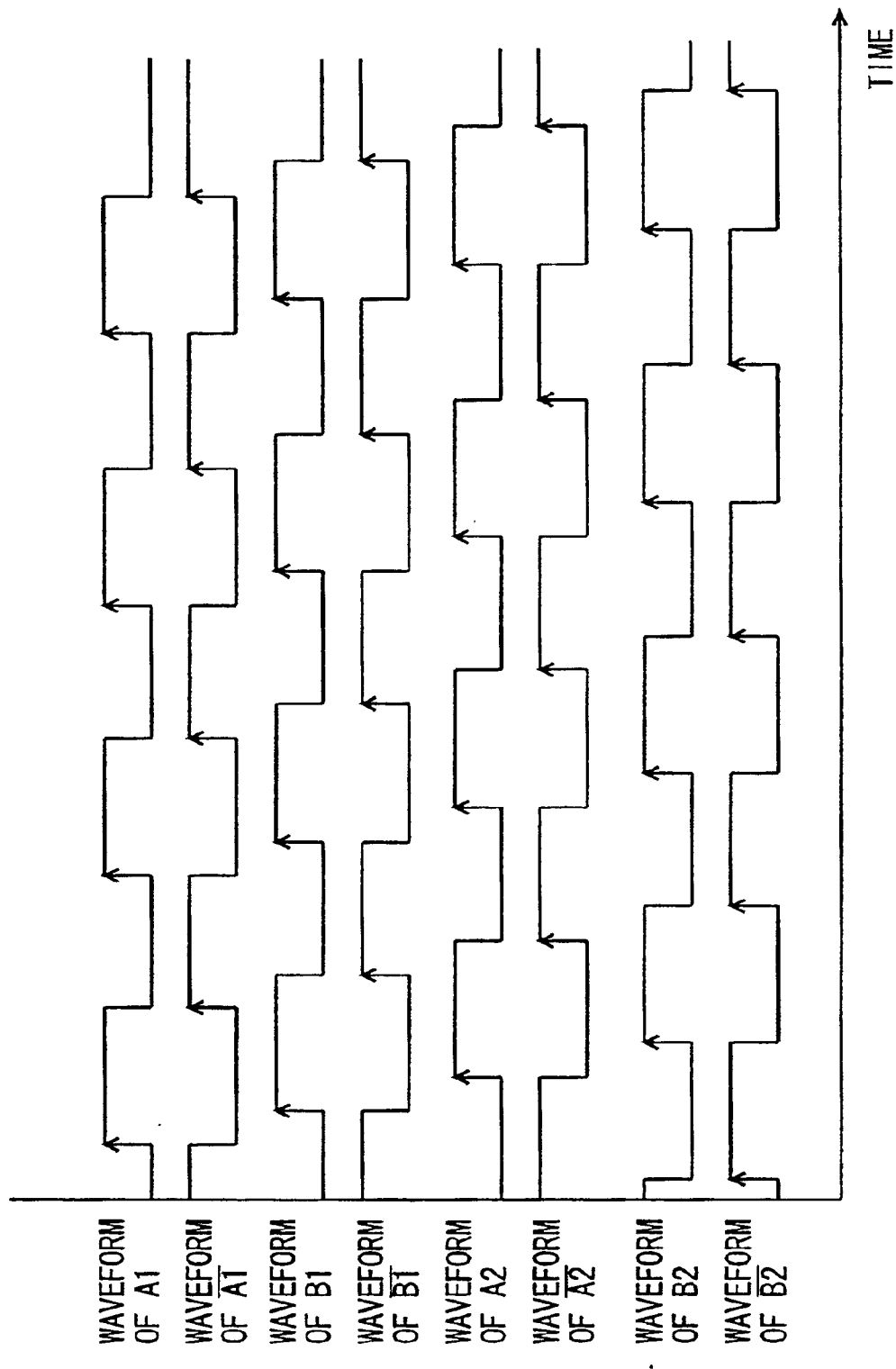
FIG. 41 is a timing chart of pulse signals generated by ring oscillators shown in FIG. 40.

Ring oscillator 831 generates pulse signals A1, /A1, B1 and /B1, and ring oscillator 861 generates pulse signals A2,/A2, B2 and /B2. Pulse signals A1, /A1, B1, /B1, A2, /A2, B2 and /B2 exhibit mutual relationships shown in FIG. 41.

More specifically, pulse signals A1, /A1, B1, /B1, A2, /A2, B2 and /B2 have the phases, which are successively shifted by 45 degrees from each other in the order of pulse signal A1, pulse signal B1, pulse signal A2, pulse signal B2, pulse signal /A1, pulse signal /B1, pulse signal /A2 and pulse signal B2.

Owing to the phase relationship described above, the phases of phase A, phase /A, phase B and phase /B produced by ring oscillator 831 can be determined not to match with the phases of phase A, phase /A, phase B and phase /B produced by ring oscillator 861, respectively.

Gate control circuits 852 and 882 receive control signal GSN from control circuit 82, and produce signals g1, /g1, f1, /f1, g2, /g2, f2 and /f2 kept at the H-level for periods, which are controlled so that the phases of phase A, phase /A, phase B and phase /B produced by ring oscillator 831 may not match with the phases of phase A, phase /A, phase B and phase /B produced by ring oscillator 861. Signals g1, /g1, f1, /f1, g2, /g2, f2 and /f2 thus produced are output to the gate terminals of N-channel MOS transistors 835, 840, 845, 850, 865, 870, 875 and 880, respectively.

Pump circuits 86A and 86B boost power supply voltage VDD to internal voltage VPP, and supply boosted internal voltage VPP to power supply interconnection 883 in the same manner as the operations in the thirteenth embodiment.

As described above, the two ring oscillators producing the four pulse signals having different phases are used for boosting power supply voltage VDD to internal voltage VPP, and boosted internal voltage VPP is supplied to power supply interconnection 883. Thereby, it is possible to increase the times of operations of supplying internal voltages VPP to power supply interconnections 883, and variations in potential on power supply interconnection 883 can be further suppressed.

Capacitors 866, 871, 876, 881 and 884 are parasitic capacitors. In the above description, voltage generating circuit 86 includes the two ring oscillators. However, it may include three or more ring oscillators.

Structures and operations other than the above are the same as those of the thirteenth embodiment.

According to the sixteenth embodiment, the semiconductor memory device includes the voltage generating circuit, in which the plurality of ring oscillators producing the plurality of pulse signals having different phases are employed for generating the plurality of pulse signals having the phases successively shifted by a predetermined amount from each other, and the internal voltage is produced by boosting the power supply voltage based on the pulse signals thus generated, and is supplied to the power supply interconnection. Therefore, it is possible to increase the times of operations of supplying the boosted internal voltage to the power supply interconnection. Consequently, variations in potential on the power supply interconnection can be suppressed.

Seventeenth Embodiment

Figure 42:
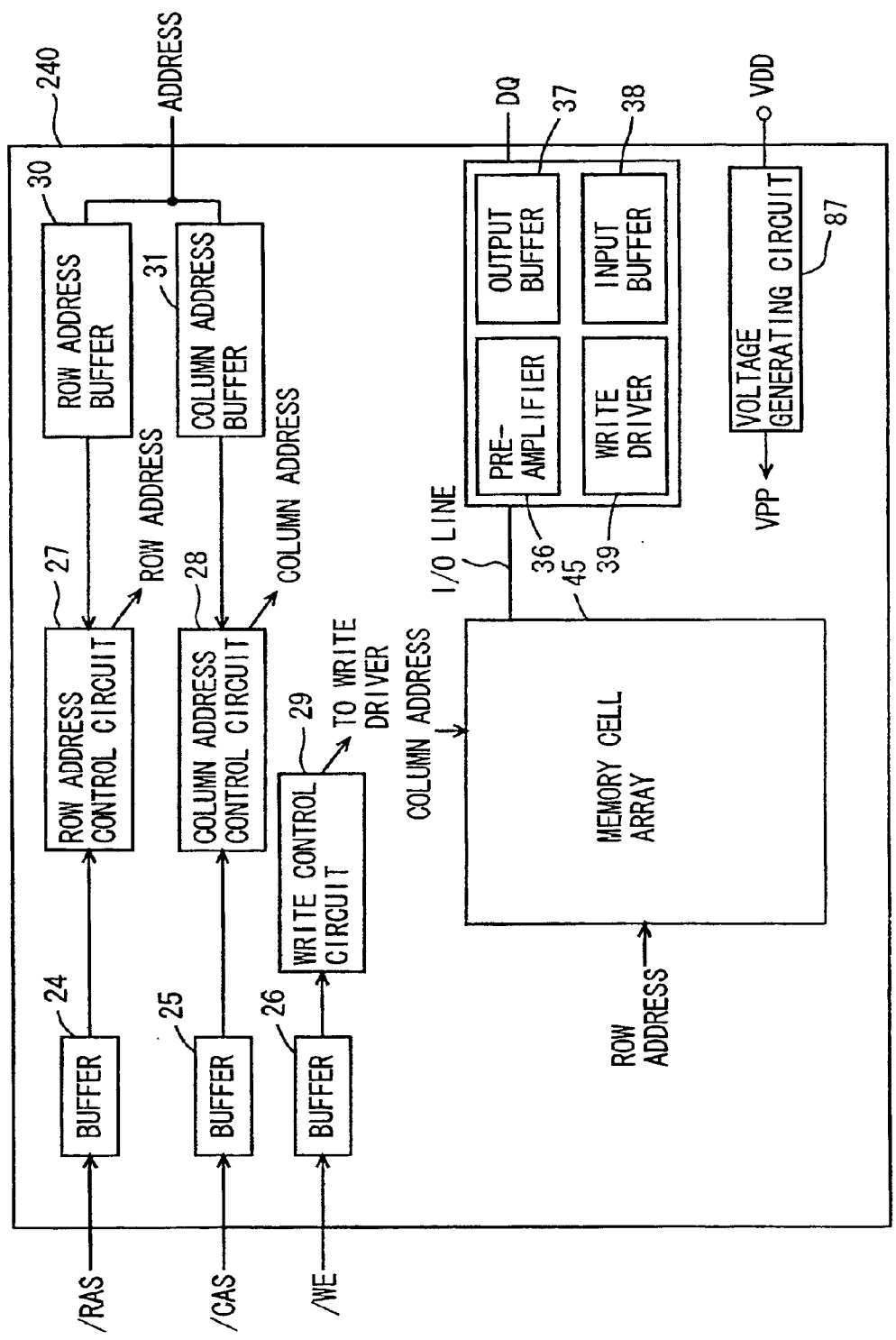
FIG. 42 is a schematic block diagram of a semiconductor memory device of a seventeenth embodiment.

Referring to FIG. 42, a semiconductor memory device 240 of a seventeenth embodiment differs from semiconductor memory device 200 in that voltage generating circuit 83 is replaced with a voltage generating circuit 87, and other structures are the same as those of semiconductor memory device 200.

Figure 43:
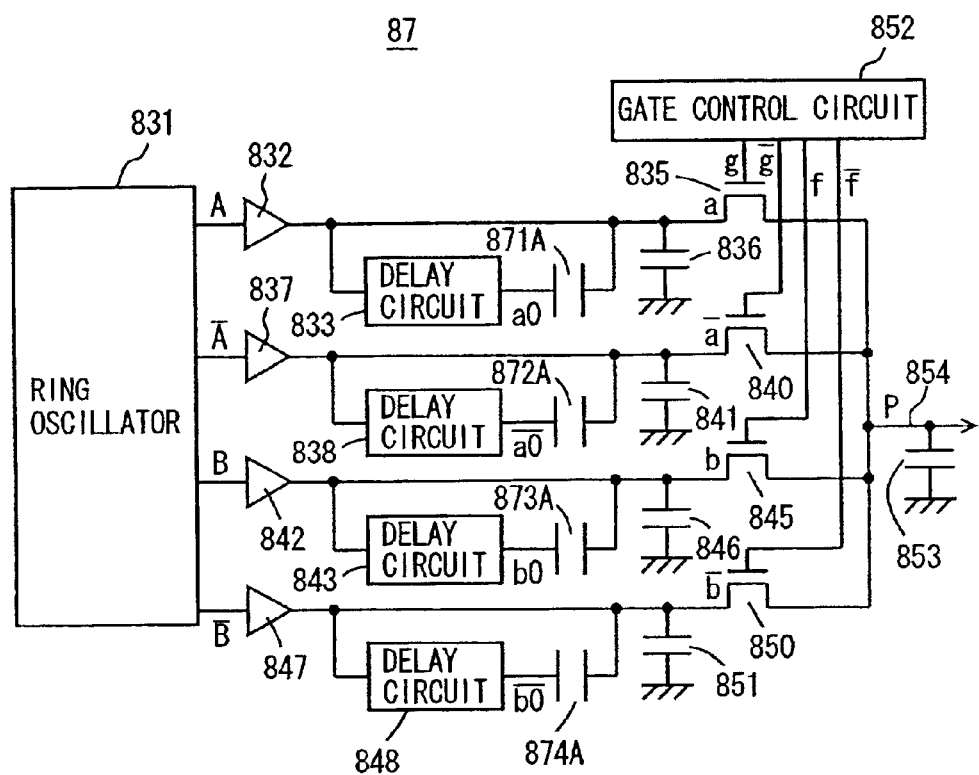
FIG. 43 is a circuit diagram of a voltage generating circuit shown in FIG. 42.

Referring to FIG. 43, voltage generating circuit 87 differs from voltage generating circuit 83 in that pump capacitors 871A–874A are employed instead of pump capacitors 834, 839, 844 and 849 in voltage generating circuit 83. Other structures are the same as those of voltage generating circuit 83.

Figure 44:
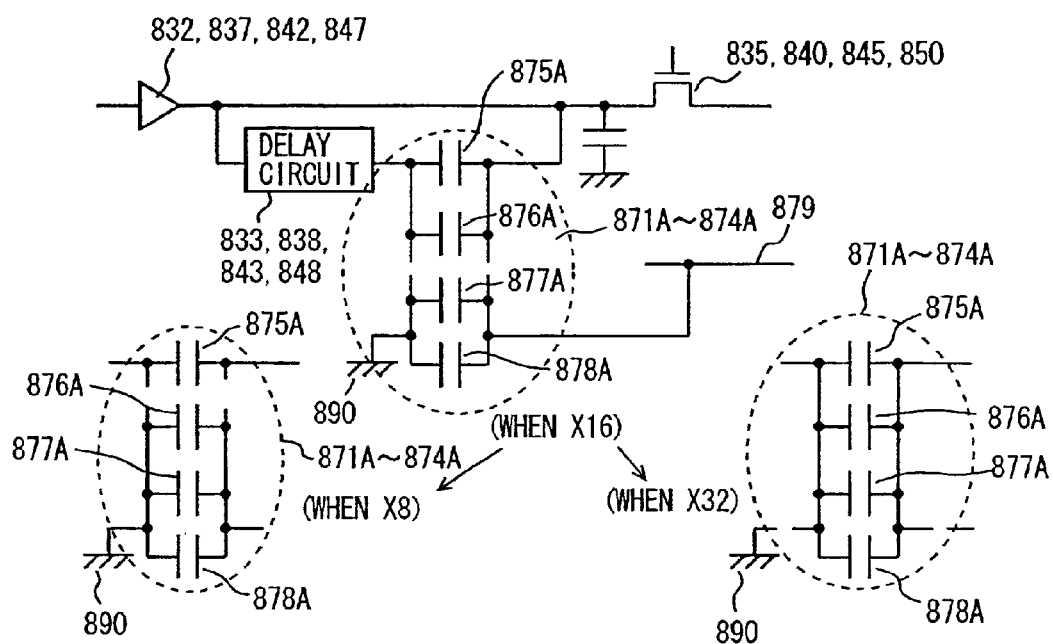
FIG. 44 shows a structure of a pump capacitor shown in FIG. 43.
Figure 45:
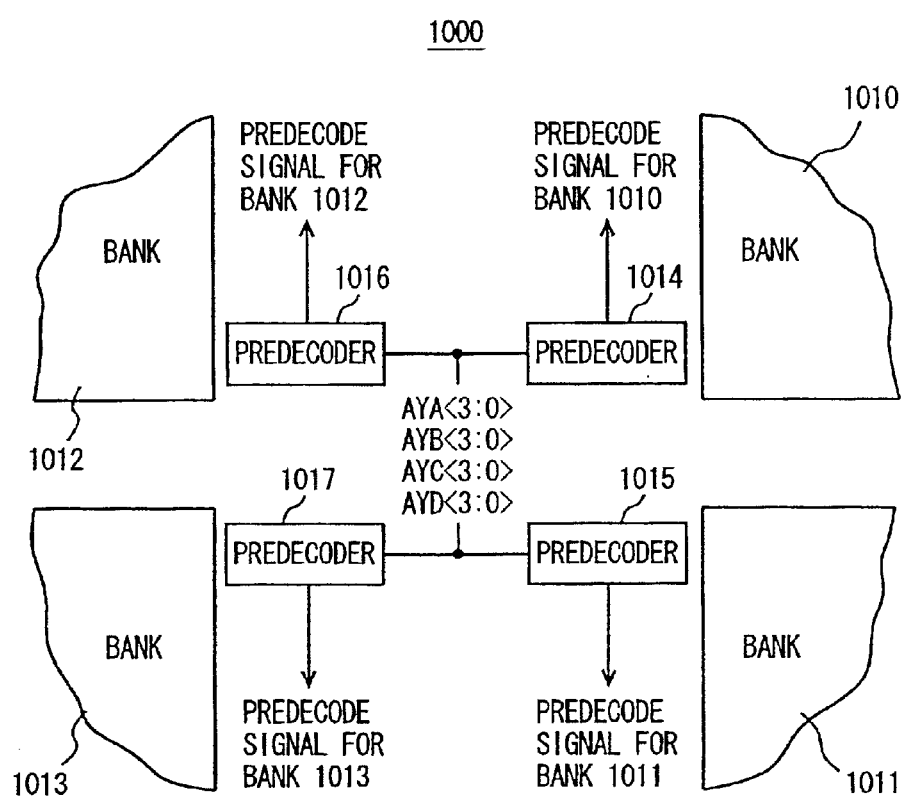
FIG. 45 is a schematic block diagram of a conventional semiconductor memory device.
Figure 46:
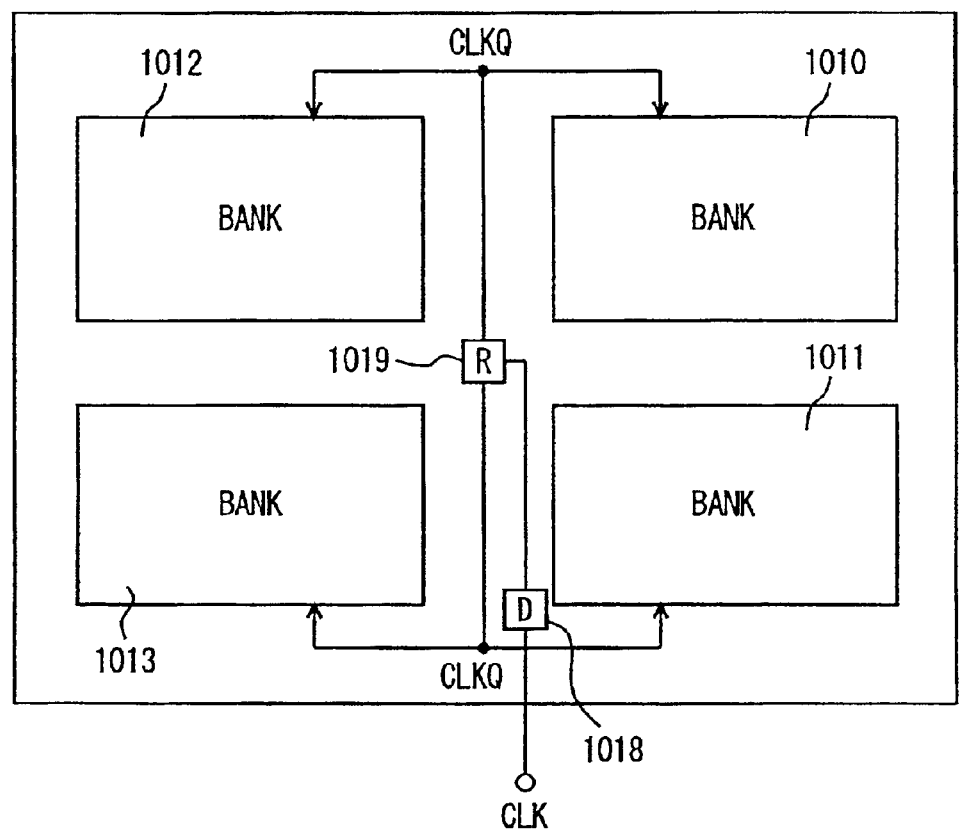
FIG. 46 is a schematic block diagram of another conventional semiconductor memory device.

Referring to FIG. 44, each of pump capacitors 871A–874A includes four capacitors 875A–878A connected in parallel. When semiconductor memory device 240 is to be operated as the semiconductor memory device having the word structure of "×16", each of pump capacitors 871A–874A is formed of two capacitors 875A and 876A connected in parallel. Capacitors 877A and 878A not forming pump capacitors 871A–874A are connected in parallel between power supply interconnection 879 supplying internal voltage VPP and ground node 890, and are used as decoupling capacitors.

When semiconductor memory device 240 is to be operated as the semiconductor memory device having the word structure of "×8", each of pump capacitors 871A–874A is formed of one capacitor 875A, and capacitors 876A–878A not forming pump capacitors 871A–874A are connected in parallel between power supply interconnection 879 supplying internal voltage VPP and ground node 890, and are used as decoupling capacitors.

When semiconductor memory device 240 is to be operated as the semiconductor memory device having the word structure of "×32", each of pump capacitors 871A–874A is formed of four capacitors 875A–878A connected in parallel.

According to the seventeenth embodiment, as described above, sizes of pump capacitors 871A–874A are switched in accordance with the word structure of semiconductor memory device 240. Thereby, internal voltage VPP having the voltage level corresponding to the word structure of "×8", "×16" or "×32" can be supplied to the power supply interconnection, and such a conventional situation can be prevented that the pump capacitors have excessive capacities when the word structure of "×8" or "×16" is employed.

Switching of the sizes of pump capacitors 871A–874A is performed by switching the aluminum interconnections.

In the above description, the pump capacitor is formed of up to four capacitors connected in parallel. For adjusting more finely the size of the pump capacitor, however, the pump capacitor may be formed of five or more capacitors connected in parallel. For adjusting more roughly the size of the pump capacitor, the pump capacitor may be formed of three or two capacitors connected in parallel. Thus, the number of capacitors forming the pump capacitor may be determined depending on the intended accuracy of the size adjustment of the pump capacitor.

According to the seventeenth embodiment, the semiconductor memory device includes the pump capacitors each formed of the plurality of capacitors, which can be connected in parallel, and the number of capacitors forming the pump capacitor depends on the word structure of the semiconductor memory device. Also, the capacitors not forming the pump capacitor are decoupled from the power supply interconnection. Therefore, the internal voltage having the voltage level corresponding to the word structure can be supplied to the power supply interconnection, and the variations in potential on the power supply interconnection can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   banks of n (n is a natural number) in number each including a plurality of memory cells;
   predecoders of m (m is a natural number satisfying (m<n)) in number for producing a select signal for selecting each of said n banks;
   a pump circuit for boosting a power supply voltage to a word line activation voltage; and
   a power supply interconnection for supplying said word line activation voltage to each of said plurality of banks, wherein
      each of said m predecoders outputs said produced select signal to the banks of k (k is a natural number satisfying (n=k×m)) in number among said n banks;
      each of said n banks includes:
         a plurality of memory cells arranged in rows and columns,
         a plurality of word lines arranged in a row direction,
         a plurality of bit line pairs arranged in a column direction, and
         a word line driver for activating, with said word line activation voltage, the word line among said plurality of word lines designated by an address;
      said pump circuit includes:
         a pump capacitor for boosting said power supply voltage to said word line activation voltage, and
         an interconnection for supplying said word line activation voltage formed of a voltage between the opposite ends of said pump capacitor to said power supply interconnection; and
         a longitudinal direction of said pump capacitor is the same as the direction of said interconnection.

2. The semiconductor memory device according to claim 1, wherein
   said pump capacitor is formed of a plurality of capacitors arranged in said longitudinal direction.

3. A semiconductor memory device comprising:
   banks of n (n is a natural number) in number each including a plurality of memory cells;
   predecoders of m (m is a natural number satisfying (m<n)) in number for producing a select signal for selecting each of said n banks, and
   repeaters of p (p is a natural number satisfying (p<n)) in number each supplying a clock to said n banks, wherein
      each of said m predecoders outputs said produced select signal to the banks of k (k is a natural number satisfying (n=k×m)) in number among said n banks;
      each of said p repeaters supplies said clock to the banks of s (s is a natural number satisfying (n=s×p)) in number among said n banks, and
      each of said p repeaters is disposed near the corresponding bank.

4. The semiconductor memory device according to claim 3, further comprising:
   a driver for supplying said clock to said p repeaters, wherein
      the (p−1) repeater(s) other than the repeater located at the largest distance from said driver adjusts a phase of the clock supplied from said driver to match with a phase of the clock to be supplied from said repeater located at the largest distance from said driver to the corresponding bank, and supplies said clock having the adjusted phase to the corresponding bank.

5. The semiconductor memory device according to claim 4, wherein each of said (p−1) repeater(s) supplies to said banks of k in number a first delayed clock delayed from said clock by a first delay amount or a second delayed clock delayed from said clock by a second delay amount larger than said first delay amount when said semiconductor memory device is driven by a first power supply voltage having a first voltage level, and supplies to said k banks said second delayed clock or a third delayed clock delayed from said clock by a third delay amount smaller than said first delay amount when said semiconductor memory device is driven by a second power supply voltage having a second voltage level lower than said first voltage level.

* * * * *